(12) United States Patent
Kitano et al.

(10) Patent No.: US 6,514,344 B2
(45) Date of Patent: Feb. 4, 2003

(54) FILM FORMING UNIT

(75) Inventors: Takahiro Kitano, Kumamoto (JP);
Masateru Morikawa, Kumamoto (JP);
Yukihiko Esaki, Kumamoto (JP);
Nobukazu Ishizaka, Kumamoto (JP);
Norihisa Koga, Kumamoto (JP);
Kazuhiro Takeshita, Kumamoto (JP);
Hirofumi Ookuma, Kumamoto (JP);
Masami Akimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 09/735,459

(22) Filed: Dec. 14, 2000

(65) Prior Publication Data

US 2001/0003968 A1 Jun. 21, 2001

(30) Foreign Application Priority Data

| Dec. 16, 1999 | (JP) | ............ 11-357879 |
| Dec. 17, 1999 | (JP) | ............ 11-359583 |
| Dec. 20, 1999 | (JP) | ............ 11-360981 |
| Dec. 20, 1999 | (JP) | ............ 11-361806 |

(51) Int. Cl.[7] .................................. B05B 3/00
(52) U.S. Cl. ................. 118/323; 118/326; 118/301
(58) Field of Search ................. 118/323, 326, 118/301, 302, 500, 52, 612; 396/611, 627; 384/12, 13; 400/354

(56) References Cited

U.S. PATENT DOCUMENTS

| 4,772,899 | A | * | 9/1988 | Mamiya et al. ......... 346/139 R |
| 5,275,658 | A | | 1/1994 | Kimura |
| 5,658,615 | A | * | 8/1997 | Hasebe et al. ............. 427/240 |
| 5,688,057 | A | * | 11/1997 | Wright et al. ............... 400/82 |
| 5,960,225 | A | * | 9/1999 | Fujimoto .................. 396/611 |
| 6,004,047 | A | * | 12/1999 | Akimoto et al. ........... 396/611 |
| 6,328,473 | B1 | * | 12/2001 | Tokushima et al. .......... 384/12 |

FOREIGN PATENT DOCUMENTS

JP    12-77326    12/2000

* cited by examiner

Primary Examiner—Richard Crispino
Assistant Examiner—Yewebdar T Tadesse
(74) Attorney, Agent, or Firm—Rader, Fishman & Grauer PLLC

(57) ABSTRACT

The present invention is a film forming unit for forming a film on a substrate by supplying a coating solution on the substrate from a discharge nozzle, including moving means for moving the discharge nozzle, wherein the moving means comprises a supporting member for supporting the discharge nozzle, a moving member for moving the supporting member, a guide shaft passing through bearing portion which is formed in the supporting member, and an air supply mechanism for supplying air to a space between the bearing portion and the guide shaft. The discharge nozzle discharges the coating solution while moving along the guide shaft. On the substrate the coating solution is applied along the locus of the discharge nozzle movement. Since air is supplied to the space between the bearing portion and the guide shaft, the supporting member can be made to be in the state of floating relative the guide shaft. As a result, even if the discharge nozzle moves at high speed, the discharge of the coating solution is prevented from being disturbed so that the predetermined coating of the coating solution is performed precisely.

39 Claims, 49 Drawing Sheets

FILM FORMING UNIT

BACKGROUND OF THE INVENTION

1. Field of the Invention

The present invention relates to a film forming unit for a substrate.

2. Description of the Related Art

In a photolithography process in semiconductor device fabrication processes, for example, resist coating treatment in which a resist solution is applied to the top surface of a wafer to form a resist film, exposure processing in which the wafer is exposed in a pattern, developing treatment in which development is performed for the exposed wafer, and the like are performed to form a predetermined circuit pattern on the wafer. Such a photolithography process is performed in a coating and developing unit. The coating and developing unit has a resist coating unit which performs resist coating treatment.

In a conventional resist coating unit, a spin coating method is in the mainstream as a method of applying a resist solution. According to the spin coating method, the resist solution is discharged to the center of a wafer and the wafer is rotated. This allows the resist solution applied on the wafer to spread by centrifugal force, whereby a uniform resist film can be formed over the entire surface of the wafer.

However, in the spin coating method, since the wafer is rotated at high speed, a large amount of the resist solution scatters from the peripheral portion of the wafer, resulting in a big waste of the resist solution. Further, the apparatus is contaminated by the scatter of the resist solution, which causes harmful effects such as a need to clean it frequently.

SUMMARY OF THE INVENTION

Hence, in place of the spin coating method, the inventors consider an apparatus in which a discharge nozzle for discharging a resist solution and a wafer move relative to each other to apply the resist solution. This newly conceived coating unit has a linear slide means for moving the discharge nozzle back and forth above the wafer, wherein the linear slide means has a slider slidably attached to a guide shaft, and to the slider the discharge nozzle is attached. Therefore, the discharge nozzle can apply the resist solution linearly on the wafer when it moves along the guide shaft. Meanwhile the wafer which is supported horizontally is moved by another drive mechanism in a direction perpendicular to the direction in which the discharge nozzle slides.

The discharge nozzle discharges the resist solution to the wafer W while moving back and forth. Meanwhile, the wafer moves intermittently in a direction perpendicular to the direction in which the discharge nozzle slides. By such complex movements, the discharge nozzle scans over the wafer, and as a result, the resist solution is applied sequentially in the manner of the so-called continuous stroke. In this case, the discharge nozzle moves at highest speed when it moves above the wafer, decreases its speed to return when it comes to be above the peripheral portion of the wafer, accelerates to move at high speed after that, and moves over the wafer again.

In the resist coating unit in which the resist solution is applied in the manner of the so-called continuous stroke, it is necessary to move the discharge nozzle at as high speed as possible so that it can perform a quick resist coating. However, if the slider is attached to a guide rail by means of a bearing such as a ball bearing, slide resistance is caused.

In such a case, if the discharge nozzle moves at high speed, vibration due to the slide resistance occurs, so that the discharge nozzle is made to move slightly, which may prevent the precise linear resist coating from being performed. Furthermore, it is feared that this vibration may be transferred to other units provided at the coating and developing unit, whereby giving bad effects on the processes in other units. Moreover, a fear is brought about that the decrease and increase in the speed of the discharge nozzle when it makes a turn may not be carried out smoothly due to the slide resistance, and may require a longer time. Therefore, there is room for improvement regarding these points to realize the resist coating of high precision.

The present invention is made in consideration of the above points and its first object is to reduce slide resistance to restrain the aforesaid vibration when the discharge nozzle is moved.

Furthermore, in the aforesaid coating method in the continuous stroke manner, since the coating is performed on the entire surface of the linearly coating areas by placing them side by side, the discharge nozzle has to scan them many times, and therefore it is practical to shorten the processing time by maximizing the scanning speed of the nozzle.

Hence, it is considered to increase the speed of the nozzle, which is moving, for example, at 6 m/s to 10 m/s, by several m/s at one end, and decrease it sharply at the other end when the nozzle moves in an X-direction, but there is a problem that a big vibration occurs at the time of the increase and decrease in speed of the nozzle. Therefore, if the scanning speed of the nozzle is tried to be increased to raise a throughput, the vibration increases, thus causing a fear that the vibration may be transferred, for example, to the other units in the coating and developing system and even to the aligner.

The present invention is made in consideration of the above circumstances, and its second object is to provide a coating film forming unit which can form a coating film with higher yields and a uniform quality, and which performs a higher throughput as well. Yet another object of the present invention is to provide a coating film forming unit with less vibration.

In order to attain the aforesaid first object, according to a first aspect of the present invention, a film forming unit of the present invention is a film forming unit for supplying a coating solution onto a substrate from a discharge nozzle to form a film on the substrate, including moving means for moving the discharge nozzle, and the aforesaid moving means includes a support member for supporting the discharge nozzle, a moving member for moving the aforesaid support member, a guide shaft passing through bearing portion formed in the aforesaid supporting member, and a gas supplying part for supplying gas into a space between the aforesaid bearing portion and the aforesaid guide shaft.

According to the present invention, the moving means moves the discharge nozzle via the supporting member. The discharge nozzle discharges the coating solution while moving along the guide shaft. The coating solution is applied along the locus of the movement of the discharge nozzle on the substrate. Since gas is supplied from the gas supply mechanism into a gap between the bearing portion and the guide shaft, the supporting member can float in the air relative to the guide shaft. Accordingly, the bearing portion and the guide shaft are not in mechanical contact, thus hardly causing slide resistance. As the result, even if the discharge nozzle is moved at a high speed, vibration caused by the slide resistance can be reduced, and the very small movement of the discharge nozzle does not cause disturbance in the discharge of the coating solution, thus a predetermined coating solution is accurately applied. Further, the situation in which vibration is transmitted to the other units to have adverse effects on the process of the other units can be prevented.

According to a second aspect of the present invention, the aforesaid moving means further includes a moving mechanism, and has a cover for covering the aforesaid moving mechanism, and exhaust ports formed in the aforesaid cover for exhausting atmosphere inside the aforesaid cover.

According to the above configuration, even if particles such as dust occur due to the operation of the moving mechanism, the moving mechanism is covered with the cover and the atmosphere inside the cover is exhausted from the exhaust port, therefore making it possible to exhaust the particles out of the cover without scattering them around. As the result, the situation in which the scattered particles attach onto the substrate can be prevented, and yield is enhanced. Even if the components of the moving mechanism generate heat, thermal atmosphere in this situation is exhausted from the cover, and is not exerted on the substrate. As the result, preferable film can be formed on the substrate.

Further, according to a third aspect of the invention, in the film forming unit of the present invention, the aforesaid support member has a discharge nozzle holding member for holding the discharge nozzle, the discharge nozzle is attachable and detachable to the aforesaid discharge nozzle holding member, and the aforesaid discharge nozzle holding member has a suction mechanism for sucking a part of the discharge nozzle.

As described above, since the holding member holds the discharge nozzle by means of the suction mechanism for sucking a part of the aforesaid discharge nozzle, the discharge nozzle does not fall off or is removed even if the discharge nozzle moves at a high speed. In addition, the discharge nozzle can be replaced. In place of the suction mechanism, a solenoid utilizing electromagnet can be used. In place of the suction mechanism, a pressing member swelled by inflow of air may be used. The holding member may be formed into a pocket shape, thereby housing the discharge nozzle in this pocket.

In order to attain the aforesaid second object, a film forming unit of the present invention includes a discharge nozzle provided to oppose the substrate held by the aforesaid substrate holding portion and discharging the coating solution onto the substrate held by the substrate holding portion, an X-direction drive section for moving the discharge nozzle in a direction X, a Y-direction drive section for the discharge nozzle for intermittently moving the discharge nozzle in a direction Y, and a Y-direction drive section for the substrate holding section for intermittently moving the aforesaid substrate holding section in the direction Y, and after the discharge nozzle is moved in the direction X and thereby the coating solution is applied onto a substrate top surface linearly, the discharge nozzle and the substrate holding portion are simultaneously moved intermittently in the opposite directions to each other in the direction Y to face the discharge nozzle to an area next to an area already coated, thus performing control to arrange the areas, which are coated in the direction X, in the direction Y in order.

Further, according to another aspect of the present invention, the film forming unit of the invention includes a substrate holding portion for holding the substrate, a first discharge nozzle and a second discharge nozzle provided to be separated from each other to oppose the substrate held by the substrate holding portion respectively and provided to oppose the substrate, an X-direction drive section for moving the first discharge nozzle and the second discharge nozzle in a direction X, and a Y-direction drive section for intermittently moving the first discharge nozzle and the second discharge nozzle, and the substrate holding portion relatively in a direction Y, and after the discharge nozzle is moved in the direction X and thereby the coating solution is applied onto a substrate top surface linearly, the first discharge nozzle and the second discharge nozzle are moved relatively in the direction Y to face the discharge nozzles to an area next to an area already coated, thus performing control to arrange; the areas, which are coated in the direction X, in the direction Y in order.

According to the above structure, since both the first discharge nozzle and the second discharge nozzle arrange the area which is coated in the direction X, in the direction Y, the processing can be performed in a shorter time compared with the processing performed with a single discharge nozzle.

In this aspect of the invention, the first discharge nozzle and the second discharge nozzle, and the substrate holding portion may be intermittently moved in the opposite directions to each other in the Y direction at the same time.

Further, the first discharge nozzle and the second discharge nozzle may be provided, for example, at a common base, and each discharge nozzle may move symmetrically in the opposite directions to each other. With this structure, impact occurring when the first and second discharge nozzle accelerate and decelerate is compensated each other and reduced.

Further in this case, the substrate holding portion includes a first substrate holding portion and a second substrate holding portion so that the first discharge nozzle discharges the coating solution to the substrate held by the first substrate holding portion and the second discharge nozzle discharges the coating solution to the substrate held by the second substrate holding portion, thereby further enhancing the processing efficiency.

Furthermore, according to another aspect, a film forming unit of the present invention includes a substrate holding portion for holding the substrate, a discharge nozzle provided to oppose the substrate held by the aforesaid substrate holding portion, for discharging the coating solution onto the substrate held by the substrate holding portion, a Y-direction drive section for intermittently moving the discharge nozzle relatively to the substrate holding portion in a direction Y; and a shock absorbing mobile body which moves symmetrically in an opposite direction relative to the discharge nozzle when the discharge nozzle is moved in the direction X, and after the discharge nozzle is moved in the direction X and thereby the coating solution is applied onto a substrate top surface linearly, the discharge nozzle is moved relatively in the direction Y to be faced to an area next to an area already coated, thus arranging the areas, which are coated in the direction X, in the direction Y in order.

In this configuration, since the shock absorbing mobile body moving symmetrically in the opposite direction to the discharge nozzle is provided, the impact caused by acceleration and deceleration of the discharge nozzle can be reduced as described above.

In the aforesaid invention, the X-direction drive section may include guide shaft members extending in the direction X for guiding the discharge nozzle, a nozzle holding body provided to enclose the guide shaft members via a space, and gas supply means for supplying pressurized gas into a portion between the nozzle holding body and the shaft members. According to this configuration, the discharge nozzle can be guided by the shaft members without bringing the shaft members and the nozzle holding body in contact with each other, whereby the friction and vibration caused by the movement of the discharge nozzle can be reduced.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
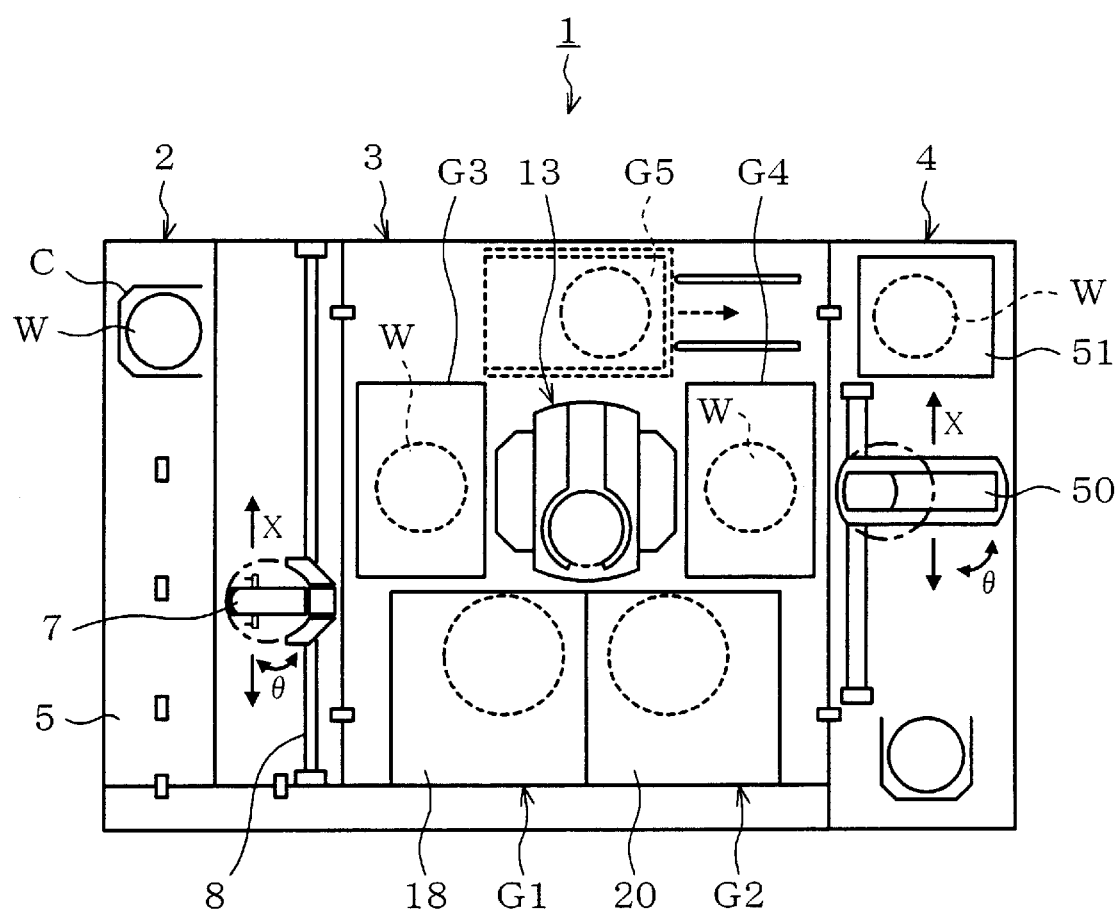
FIG. 1 is a plane view showing an appearance of a coating and developing system including a resist coating unit according to embodiments.
Figure 2:
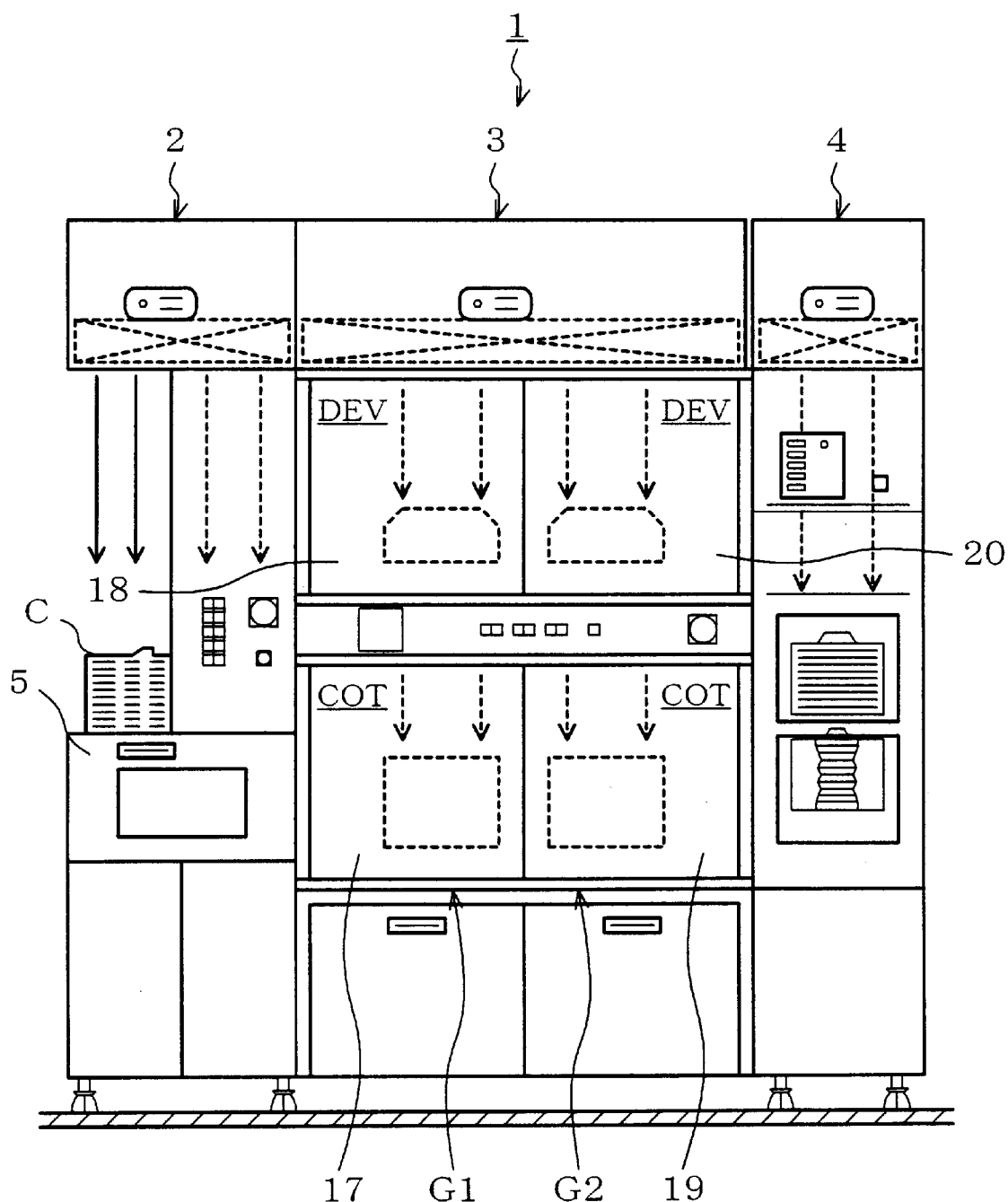
FIG. 2 is a front view of the coating and developing system in FIG.1.
Figure 3:
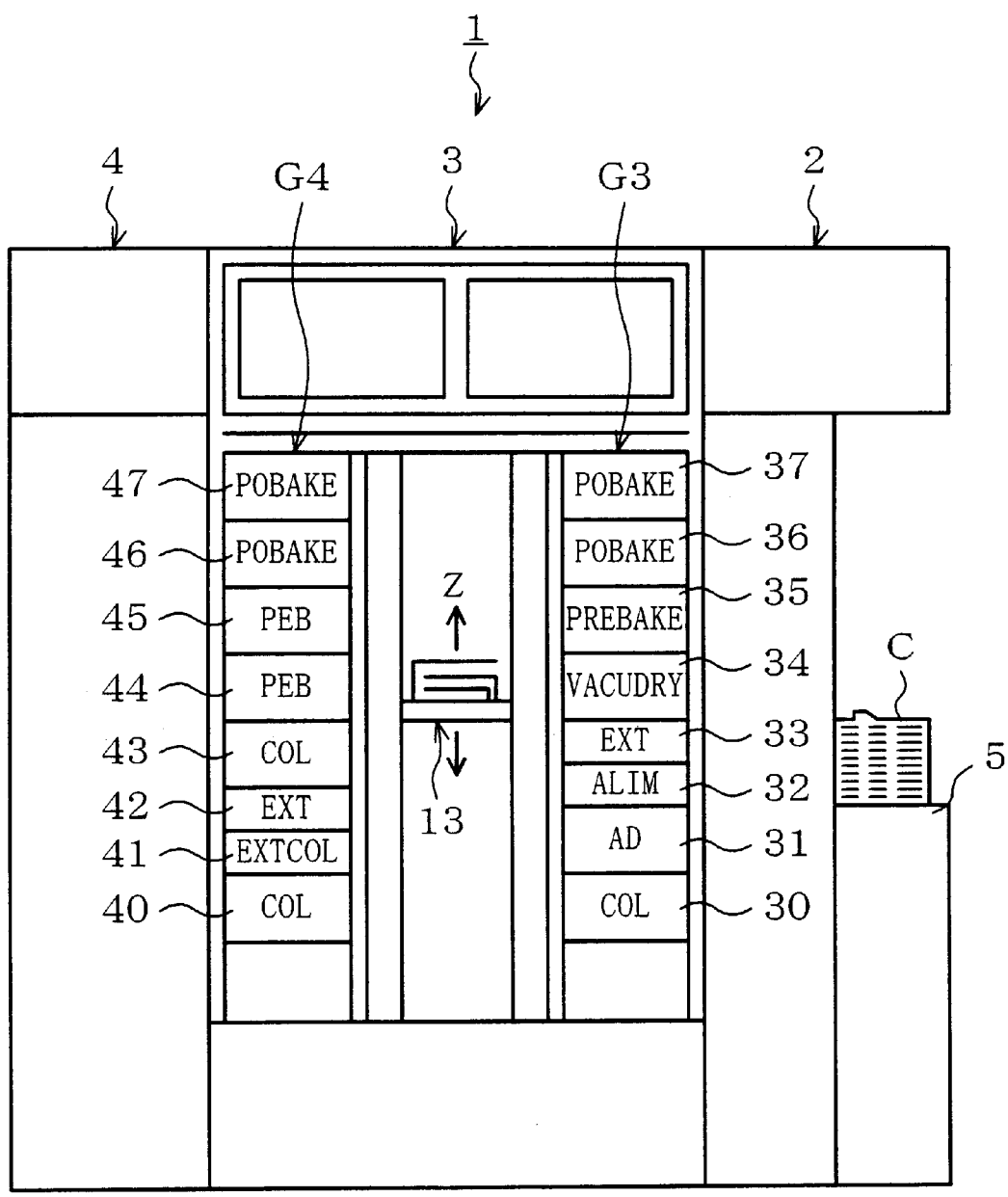
FIG. 3 is a rear view of the coating and developing system in FIG. 1.

Preferred embodiments of the present invention will be described hereinafter. FIG. 1 is a plane view of a coating and developing system 1 having a resist coating unit according to the present embodiments, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W from/to the outside to/from the coating and developing system 1 in the unit of cassette and for carrying the wafers W into/from a cassette C, a processing station 3 in which various kinds of multi-tiered processing units for performing predetermined processing one by one in the coating and developing process are disposed, and an interface section 4 for receiving and delivering the wafer W from/to an aligner which is not shown provided adjacent to the processing station 3, are integrally connected.

In the cassette station 2, a plurality of cassettes C are mountable at predetermined positions on a cassette mounting table 5 serving as a mounting section in a line in an X-direction (the perpendicular direction in FIG. 1). Further, a wafer carrier 7, which is transferable in the direction of alignment of the cassettes (the X-direction) and in the direction of alignment of the wafers W housed in the cassette C (a Z-direction; a perpendicular direction), is provided to be movable along a carrier path 8 and is selectively accessible to the respective cassettes C.

The wafer carrier 7 has an alignment function for aligning the wafer W. The wafer carrier 7 is structured so as to be also accessible to an extension unit 32 included in a third processing unit group G3 on the side of the processing station 3 as will be described later.

In the processing station 3, a main carrier unit 13 is provided in a center part thereof, and various kinds of processing units are multi-tiered on the periphery of the main carrier unit 13 to compose processing unit groups. In the coating and developing system 1, there are four processing unit groups G1, G2, G3 and G4, and the first and the second processing unit groups G1 and G2 are disposed on the front side of the coating and developing system 1, the third processing unit group G3 is disposed adjacently to the cassette station 2, and the fourth processing unit group G4 is disposed adjacently to the interface section 4. Further, as an option, a fifth processing unit group G5 depicted by the broken lines can be additionally arranged on the rear side of the coating and developing system 1. The aforesaid main carrier unit 13 can carry the wafer W into/from various kinds of processing units described later disposed in these processing unit groups G1 to G5.

In the first processing unit group G1, a resist coating unit 17 according to the present embodiment and a developing unit 18 for performing treatment on the wafer W with a developing solution supplied are two-tiered in the order from the bottom as shown in FIG. 2. As for the second processing unit group G2, a resist coating unit 19 and a developing unit 20 are similarly two-tiered in the order from the bottom.

In the third processing unit group G3, for example, as shown in FIG. 3, a cooling unit 30 for cooling the wafer W, an adhesion unit 31 for increasing the fixability between a resist solution and the wafer W, the extension unit 32 for keeping the wafer W waiting, a vacuum drying unit 33 for reducing pressure to dry a solvent in the resist solution, a prebaking unit 34, postbaking units 35 and 36 for performing heating processing after developing treatment, and so on are, for example, seven-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heat treatment after exposure processing, postbaking units 46 and 47 and so on are, for example, eight-tiered in the order from the bottom.

In the center part of the interface section 4, provided is a wafer carrier 50. The wafer carrier 50 is structured so as to be movable in the direction X (the up-and-down direction in FIG. 1) and the direction Z (the perpendicular direction), and to be rotatable in a direction θ (a rotational direction about an axis Z), so that it can access the extension and cooling unit 41, the extension unit 42 which are included in the fourth processing unit group G4, a peripheral aligner 51, and an aligner which is not shown.

Next, A structure of the above-described resist coating unit 17 is explained, and the resist coating unit 17 adopts the coating method in a so-called continuous stroke manner in which a discharge nozzle for discharging the resist solution applies the resist solution while moving relatively to the wafer W.

Figure 4:
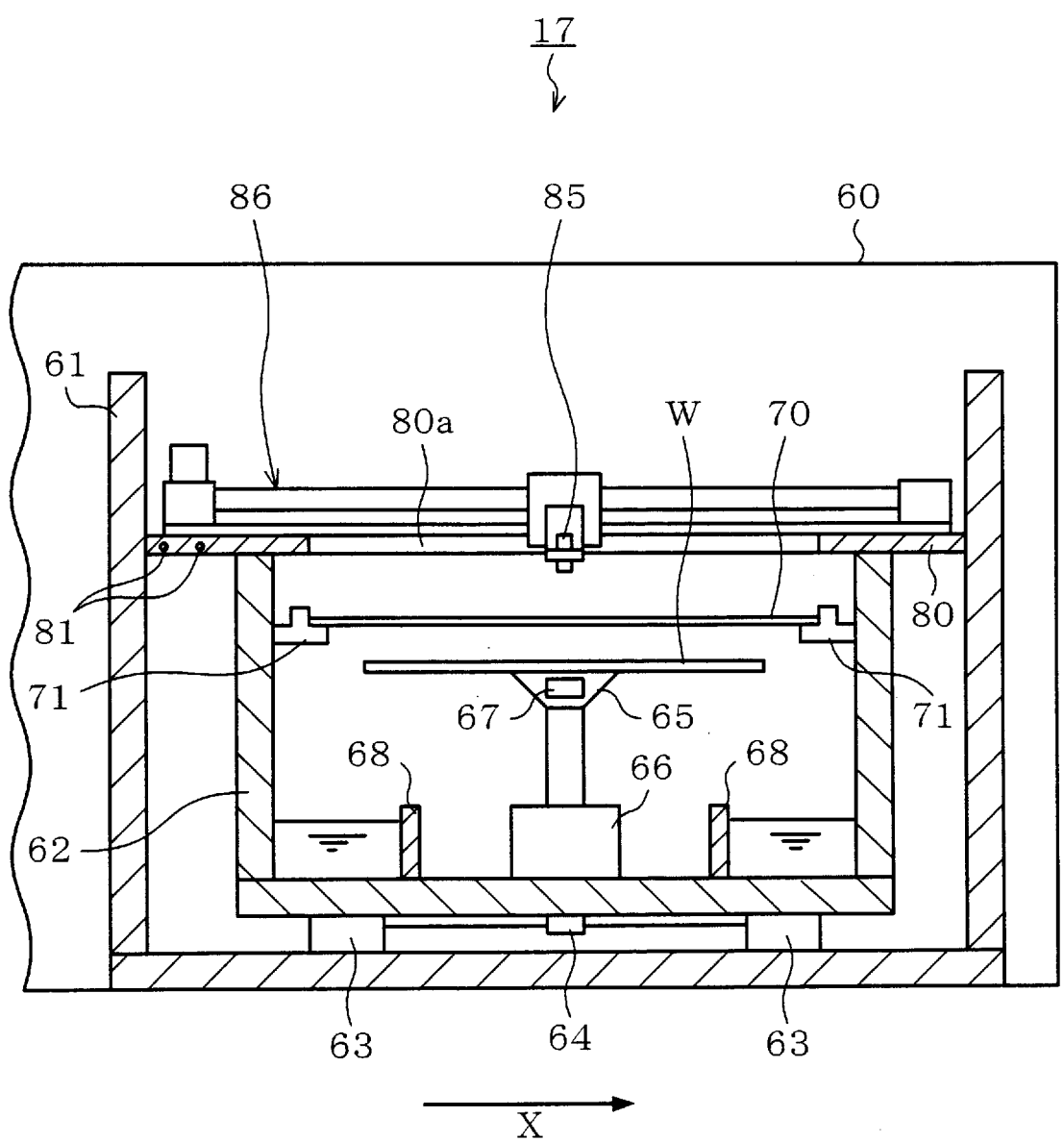
FIG. 4 is an explanatory view of a vertical cross section of the resist coating unit according to the present embodiment.
Figure 5:
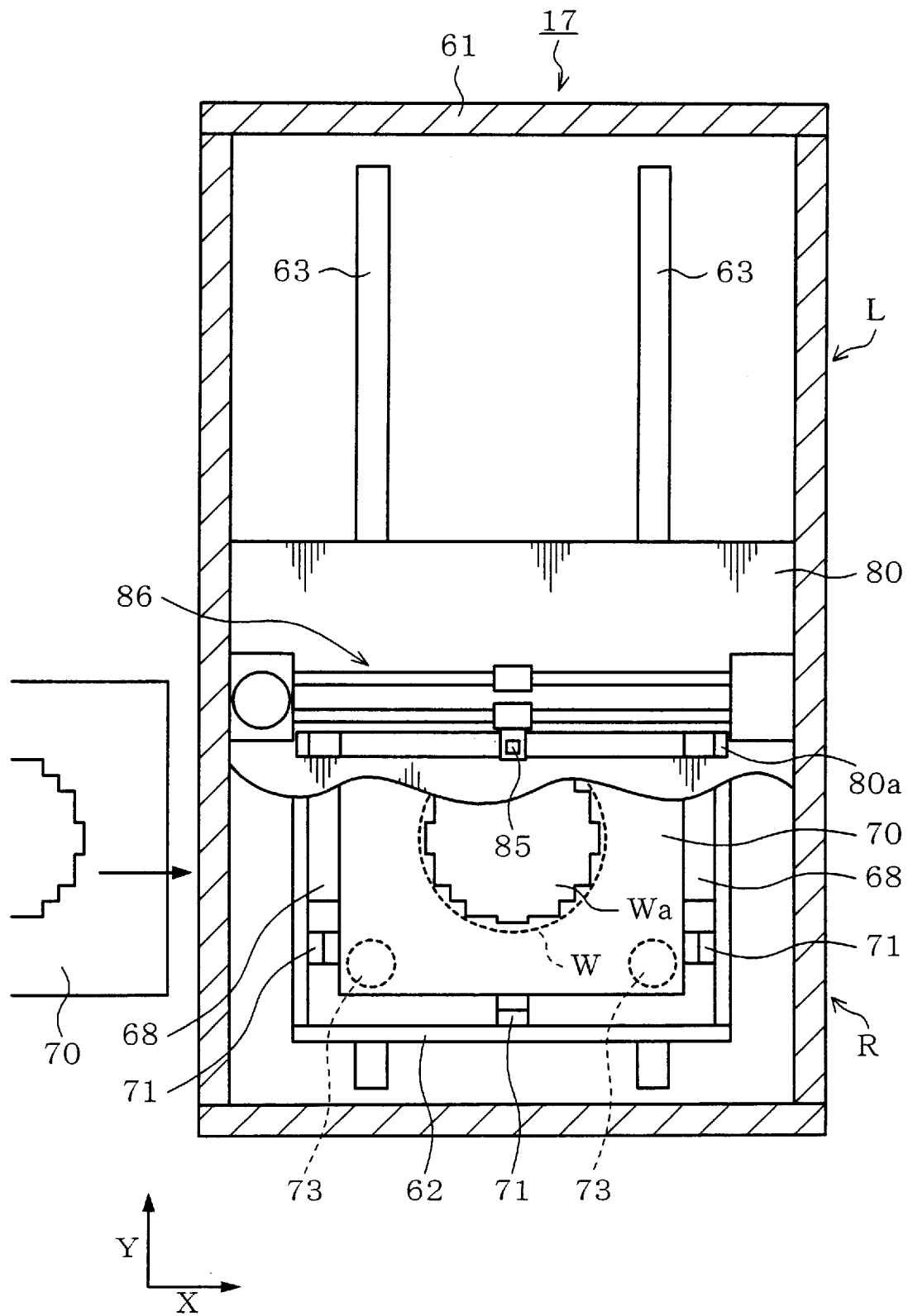
FIG. 5 is an explanatory view of a horizontal cross section of the resist coating unit according to the present embodiment.

As shown in FIG. 4 and FIG. 5, in a casing 60 of the resist coating unit 17, an approximate box-shaped outer container 61 is provided to elongate in the direction Y (the top-and-bottom direction in FIG. 5), and has an opened top face. In the outer container 61, an inner container 62 in which the wafer W is treated is provided. The inner container 62 has an opened top face, and is designed to be movable on two rails 63, provided on the bottom face of the outer container 61 to extend in the direction Y by an inner container drive mechanism 64. Thus, when the wafer W is carried in or from the inner container 62, the inner container 62 moves to a carry zone L on the normal direction side (upward side in FIG. 5) of the direction Y of the outer container 61. When the wafer W undergoes the coating processing, the inner container 62 can move to a processing zone R on the negative direction side (downward side in FIG. 5) of the direction Y. It is also possible to move the inner container 62 in the direction Y by a predetermined distance in predetermined timing while the resist solution is applied to the wafer W.

In the inner container 62, a rest 65 is provided to hold the wafer W by suction. Under the rest 65, a rotation drive 66 is provided for allowing the rest 65 to be rotatable. In the rest 65, for example, an ultrasonic vibrator 67 is mounted to vibrate the rest 65 at high frequency. On the bottom face of the inner container 62, provided is a solvent tank 68 for storing the solvent for maintaining the inside of the inner container 62 in a solvent atmosphere of a predetermined concentration.

On the bottom face of the inner container 62, an exhaust port 73 is provided. Exhaust through the exhaust port 73 produces air stream in the inner container 62, so that a predetermined concentration of the solvent is maintained around the wafer W.

A mask member 70 for covering the wafer W to limit a coating range Wa on the wafer W is arranged above the wafer W. The mask member 70 is supported by a mask supporting member 71 provided on an inner wall of the inner container 62. The mask member 70 can be carried in the direction X by a carrier mechanism not shown. Therefore, after the mask member 70 is moved to a cleaning zone on the negative direction side (on the left side of FIG. 5) of the direction X of the outer container 61 for waiting therein, and the inner container 62 loaded with the wafer W is moved to the processing zone R, the above carrier mechanism can move the mask member 70 onto the mask supporting member 71 in the inner container 62.

To the outer container 61, a lid body 80 is mounted to cover the processing zone R of the outer container 61. When the inner container 62 moves to the processing zone R, the lid body 80 covers the top of the inner container 62, which facilitates maintenance of the predetermined atmosphere in the inner container 62. A thermally adjustable heater 81 is incorporated in the lid body 80 to prevent the solvent in the solvent tank 68 from causing condensation on the underside of the lid body 80. The lid body 80 is provided with a slit 80a extending in the direction X, within which a discharge nozzle 85 described hereinafter moves back and forth in the direction X.

In the slit 80a of the lid body 80 provided at the processing zone R of the outer container 61 as described above, the aforesaid discharge nozzle 85 for discharging the resist solution is provided to be able to discharge the resist solution to the wafer W placed thereunder. Moving means 86 according to the present invention for reciprocating the discharge nozzle 85 is included.

Figure 6:
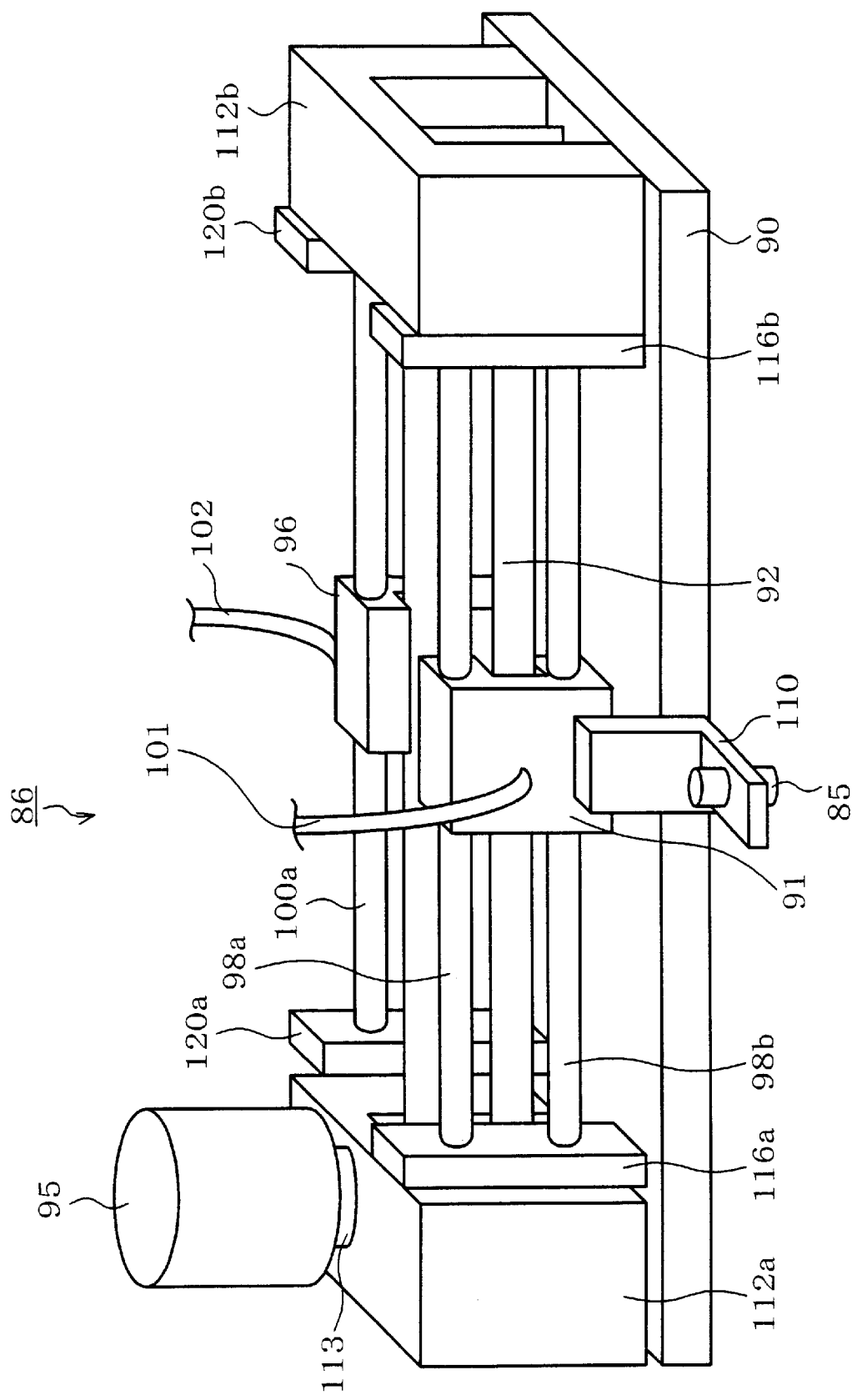
FIG. 6 is a perspective view of moving means and a discharge nozzle.
Figure 8:
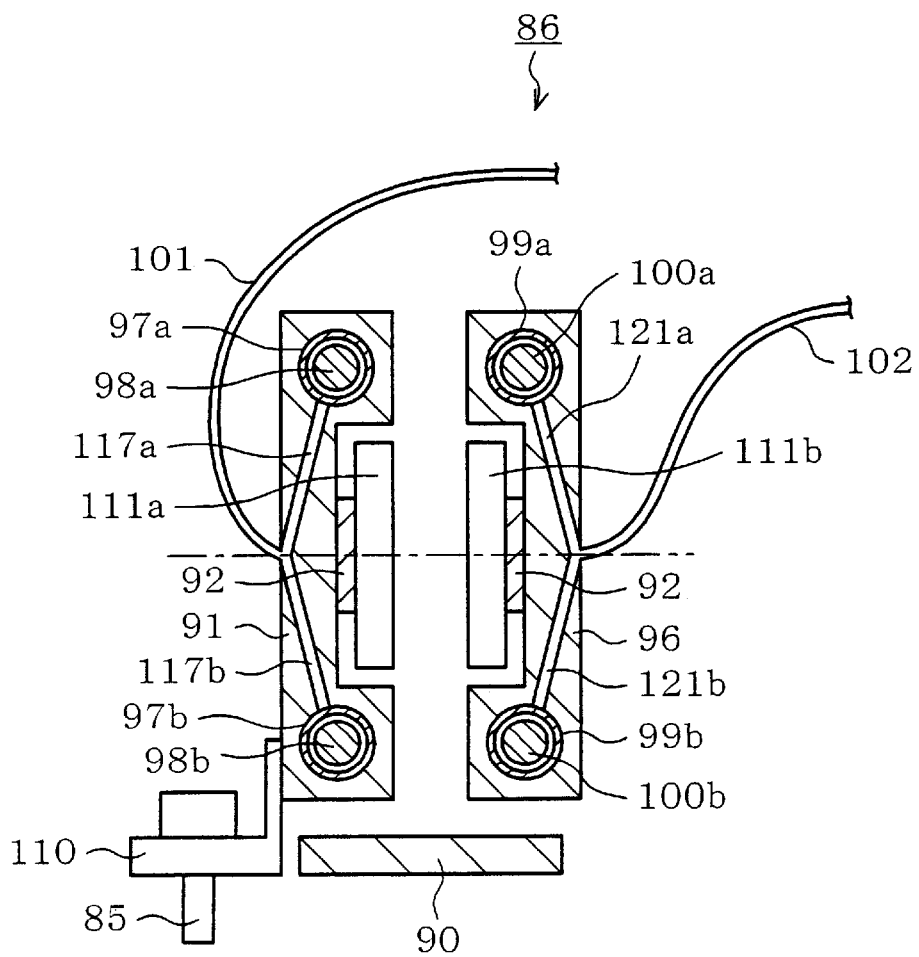
FIG. 8 is an explanatory view of a vertical cross section of the moving means.

As shown in FIGS. 6 and 8, the moving means 86 adopts an air slider method. Specifically, the moving means 86 includes a base 90, a slider 91 as a supporting member for supporting the discharge nozzle 85, and, for example, an endless driving belt 92 as a moving member for sliding the slider 91. The driving belt 92 runs between a driving pulley 93 and an idler pulley 94 placed on the base 90.

The driving pulley 93 is rotationally driven by a motor 95. A balance weight 96 is attached to the driving belt 92 at a position opposite to the slider 91. Bearing portions 97a and 97b are formed in the slider 91, and the slider 91 is slidably attached to guide shafts 98a and 98b via these bearing portions 97a and 97b. Bearing portions 99a and 99b are formed in the balance weight 96, and the balance weight 96 is slidably attached to guide shafts 100a and 100b via the bearing portions 99a and 99b.

An air supply tube 101 for supplying air to a gap between the bearing portion 97a and the guide shaft 98a, and a gap between the bearing portion 97b and the guide shaft 98b, and an air supply tube 102 for supplying air to a gap between the bearing portion 99a and the guide shaft 100a, and a gap between the bearing portion 99b and the guide shaft 100b are provided respectively.

The discharge nozzle 85 is attached at a nozzle bracket 110 as a supporting member, and the nozzle bracket 110 is fixed to the slider 91 as a moving member. The driving belt 92 is coupled to a position of approximately the center of gravity of the slider 91 by a belt clamp 111a. The driving belt 92 is also coupled to a position of approximately the center of gravity of the balance weight 96 by a belt clamp 111b. Specifically, the slider 91 and the balance weight 96 are attached to the driving belt 92 at their positions of the centers of gravity thereof.

The driving pulley 93 is housed in a bracket 112a provided at one side of the base 90 (the left side in FIG. 6). The motor 95 is placed above the bracket 112a. A rotational shaft 113 of the motor 95 is connected to the driving pulley 93 after penetrating a top face of the bracket 112a. The idler pulley 94 is housed in a bracket 112b provided at the other side of the base 90 (the right side in FIG. 6). The motor 95 rotates the driving pulley 93 to rotate the driving belt 92. By rotating the driving pulley 93 in the normal and reverse direction, the moving direction of the driving belt 92 can be switched, and thereby the discharge nozzle 85 can reciprocate. Accordingly, as shown in FIG. 5, the discharge nozzle 85 discharges a resist solution while reciprocating relatively to the wafer W thereunder, and the inner container 62 intermittently moves in the perpendicular direction (the direction Y in FIG. 5) relative to the reciprocating direction of the discharge nozzle 85 (the direction X in FIG. 5), thereby performing the resist solution coating along the locus of the movement of the discharge nozzle 85 in the manner of a so-called continuous stroke.

Figure 7:
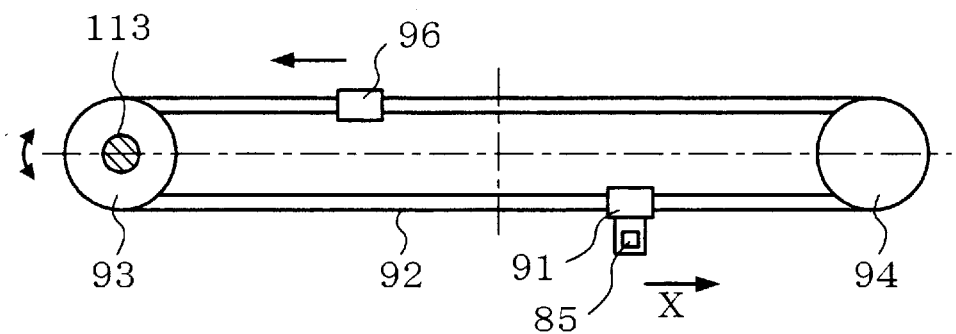
FIG. 7 is a plane view showing a manner in which the discharge nozzle and a slider, and a balance weight move back and forth with the movement of a driving belt.

The weight of the balance weight 96 is the same as the total weight of the slider 91 and the discharge nozzle 85 (including the nozzle bracket 110). As shown in FIG. 7, when the pulley 93 is normally rotated and the discharge nozzle 85 moves in the normal direction of the direction X (rightward in FIG. 7), the balance weight 96 moves in the negative direction of the direction X (leftward in FIG. 7). When the driving pulley 93 is rotated in the reverse direction and the discharge nozzle 85 moves in the negative direction of the direction X, the balance weight 96 moves in the normal direction of the direction X. The balance weight 96 and the slider 91 moves symmetrically with respect to the center of gravity of the driving belt 92.

Figure 9:
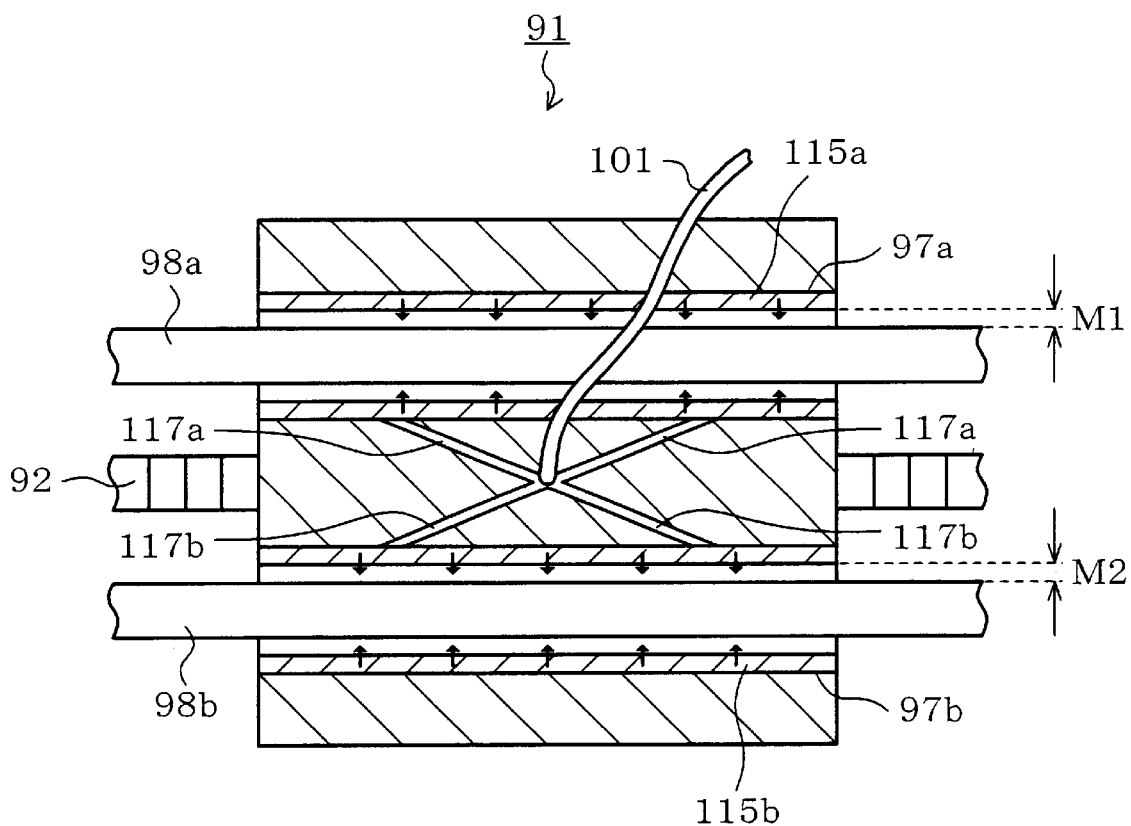
FIG. 9 is an explanatory view of a vertical cross section of the slider viewed from a different angle from that of FIG. 7.
Figure 10:
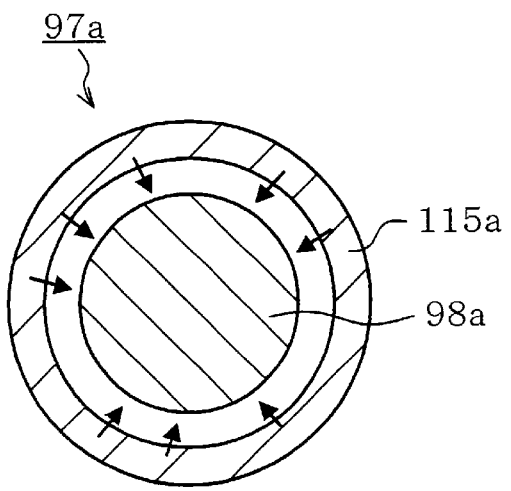
FIG. 10 is an enlarged view of a vertical cross section of a bearing portion and a guide shaft.

As shown in FIG. 8 and FIG. 9, with the center of gravity of the slider 91 as the center, the bearing portion 97a is formed in an upper portion of the slider 91 and the bearing portion 97b is formed in a lower portion of the slider 91. The bearing portions 97a and 97b have approximately a cylindrical form. As shown in FIG. 10, the vertical section of the bearing portion 97a is in a ring shape, and an inner wall thereof is covered with a porous film 115a. The vertical section of the bearing portion 97b is also in a ring shape, and an inner wall thereof is covered with a porous film 115b. A number of small pores are formed in the porous films 115a and 115b. It is preferable to use carbon and the like for the material of the porous films 115a and 115b.

As shown in FIG. 6, the guide shafts 98a and 98b are provided to be in parallel with each other between an erection stand 116a vertically provided at the bracket 112a side and an erection stand 116b vertically provided at the bracket 112b side. Further, the surfaces of the guide shafts 98a and 98b are polished so that friction does not occur.

An inlet port side of the air supply tube 101 is connected to an air supply source not shown. An outlet side of the air supply tube 101 is connected to the slider 91 to communicate with channels 117a and 117b formed inside the slider 91. The channel 117a communicates with the porous film 115a and the channel 117b communicates with the porous film 115b. Accordingly, the air supplied from the air supply tube 101 flows through the channels 117a and 117b and thereafter is discharged into the bearing portions 97a and 97b through small pores of the porous films 115a and 115b.

Since air is uniformly supplied around the bearing portions 97a and 97b, the guide shaft 98a floats inside the bearing portion 97a, and the guide shaft 98b floats inside the bearing portion 97b. Thus, the slider 91 is supported by the guide shafts 98a and 98b in a state in which it is not in contact with them. As shown in FIG. 9, it is preferable that a distance M1 between the bearing portion 97a (an outer circumferential surface of the porous film 115a) and the guide shaft 98a, a distance M2 between the bearing portion 97b (an outer circumferential surface of the porous film 115b) and the guide shaft 98b are, for example, about 10 μm, respectively. The guide shaft 98a is designed to pass through the bearing portion 97a with air therebetween, and the guide shaft 98b is designed to pass through the bearing portion 98b with air therebetween.

In the balance weight 96, the bearing portions 99a and 99b have the same structure as the aforesaid bearing portions 97a and 97b. The guide shafts 100a and 100b with the surfaces being polished are horizontally provided between erection stands 120a and 120b. Air supplied from the air supply tube 102 flows through channels 121a and 121b formed inside the balance weight 96, and thereafter is discharged into the bearing portions 99a and 99b through the small pores of the porous films. Accordingly, the balance weight 96 is supported by the guide shafts 100a and 100b in a state in which it is not in contact with them.

Next, the operation of the resist coating unit 17 structured as above will be described together with a photolithography process performed in the coating and developing system 1.

First, the wafer carrier 7 takes an unprocessed wafer W out of the cassette C to carry it into the adhesion unit 31 included in the third processing unit group G3. Then the wafer W, which is coated with, for example, HMDS for reinforcing adhesion of the resist solution therein, is carried to the cooling unit 30 by the main carrier unit 13 and cooled to a predetermined temperature. Thereafter, the wafer W is carried to the resist coating unit 17 or 19.

In the resist coating unit 17 or 19, the wafer W is coated with the resist solution in the manner of a so-called continuous stroke. Thereafter, the main carrier 13 carries the wafer W to the vacuum drying unit 33, the pre-baking unit 34 and the cleaning unit 40 in sequence. After that, the wafer W undergoes a series of predetermined processing such as exposure processing, developing treatment and so on in the respective processing units and the coating and developing treatment is finished.

Detailing the operation in the above resist coating unit 17, first, the wafer W after being cooled to a predetermined temperature in the cooling unit 30, is carried into the casing 60 in the resist coating unit 17 by the main carrier 13. At this time, the inner container 62 in the outer container 61 already waits in the carry zone L. The wafer W is placed directly on the rest 65 by the main carrier 13 and is held by suction. Here, an alignment mechanism not shown detects a notch or orientation flat of the wafer W, and the wafer W is aligned at a predetermined position by the rotation mechanism 66. The inner container 62 is then moved to the processing zone R by the inner container drive mechanism 64. Thereafter, the mask member 70 waiting in the cleaning portion is moved from an outside of the outer container 61 to an inside of the inner container 62 by the not shown carrier mechanism to be placed on the mask support member 71.

Next, gas in the inner container 62 is discharged from the exhaust port 73 at a predetermined speed to maintain the inside of the inner container 62 in predetermined atmosphere. In the inner container 62, while the discharge nozzle 85 moves relatively to the wafer W, the resist solution is applied to form a resist film on the wafer W.

Figure 11A:
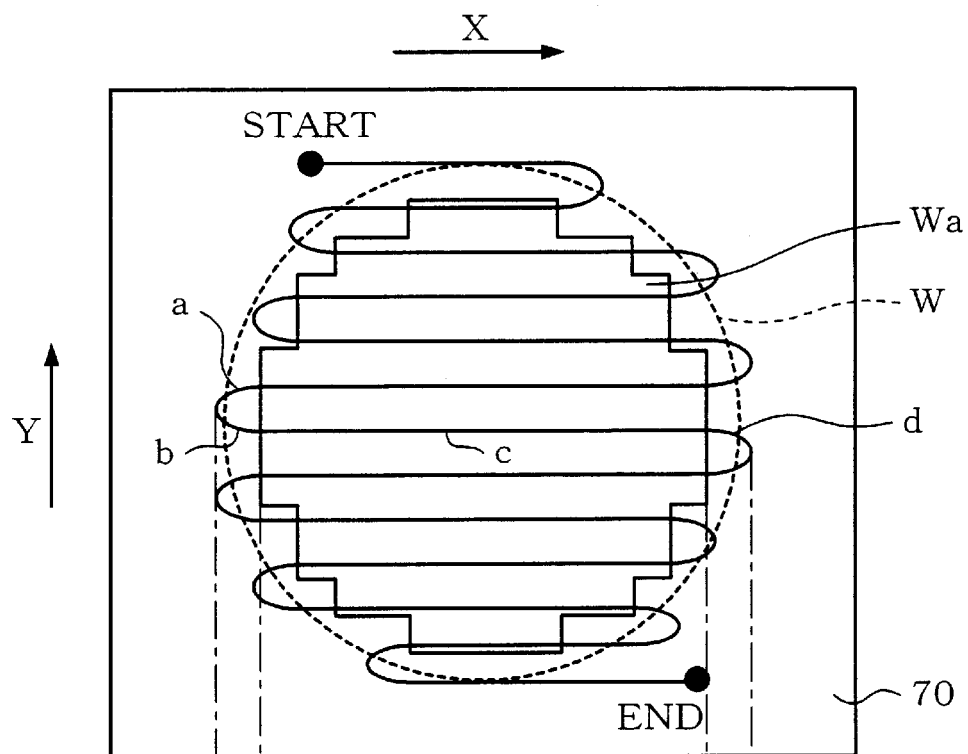
FIG. 11(a) is an explanatory view showing both a resist solution coating path and FIG. 11(b) is a graph which indicates the speed change of the discharge nozzle.
Figure 11B:
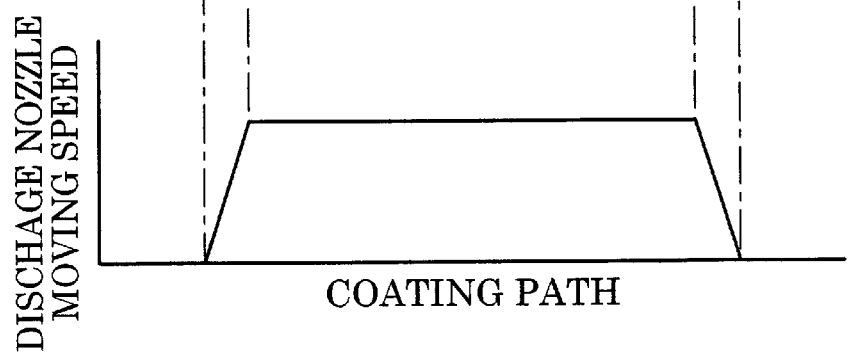
Figure 12:
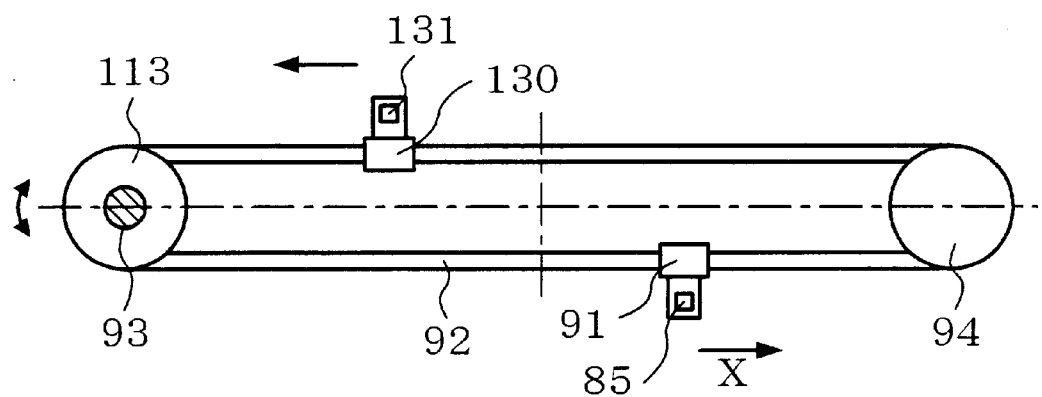
FIG. 12 is a plane view showing a manner in which the discharge nozzle and slider, and another nozzle and slider move back and forth with the movement of the driving belt.

FIG. 11(a) shows an example of a coating path of the resist solution, and the speed change of the discharge nozzle 85 is shown in a graph in FIG. 11(b). As shown in FIG. 11(a), the discharge nozzle 85 starts reciprocating movement from a position START to discharge the resist solution. Meanwhile, the wafer W is intermittently moved a predetermined distance in the direction (the direction Y) perpendicular to the reciprocating direction (the direction X) of the discharge nozzle 85. Thereby, the discharge nozzle 85 scan-moves all over the wafer W to apply the resist solution in the manner of a so-called continuous stroke. The discharge is stopped at a position END shown in FIG. 11(a), thereby finishing the coating.

The speed change of the discharge nozzle 85 will be explained with coating paths a, b, c and d of the resist solution in a coating range Wa on approximately a center of the wafer W as examples. On the coating path a, the discharge nozzle 85 decreases in speed. Thereafter, the discharge nozzle 85 turns, and as shown in FIG. 11(b), it accelerates on the coating path b. Just before it enters the coating range Wa, the discharge nozzle 85 has the highest speed, and on the coating path c, it moves in the coating range Wa at a constant speed. Thereafter, it goes out of the coating range Wa, and decreases in speed in the coating path d. Thereafter, it turns and accelerates to a high speed, and it moves in the coating range Wa once again. As described above, when discharging the resist solution in the coating range Wa, the discharge nozzle 85 moves at the highest speed, and when it turns, it decelerates and accelerates. In the example shown in the drawing, from the point of time when the discharge nozzle 85 starts decelerating, the wafer W is moved a predetermined distance in the direction Y. Further, the discharge nozzle 85 also discharges the resist solution while it decelerates, turns, and accelerates. The resist solution discharged during the deceleration, turning, and acceleration is not used for the resist film forming, but is received by the mask member 70 and discharged.

The reciprocating movement of the discharge nozzle 85 is carried out by the moving means 86. Specifically, as shown in FIG. 7, the motor 95 rotationally drives the driving pulley 93, thereby moving the driving belt 92. In this situation, if the driving pulley 93 is rotated in the normal and the reverse direction by the motor 95, the rotational direction of the driving belt 92 is appropriately switched and reciprocating movement of the discharge nozzle 85 can be carried out.

The coating path of the resist solution is determined by the moving locus of the discharge nozzle 85. Specifically, as shown in FIG. 6, the moving means 86 reciprocates the discharge nozzle 85 via the slider. The discharge nozzle 85 discharges the resist solution while moving along the guide shafts 98a and 98b. Here, as shown in FIGS. 8 and 9, air is supplied from the air supply tube 101 to the gap between the bearing portion 97a of the slider 91 and the guide shaft 98a, and the gap between the bearing portion 97b and the guide shaft 98b, respectively, thus making it possible to allow the slider 91 to float in the air relative to the guide shafts 98a and 98b. In this situation, even if the driving belt 92 slides the slider 91 along the guide shafts 98a and 98b, the bearing portion 97a and the guide shaft 98a, and the bearing portion 97b and the guide shaft 98b are not in mechanical contact with each other, thus hardly causing slide resistance as in a prior art.

Consequently, according to the resist coating unit 17 of the present invention, when the discharge nozzle 85 is moved at a high speed, vibration caused by slide resistance can be reduced, and the discharge nozzle 85 can be faithfully moved along the guide shafts 98a and 98b. As the result, it is possible to prevent the situation in which the resist discharge is disturbed by small movements of the discharge nozzle 85 and nonuniform coating such as, for example, recoating occurs, and it is possible to perform the resist coating in an accurate linear locus and perform film forming quickly with high precision. Further, it is possible to prevent the situation in which the vibrations are transmitted to the other units and adverse effects are exerted on the process in the other units. For example, it does not happen that the accuracy and the like in pattern alignment in the aligner are adversely affected.

Further, since slide resistance hardly occurs, deceleration and acceleration can be smoothly carried out. Thus, decelerating time and accelerating time can be reduced, and the amount of the discharged resist solution can be reduced. As the result, excellent running cost is provided.

Further, the slider 91 is supported with use of the two upper and lower guide shafts 98a and 98b to thereby guide its sliding movement, and the power by the driving belt 92 works on the position of approximately the center of gravity of the slider 91, thus making it possible to prevent the situation in which the slider 91 is out of balance and the posture is disturbed, whereby the posture of the discharge nozzle 85 during reciprocating movement can be stabilized, even if the rotational force of the motor 95 is suddenly changed during deceleration, turning, and acceleration, As shown in FIG. 7, since the balance weight 96 is coupled to the driving belt 92 at the opposite side to the slider 91, the load exerted on one side of the driving belt 92 wound around it and the load exerted on the other side thereof can be kept in balance. When the driving belt 92 is rotationally moved, the balance weight 96 moves symmetrically to the movement of the slider 91 with respect to the center of gravity of the driving belt 92 wound around it. Thus, the effect (vibration and the like) exerted on the driving belt 92, for example, as a result that the discharge nozzle 85 and the slider 91 move, is compensated. Consequently, the discharge nozzle 85 can be reciprocated in a more stable state. The bearing portions 99a and 99b are also formed in the balance weight 96, the nozzle 85 is preferably reciprocated.

After coating, the resist solution on the wafer W is evened by the vibration of the high-frequency vibrator 67. Finally, the coating range Wa on the wafer W is coated with the resist solution without unevenness, thus forming the resist film of a predetermined film thickness. After the mask member 70 retreats from the outer container 61, the wafer W is carried to the carry zone L. Then, by the main carrier 13, the wafer W is carried out of the casing 60, and carried to the vacuum drying unit 33 in which the next process is carried out and reduced-pressure drying processing is performed.

An example of the embodiment of the present invention is explained, but the invention is not limited to this example, and can be carried out in various modes. For example, in place of the balance weight 96, another slider 130 and another nozzle 131 may be coupled to the driving belt 92. In this case, not only the loads on both sides of the driving belt 92 are kept in balance, but also the resist discharge can be performed on both sides of the driving belt 92 at the same time. Thus, it is possible to form the resist film quickly. It goes without saying that the effect on the driving belt 92 is also compensated.

Further, the timing for deceleration and acceleration of the discharge nozzle 85, the timing for the wafer W moving in the direction Y, and the like can be freely changed in accordance with the process.

For example, the deceleration of the discharge nozzle 85 may be started, for example, after it moves to the peripheral portion of the wafer W, or the wafer W may be moved a predetermined distance in the direction Y at a point of time when deceleration of the discharge nozzle 85 stops.

Figure 13:
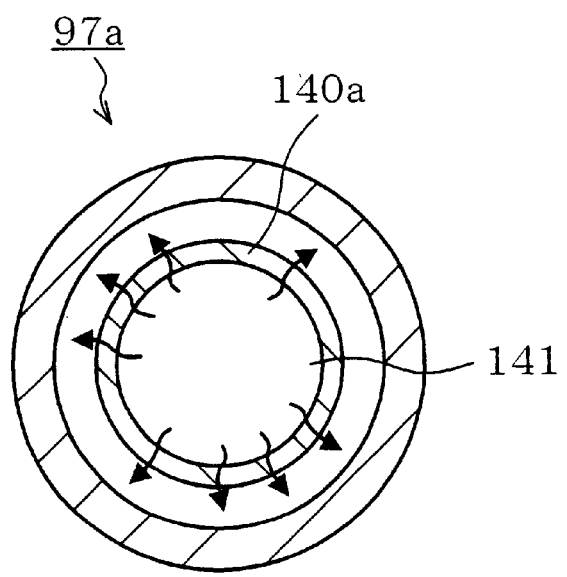
FIG. 13 is an enlarged view of a vertical cross section showing another example of the bearing portion and the guide shaft.

Further, air is discharged into the bearing portions 97a and 97b through the porous films 115a and 115b, but air may be discharged into the bearing portions 97a and 97b through the guide shaft. Specifically, as shown in FIG. 13, a passage 141 is formed inside a guide shaft 140a of a porous material. The air supply tube 101 is connected to a guide shaft 140a. Thereby, air can be supplied into a gap between the bearing portion 97a and the guide shaft 140a. The guide shaft passing through the bearing portion 97b has the same structure. Accordingly, the slider 91 is allowed to float in the air.

Figure 14:
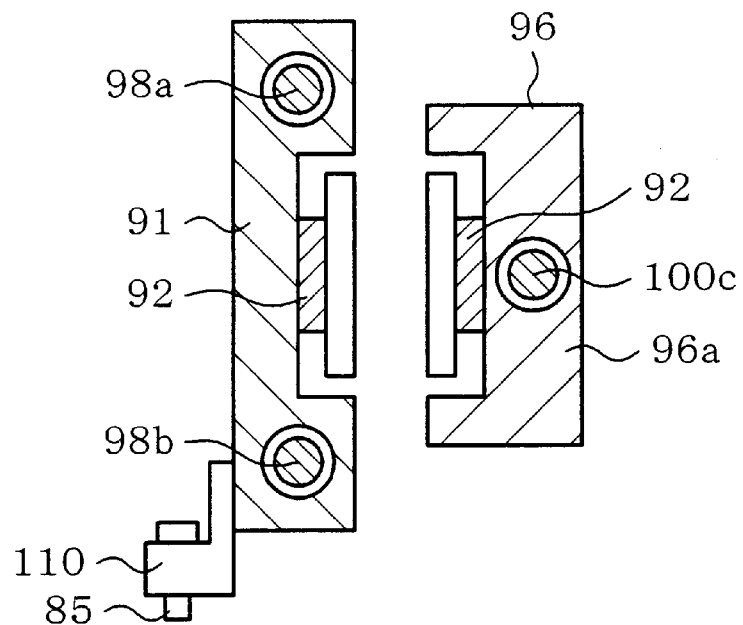
FIG. 14 is a vertical cross sectional view of the moving means when there is one guide shaft on the side of the balance weight.

In the aforesaid embodiment, the slider 91 and the balance weight 96 respectively have two guide shafts 98a and 98b, and 100a and 100b, but instead of these, as shown in FIG. 14, it may be suitable to change the structure of the balance weight 96 to moves the balance weight 96 along one guide shaft 100c. Accordingly, in the example shown in FIG. 14, the total number of the guide shafts is three, thus making it possible to simplify the entire unit.

Figure 15:
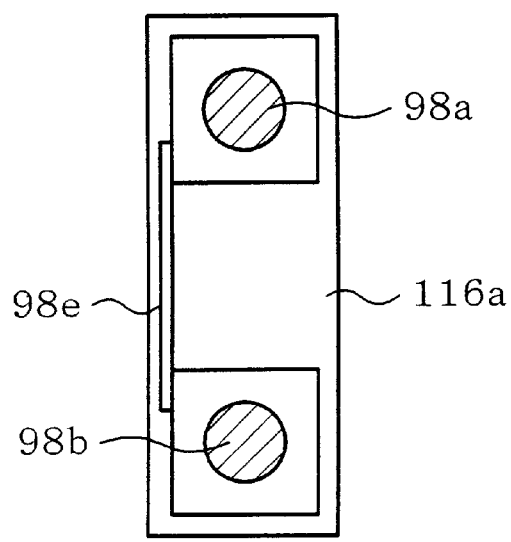
FIG. 15 is a vertical cross sectional view showing a state in which two guide shafts are installed by means of a plate spring.

In the aforesaid embodiment, the guide shafts 98a and 98b are directly provided horizontally between the erection stand 116a vertically provided at the bracket 112a side and the erection stand 116b vertically provided at the bracket 112b side, but in view of the easiness in the assembly operation, the guide shafts 98a and 98b may be erected between the erection stand 116a and the erection stand 116b as shown in FIG. 15.

In the example shown in FIG. 15, a support member 98c for supporting the upper guide shaft 98a and a support member 98d for supporting the lower guide shaft 98b are individually provided and both the support members 98c and 98d are connected by means of a plate spring 98e. The support member 98c is fixed to the erection stand 116a, and while the sliding state of the slider 91 is being checked, the support member 98d is fixed to the erection stand 116a thereafter. By taking the above attachment process, it is possible to facilitate troublesome adjustment of the parallelism of the guide shafts 98a and 98b.

In the aforesaid embodiment, only the slider 91, which is provided at the front side, specifically, the guide shafts 98a and 98b side, is equipped with the discharge nozzle 85, and at the back side, specifically the guide shafts 100a and 100b side, the balance weight 96 is equipped. In the example shown in FIG. 16, in place of the balance weight, another slider 91 having a discharge nozzle 85a (having the same structure as the discharge nozzle 85) is provided. As the result, the example shown in FIG. 16 has two discharge nozzles 85 at the front side and the back side.

Figure 16:
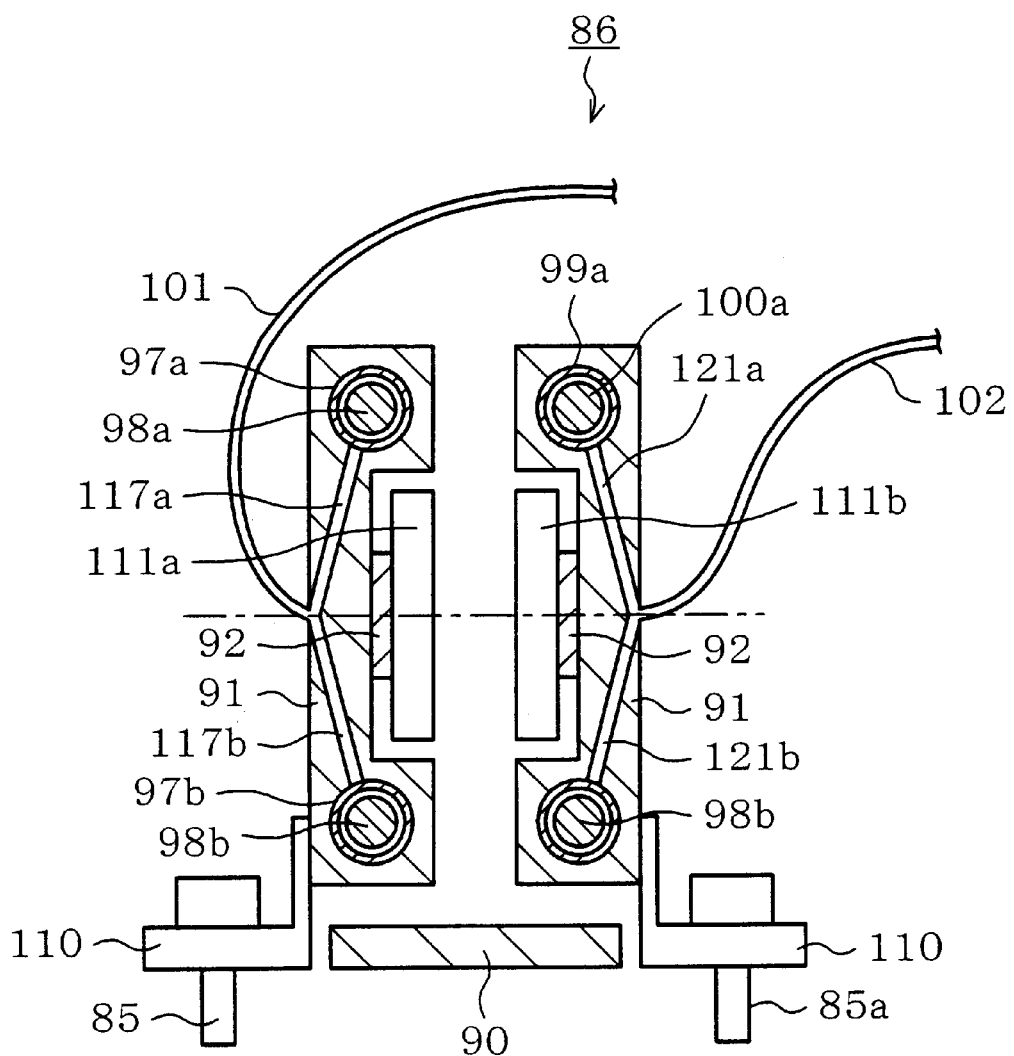
FIG. 16 is a vertical cross sectional view of the moving means when another discharge nozzle is attached in place of the balance weight.
Figure 17:
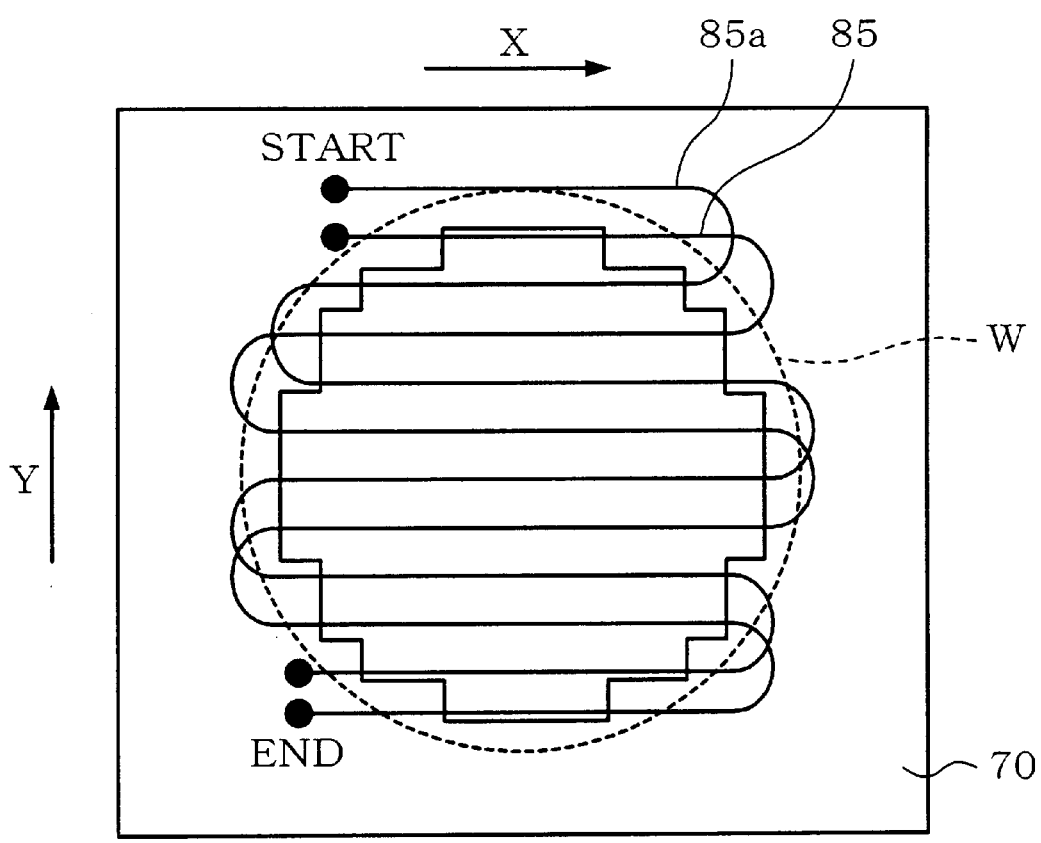
FIG. 17 is an explanatory view showing the resist solution coating path in a plan view when it has the discharge nozzle at its front and rear of its moving direction.

According to the moving means shown in FIG. 16, since the resist solution can be discharged from the two discharge nozzles 85 and 85a at the same time, the coating method shown in FIG. 17 can be realized. Specifically, as shown in FIG. 17, the two discharge nozzles 85 and 85a are disposed across the direction Y, the resist solution can be applied onto the wafer W with a sending pitch of the wafer W in the direction Y (the moving distance per one step) being made twice as large as that in the example in FIG. 11. Accordingly, the time required for the coating is reduced to a half of that in the example in FIG. 11, thus enhancing throughput.

Figure 18:
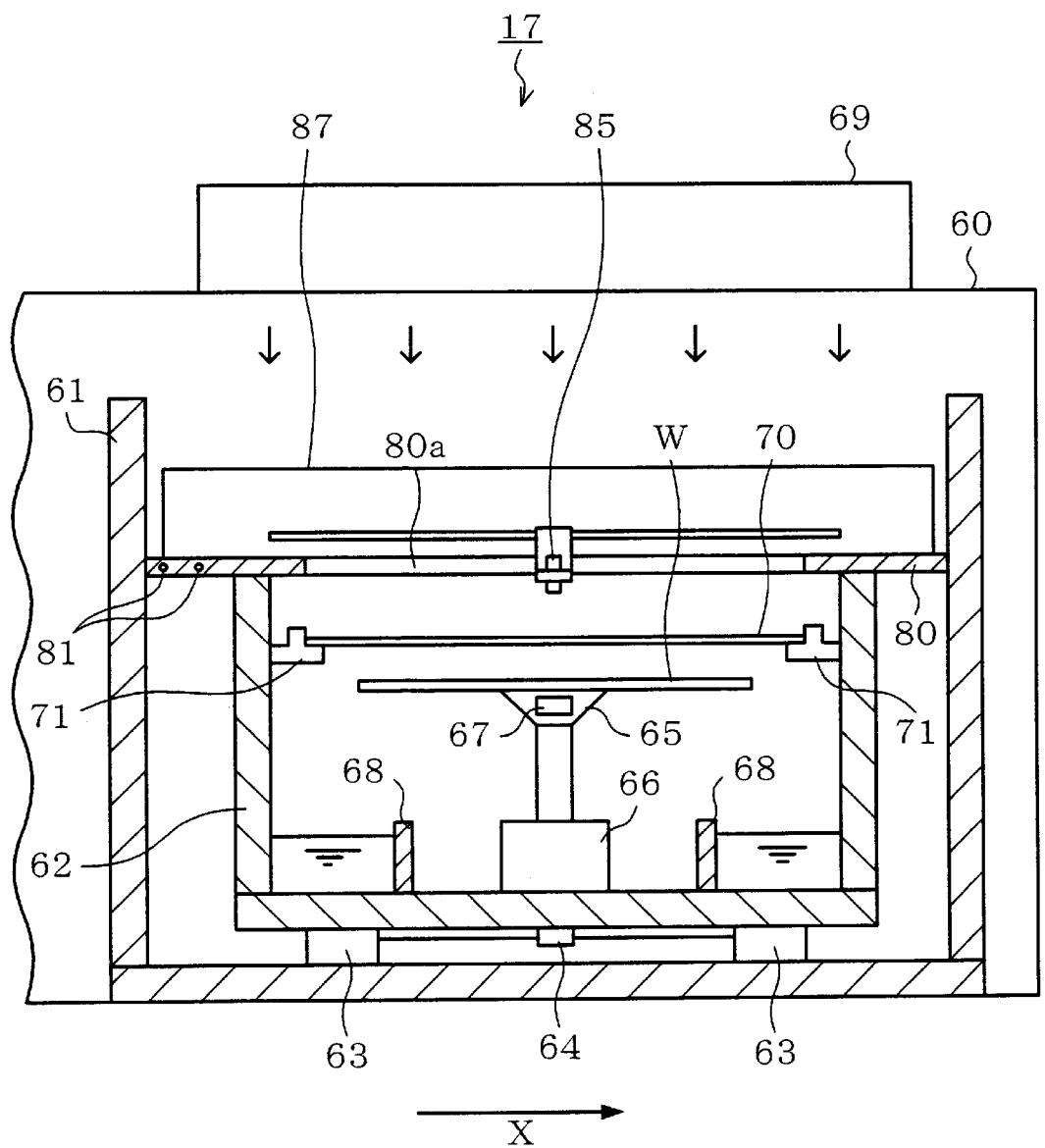
FIG. 18 is an explanatory view of a vertical cross section of a resist coating unit according to another embodiment.
Figure 19:
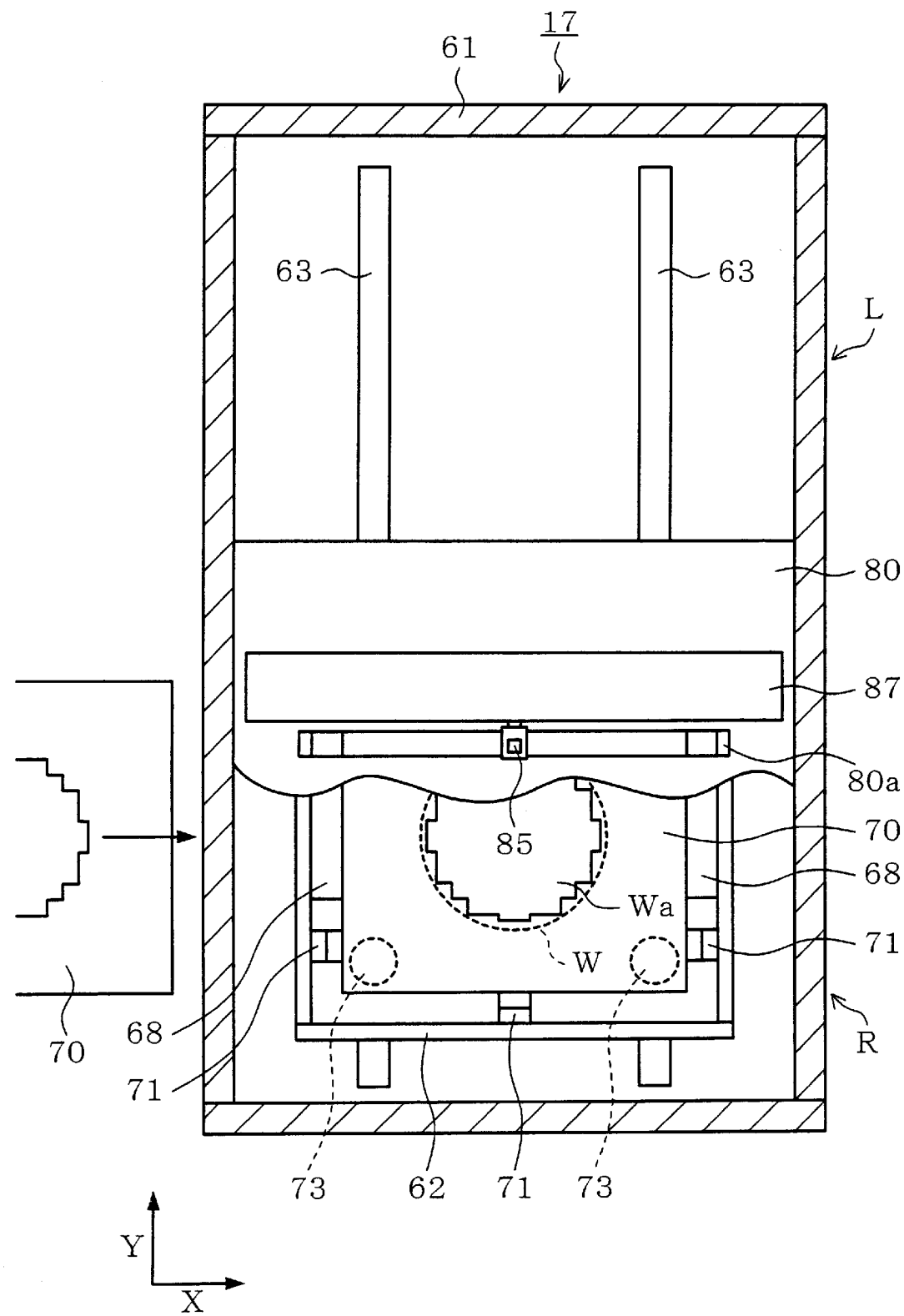
FIG. 19 is an explanatory view of a horizontal cross section of the resist coating unit according to another embodiment.

Next, another embodiment will be explained. In the casing 60 of the resist coating unit 17 according to this embodiment, moving means for reciprocating the discharge nozzle 85 is covered with a cover 87 as shown in FIGS. 18 and 19.

Figure 20:
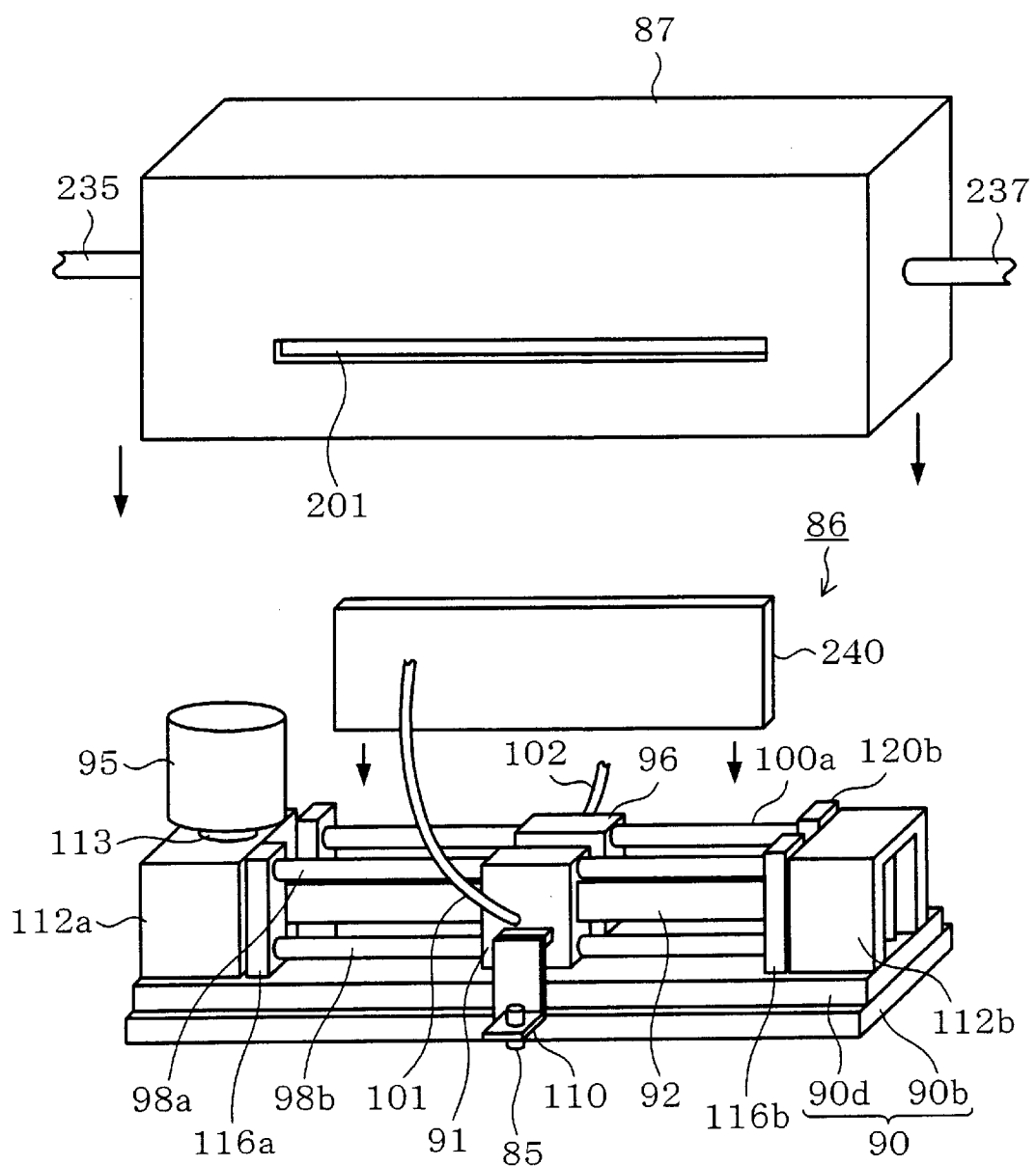
FIG. 20 is a perspective view showing a cover, a partition plate, and the moving means in an exploded state.
Figure 21:
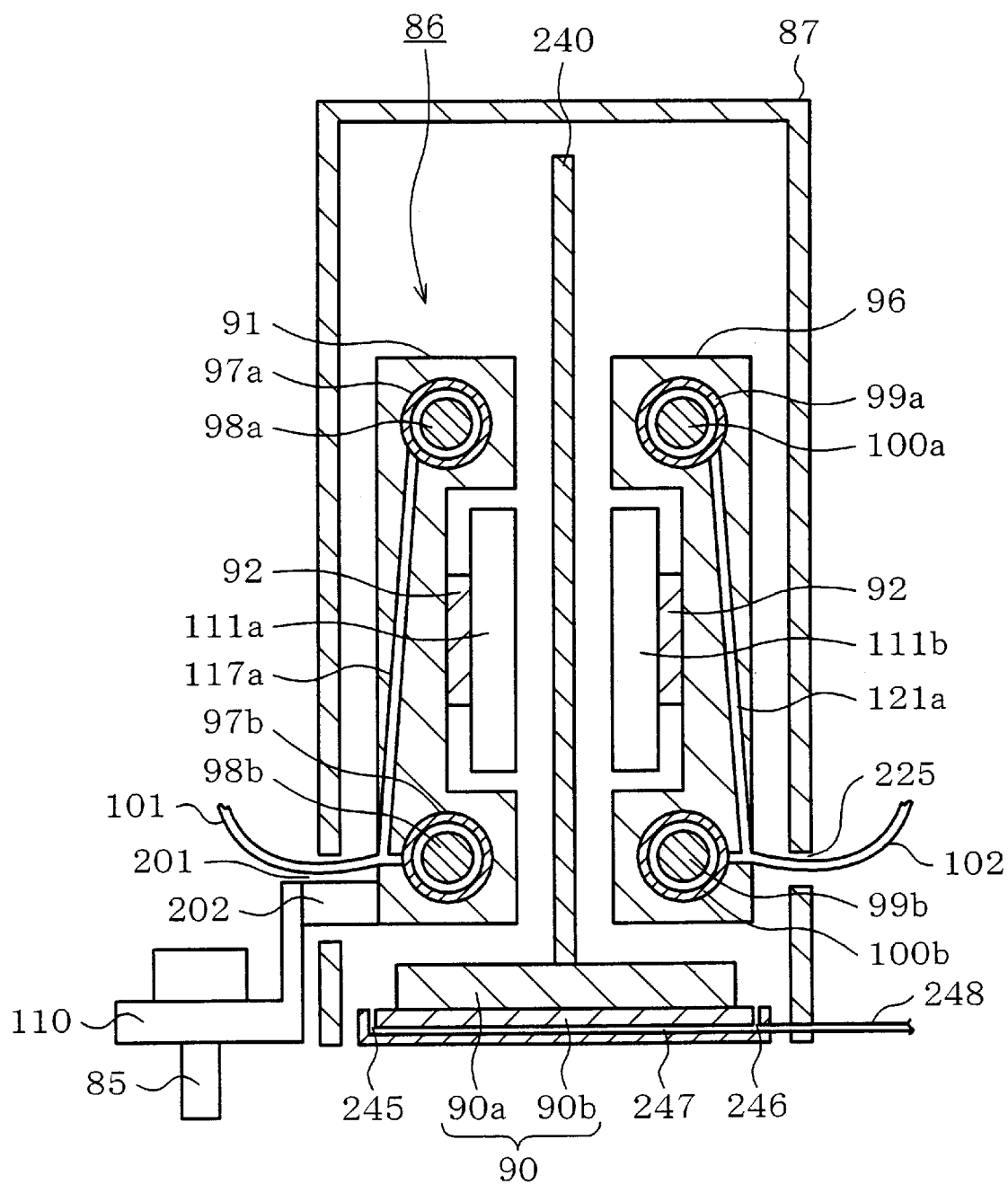
FIG. 21 is an explanatory view of a vertical cross section of the moving means which is disposed inside the cover.
Figure 22:
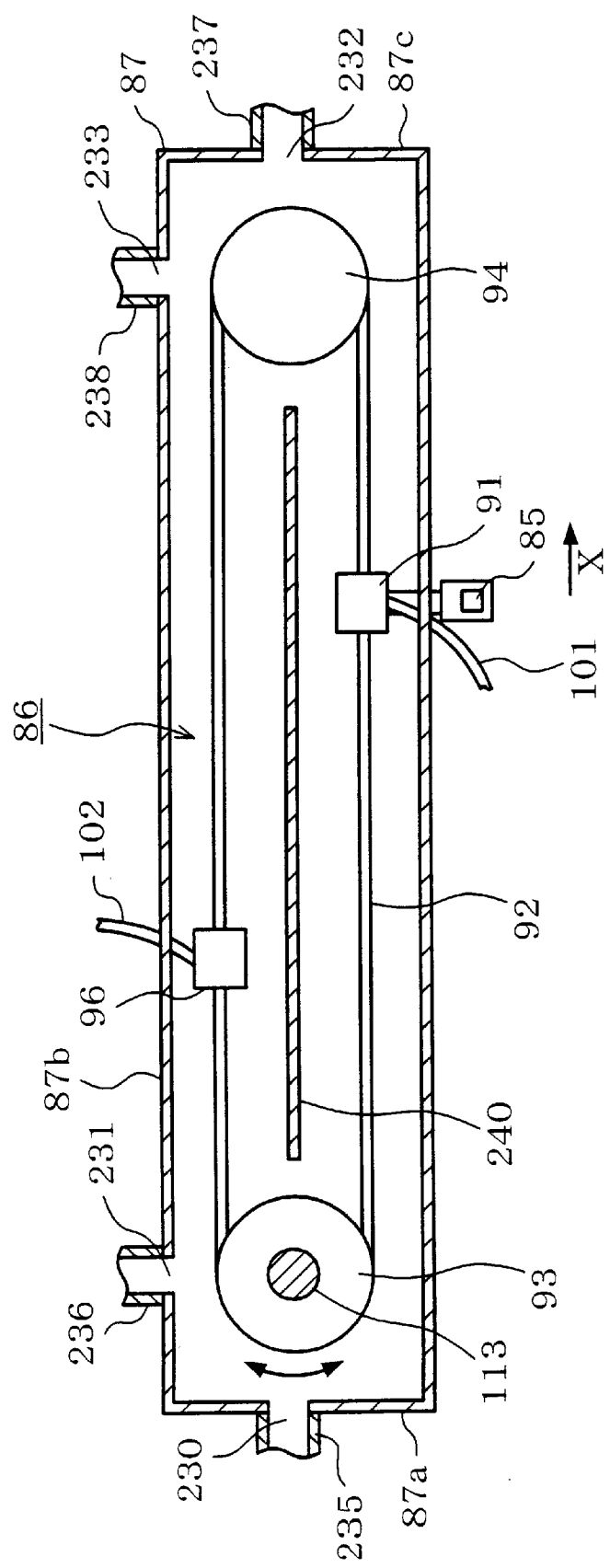
FIG. 22 is an explanatory view of the moving means which is disposed inside the cover in the plan view.

As shown in FIG. 20 to FIG. 22, an air slider method is adopted in the moving means 86. Specifically, the moving means 86 includes the base 90 on which the slide moving mechanism for sliding the slider 91 is placed. The base 90 is defined by an upper part 90a and a lower part 90b.

A slit 201 is formed in the aforesaid cover 87. The nozzle bracket 110 is fixed to the slider 91 disposed in the cover 87 by a fixing member 202 via the slit 201. Accordingly, the discharge nozzle 85 reciprocates outside the cover 87.

The inlet side of the air supply tube 101 is connected to the air supply source not shown. The outlet side of the air supply tube 101 is guided into the cover 87 via the slit 201 and connected to the slider 91 to communicate with the channel 117a formed inside the slider 91. Air is supplied into the bearing portions 99a and 99b through the channel 121a by the air supply tube 102 introduced from a slit 225.

Exhaust ports 230, 231, 232 and 233 for discharging the atmosphere in the cover 87 are formed at four spots in the cover 87. The exhaust port 230 is formed near the driving pulley 93 in a cover side face 87a, and the exhaust port 231 is formed near the driving pulley 93 in a cover side face 87b. The exhaust port 232 is formed near the idler pulley 94 in a cover side face 87c, and the exhaust port 233 is formed near the idler pulley 94 in a cover side face 87b. An exhaust pipe 235 is connected to the exhaust port 230, an exhaust pipe 236 to the exhaust port 231, an exhaust pipe 237 to the exhaust port 232, and an exhaust pipe 238 to the exhaust port 233 respectively. Each exhaust pipe 235 to 238 is communicated with an exhaust system in a factory. Accordingly, by exhaust from each exhaust port 230 to 233, the inside of the cover 87 can be kept in negative atmosphere.

A partition plate 240 for separating the slider 91 side (one side of the driving belt 92 wound around it) and the balance weight 96 side (the other side of the driving belt 92 wound around it) is provided inside the driving belt 92 wound around the driving pulley 93 and the idler pulley 94. The partition plate 240 is fixed to the upper part 90a of the base 90. The partition plate 240 divides the space inside the driving belt 92 into approximately two.

Figure 23:
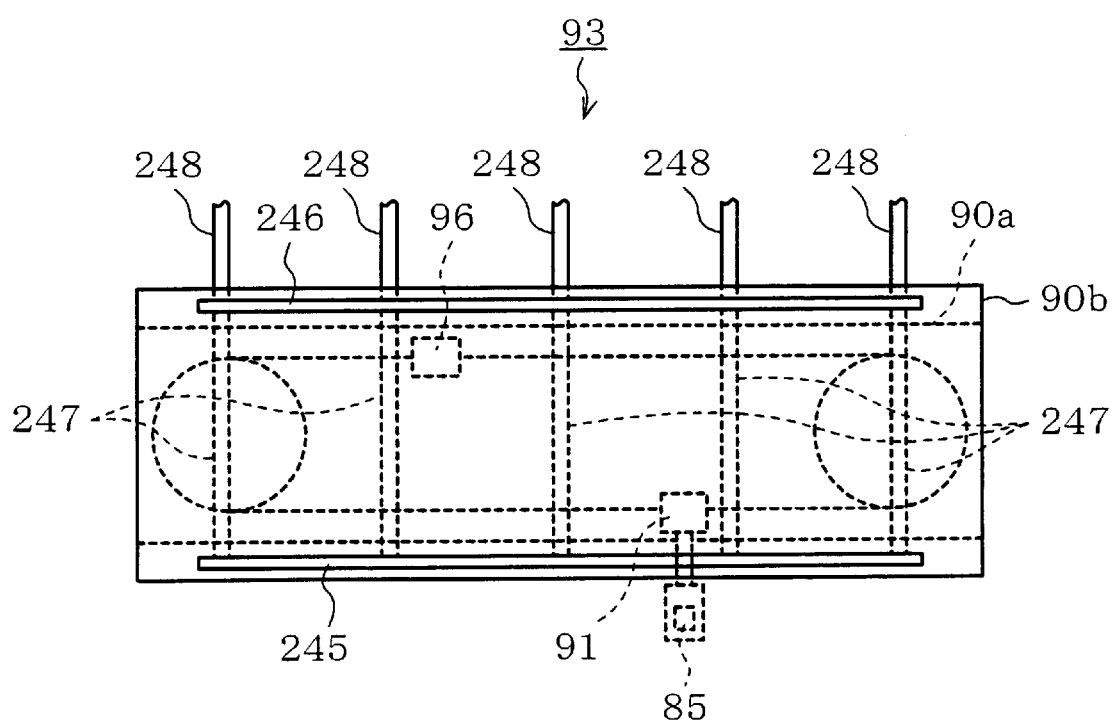
FIG. 23 is a plane view of a base.

As shown in FIG. 21 and FIG. 23, an exhaust port 245 in a slit form along the locus of the movement of the slider 91 is formed at one side of the lower part 90b of the base 90 (the left side in FIG. 21 and the lower side in FIG. 23). An exhaust port 246 in a slit form along the locus of the movement of the balance weight 96 is formed at the other side of the lower part 93b (the right side in FIG. 21 and the upper side in FIG. 23). These exhaust ports 245 and 246 communicate with a plurality of passages 247 formed inside the lower part 90b. An exhaust tube 248 is connected to each passage 247.

When the slider 91 and the balance weight 96 are moved by the drive of the driving belt 92, air stream occurs around them. Further, when the driving belt 92 touches the driving pulley 93 and the idler pulley 94, dust occurs in some cases. However, according to this embodiment, these components are disposed inside the cover 87, and the atmosphere inside the cover 87 is exhausted from the exhaust ports 230 to 233, 245 and 246, air stream and particles can be discharged from the cover 87 without scattering on the surroundings. As the result, scattering particles can be prevented from attaching onto the wafer W, thus enhancing yield. Further, even if the motor 95 operates to thereby generate heat, thermal atmosphere in this situation is exhausted from the cover 87 and does not exert an effect on the wafer W. As the result, a preferable resist film can be formed on the wafer W.

In addition, since the exhaust ports 230 and 231 are formed near the driving pulley 93 and the exhaust ports 232 and 233 are formed near the idler pulley 94, the particles occurring around the driving pulley 93 and the idler pulley 94 can be immediately discharged and the particles can be surely prevented from scattering.

Since the partition plate 240 is provided inside the driving belt 92, a turbulent flow caused by the rotational movement of the driving belt 92 and the rotation of the driving pulley 93 and the idler pulley 94 can be reduced, and the atmosphere inside the cover 87 can be efficiently drawn into the exhaust ports 230 to 233.

Since the exhaust port 245 in the slit shape is formed along the moving direction of the slider 91 in the lower part 90b of the base 90, particles occurring following the reciprocating movement of the discharge nozzle 85 can be also discharged from the exhaust port 245. Thus, double prevention of the particle attachment to the wafer W is achieved. Similarly, particles occurring following the sliding movement of the balance weight 96 can be discharged from the exhaust port 246.

Figure 24:
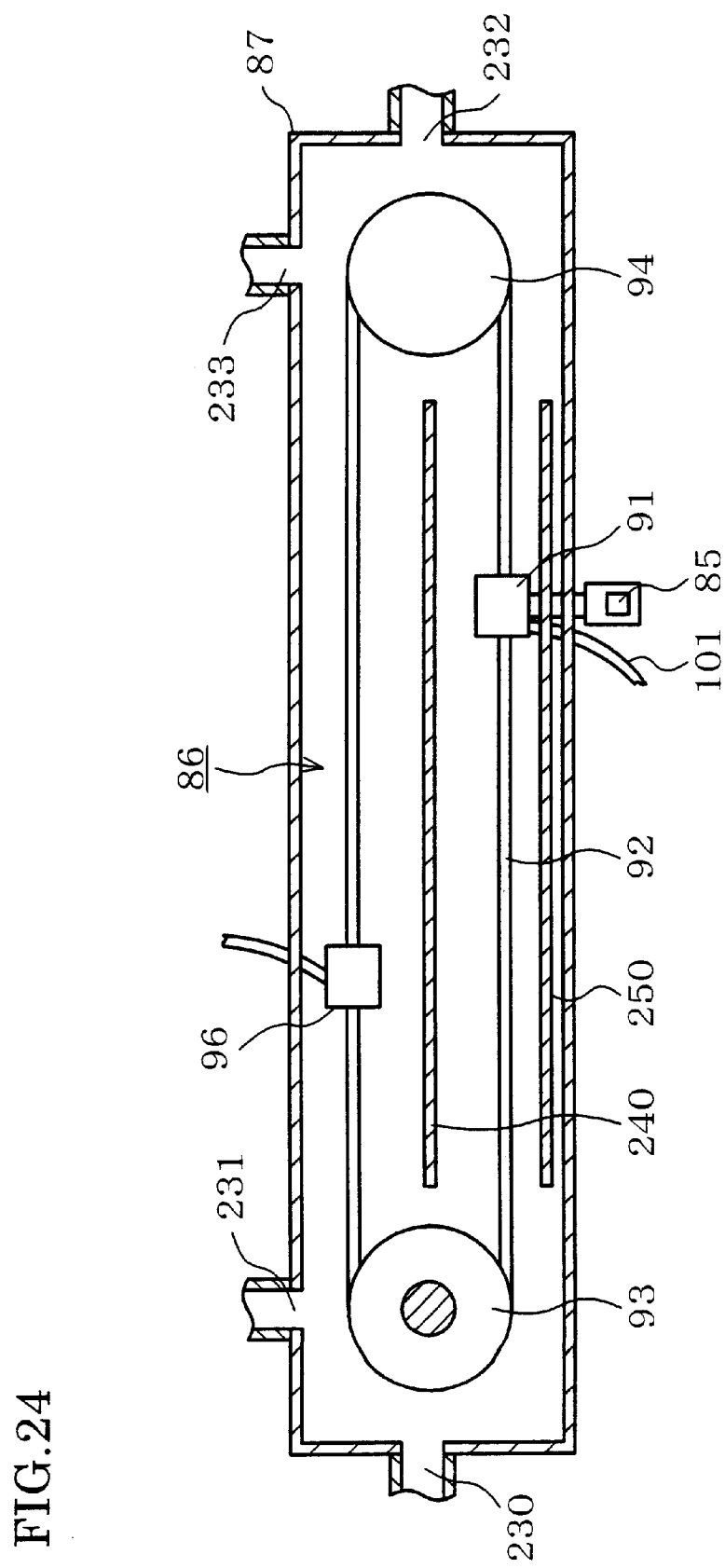
FIG. 24 is an explanatory view of the moving means having the partition plate between the inner surface of the cover and the driving belt in the plan view.

Still another embodiment will be explained. As shown in FIG. 24, not only the partition plate 240 is provided inside the driving belt 92, but also a partition plate 250 may be provided between the driving belt 92, for example, at the slider 91 side and the inner surface of the cover 87. A slit (not shown) for connecting the slider 91 and the discharge nozzle 85 is formed in the partition plate 250. According to this configuration, air stream occurring around the slider 91 is allowed to stay inside the partition plate 250 and scattering of air stream can be prevented more securely.

Figure 25:
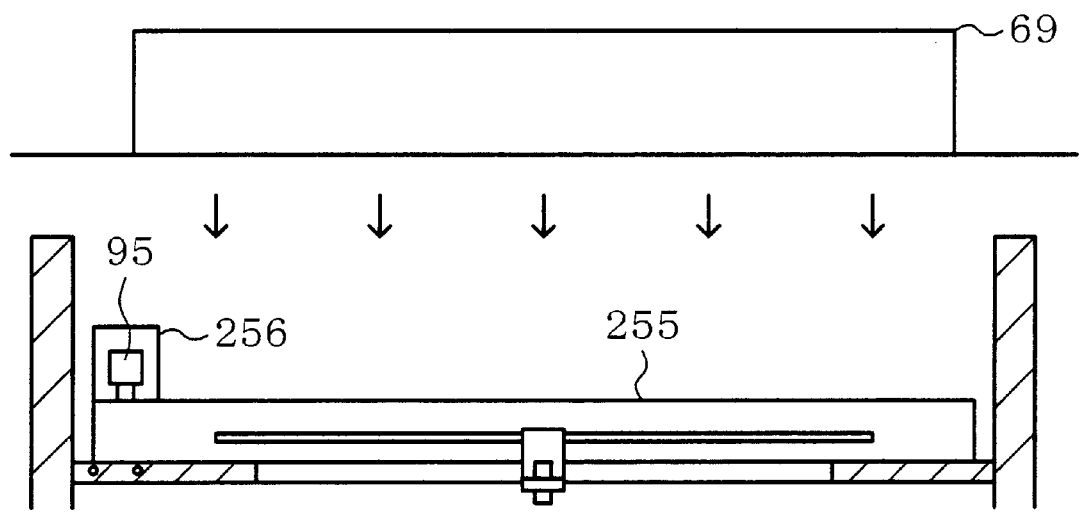
FIG. 25 is an explanatory view showing a state in which a motor is attached outside the cover, taken from the front.
Figure 26:
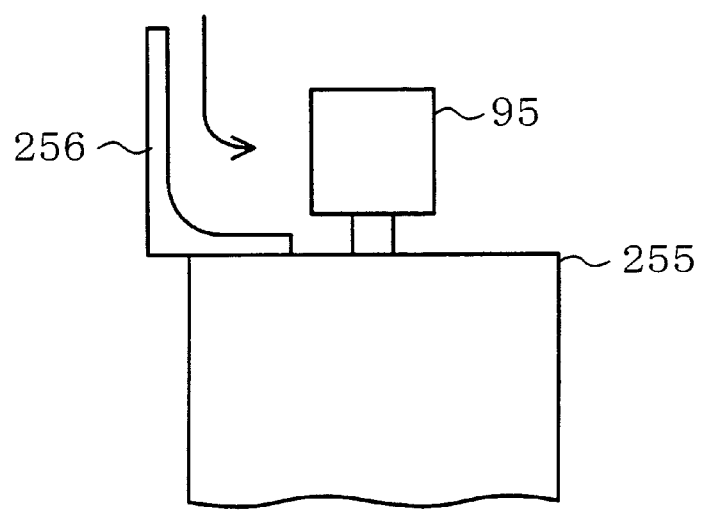
FIG. 26 is an explanatory view showing a state in which the motor is attached outside the cover, taken from the side.

As shown in FIG. 25 and 26, only the motor 95 may be disposed outside a cover 255. In this example, a guide 256 for guiding down flow sent from the aforesaid filter unit 69 to the motor 95 is placed on the top face of the cover 255 near the motor 95. The side of the guide 256 is in approximately an L shape, and an inner corner portion thereof is bent inward in a concave form. Thus, the guide 256 is designed to be able to easily guide down flow to the motor 95. According to this configuration, the height of the cover 255 can be reduced to be low, while the motor 95 is cooled by down flow and the thermal effect on the other parts from the motor 95 can be reduced.

Figure 27:
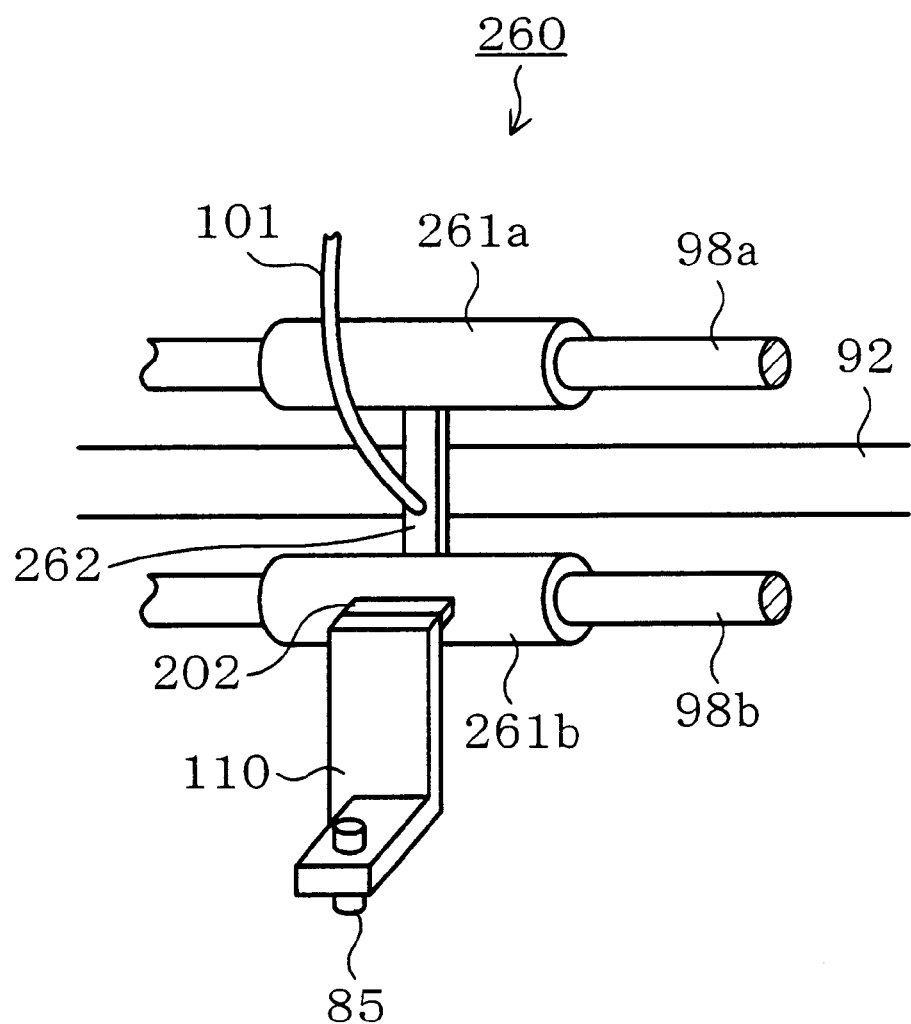
FIG. 27 is a perspective view showing a modified example of the slider.

Further, another modification example of the slider is shown in FIG. 27. Though the aforesaid slider 91 has the configuration in which the bearing portions 97a and 97b are formed inside with the block member being appropriately machined. However, a slider 260 shown in. FIG. 27 has the configuration in which a pair of bearing members 261a and 261b are connected by a connecting member 262. The guide shaft 98a passes through the upper bearing member 261a and the guide shaft 98b passes through the lower bearing member 261b respectively. The aforesaid discharge nozzle 85 and the nozzle bracket 110 are fixed to the bearing member 261b by the fixing member 202. The driving belt 92 is coupled to the connecting member 262. The air supply tube 101 is connected to the connecting member 262, and a passage (not shown) communicating with the bearing members 261a and 261b are formed inside the connecting member 262. The slider 260 with the above configuration slides while supporting the discharge nozzle 85. However, it is composed of minimum necessary components, thus the slider 260 has lower air resistance and causes less air stream even if it slides at a high speed. Further, since the slider 260 is light in weight, less load is exerted on the driving belt 92. Accordingly, when the motor 95 rotates in the normal and reverse direction, the driving belt 92 is allowed to respond quickly, and its moving direction can be quickly switched.

Further, the timing of deceleration and acceleration of the discharge nozzle 85, the timing of the wafer W moving in the direction Y and so on can be freely changed in accordance with the process. For example, the deceleration of the discharge nozzle 85 may not be started immediately after the wafer W is out of the coating range Wa, and it may be started, for example after the discharge nozzle 85 moves to the periphery portion of the wafer W.

Figure 28:
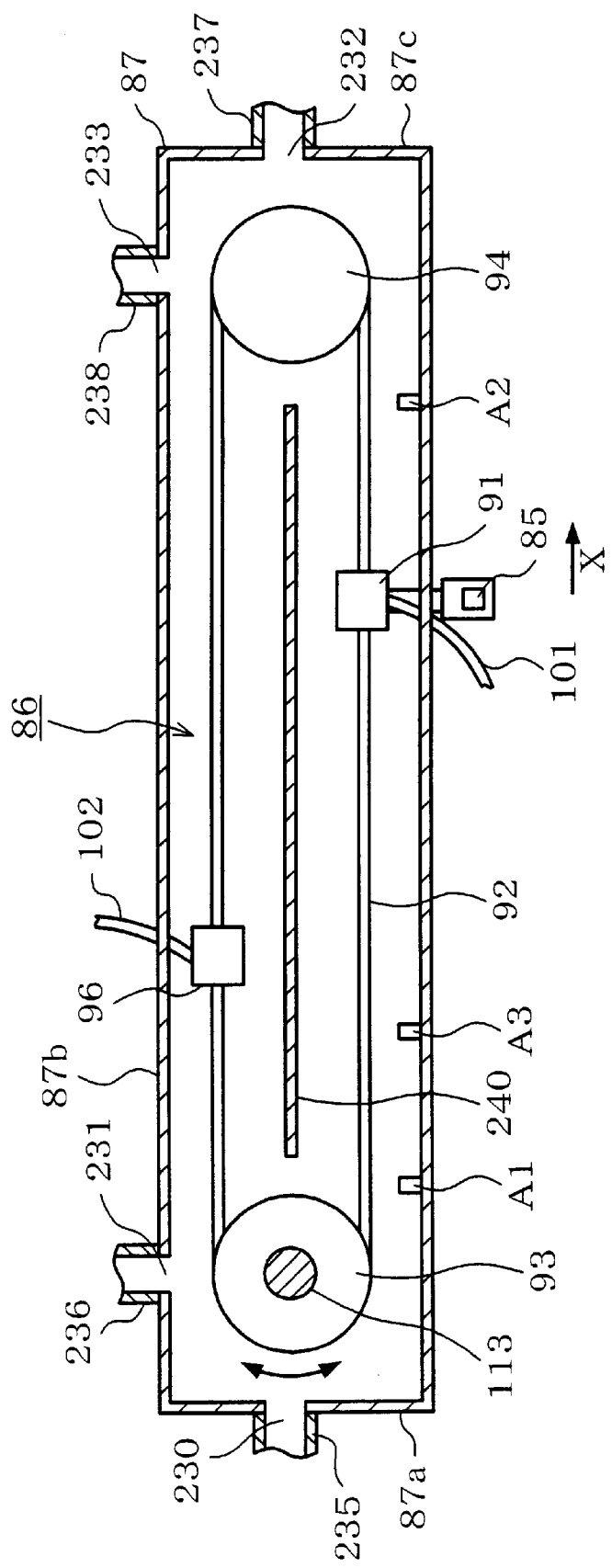
FIG. 28 is an explanatory view of the moving means which is disposed inside the cover when optical sensors are attached to the cover, viewing its plane state.

An allowable movement range of the discharge nozzle 85 is previously set, but it can be expected that it is deviated from the allowable range due to wear, slack and the like of the driving belt 92. In order to prevent the above situation, for example, as shown in FIG. 28, in the cover 87, optical sensors A1 and A2, for example, are placed at both ends of the aforesaid allowable range for monitoring with the optical sensors A1 and A2. Specifically, the optical sensors A1 and A2 function as a kind of a limit sensor. When the optical sensors A1 and A2 detect one of the discharge nozzle 85, the slider 91 and the nozzle bracket 110, if they let it known to the outside, an accident can be prevented. If, for example, optical initial sensor A3 serving as a reference point of the slider 91 is provided between the optical sensors A1 and A2, the allowable range for the slider 91 can be easily controlled.

Figure 29:
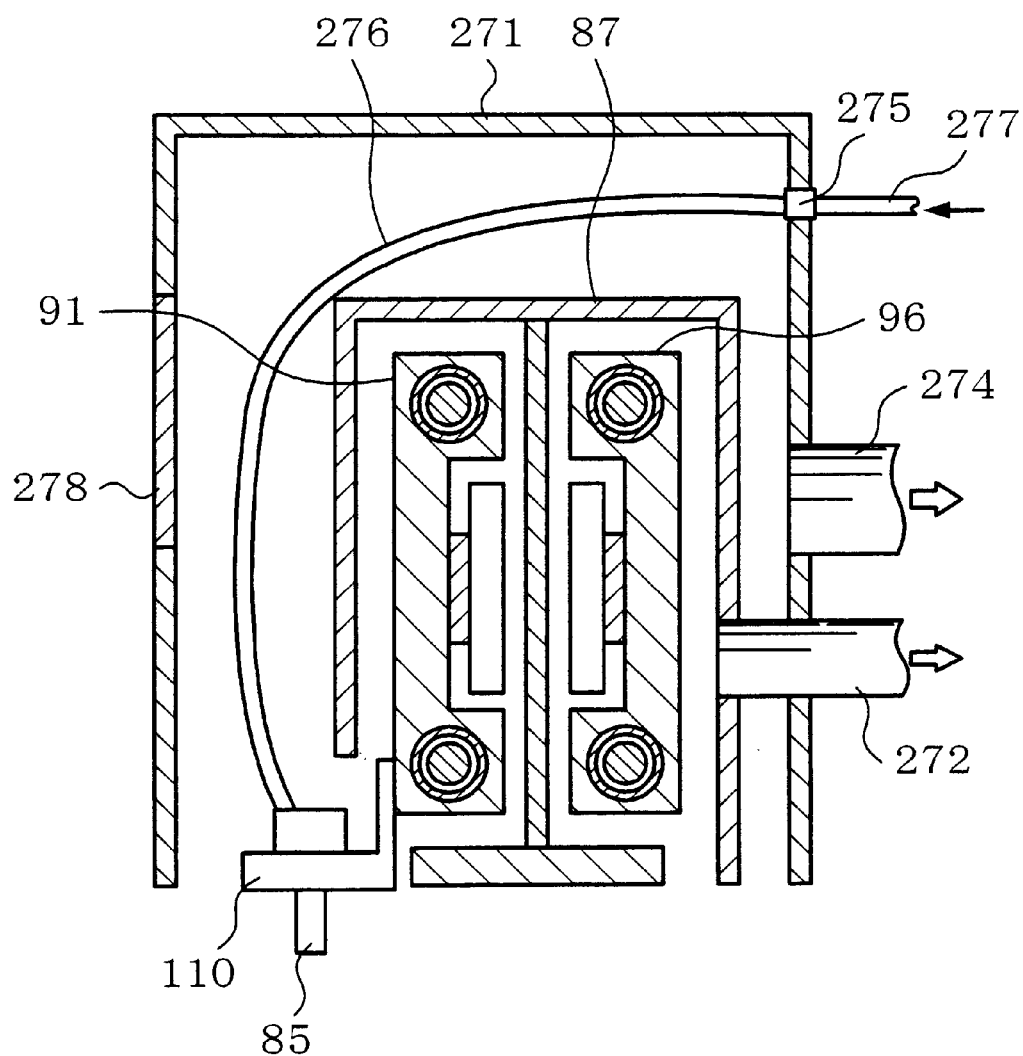
FIG. 29 is an explanatory view of a vertical cross section of the moving means having another cover.

The example shown in FIG. 29 has another cover 271, with which the entire moving means 86 is covered, outside the cover 87. In the example in FIG. 29, the driving pulley and the idler pulley generating a large amount of dust are housed in the cover 87, and the atmosphere inside the cover 87 is discharged from exhaust pipes 272 and 273 at the back side. The exhaust ports for the exhaust pipes 272 and 273 in the cover 87 are provided near the driving pulley and the idler pulley.

Meanwhile, the atmosphere inside the other cover 271 is exhausted from an exhaust pipe 274 provided at a back side of the other cover 271. The resist solution is sent to the discharge nozzle 85 via a first tube 276 connecting the discharge nozzle 85 and a connector 275 provided at the other cover 271 and a second tube 277 connecting, for example, a resist solution storing tank (not shown) and the aforesaid connector 275. According to the above configuration, even if the discharge nozzle 85 moves at a high speed and the first tube 276 moves following it, the moving range of the tube remains within the other cover 271. Accordingly, compared with the case in which the first tube 276 is directly connected to the aforesaid resist solution storing tank, the safety of the tube is improved and the moving space of the tube is made compact.

As for the exhaust of the atmosphere inside the cover, the atmosphere inside the cover 87 with a large amount of dust is exhausted through the exhaust pipes 272 and 273, and the atmosphere inside the other cover 271 with less amount of dust is exhausted through the exhaust pipe 274, thus reducing the energy during exhaust by connecting the exhaust pipes 272 and 273 and the exhaust pipe 274 to another exhaust means (for example, a pump). For example, it can be proposed that the exhaust pipe 274 is connected to a concentrated exhaust system in the factory and the exhaust pipes 272 and 273 are connected to a special high-speed injector.

Figure 30:
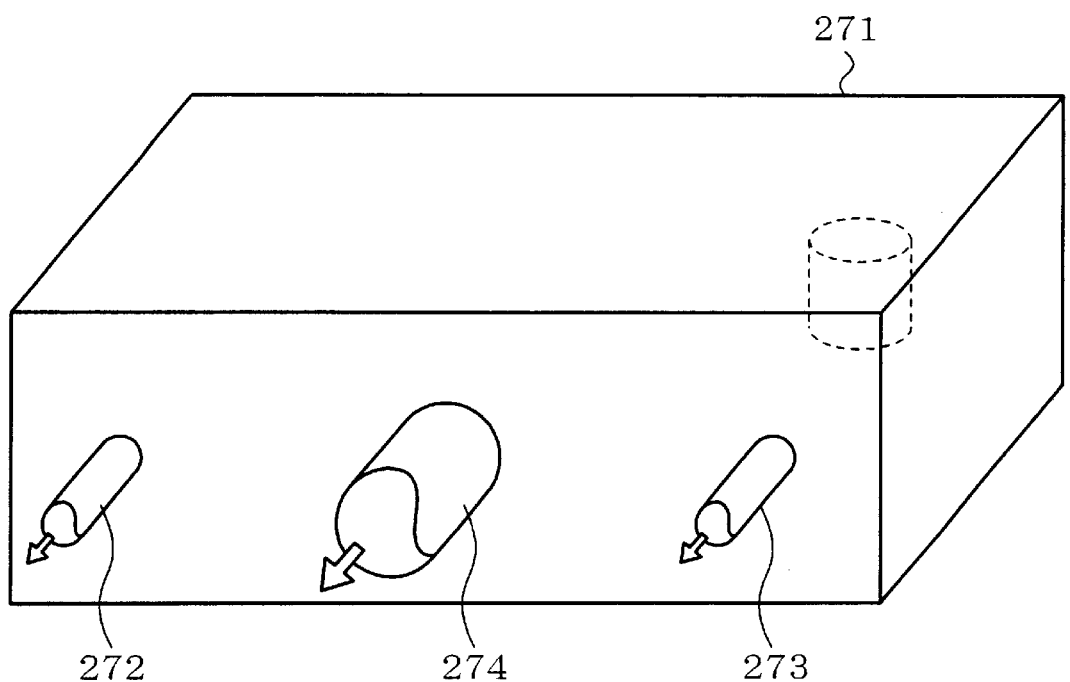
FIG. 30 is a perspective view of another cover shown in FIG. 29.

As understandable from FIG. 30, all of the exhaust pipes 272, 273 and 274 are provided at the back side of the other cover 271, and thus the area around the exhaust pipes is clear and simple.

The air supply tube and the like may be similarly connected to the air supply source outside via a connector provided at the other cover 271.

If a transparent window member 278 is provided at a front side of the other cover 271, the inside of the other cover 271 can be visually observed. It goes without saying that the cover 87 may also be provided with such a window member.

Figure 31:
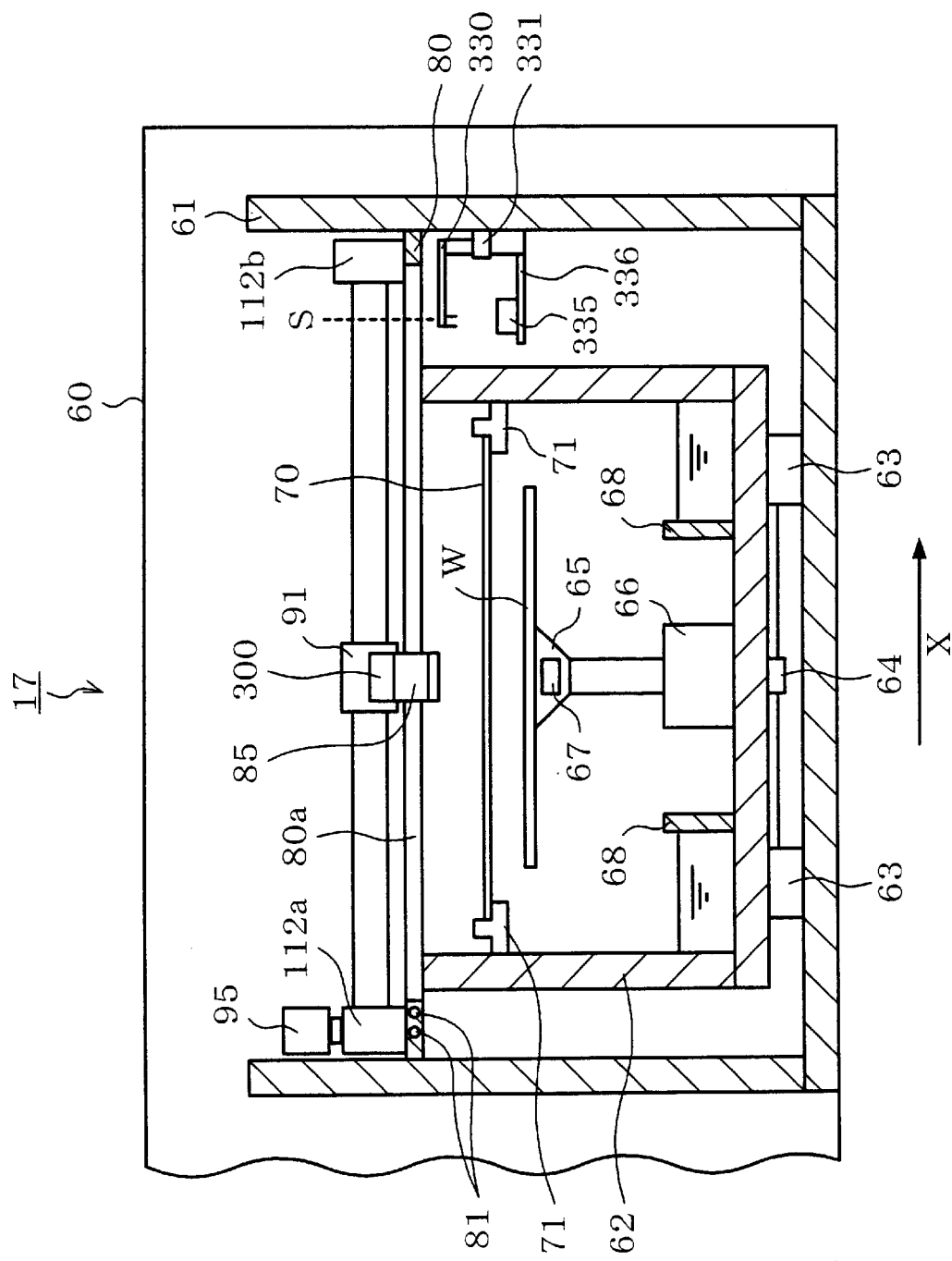
FIG. 31 is an explanatory view of a vertical cross section of a resist coating unit according to another embodiment.
Figure 32:
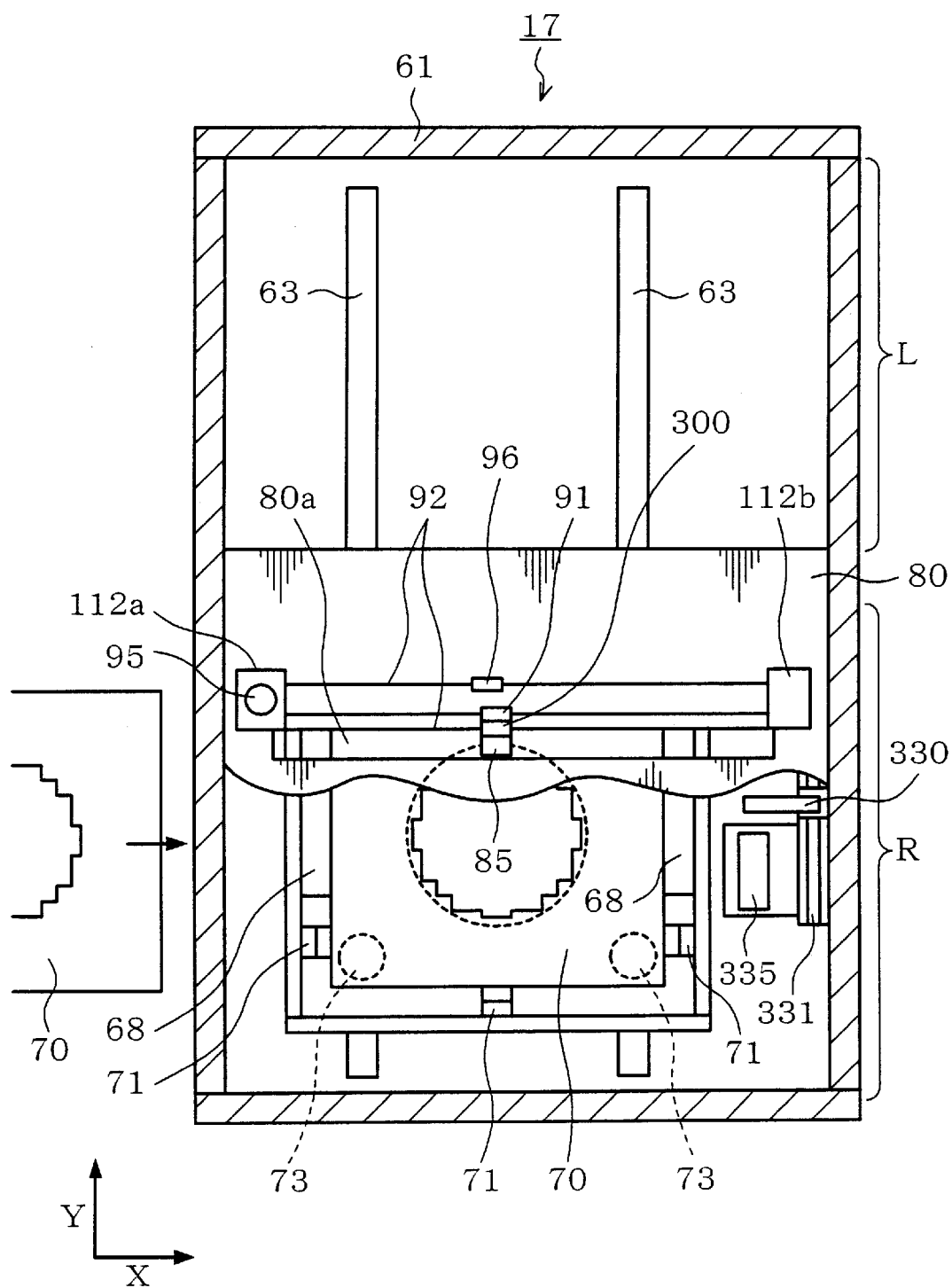
FIG. 32 is an explanatory view of a horizontal cross section of the resist coating unit according to the embodiment shown in FIG. 31.
Figure 33:
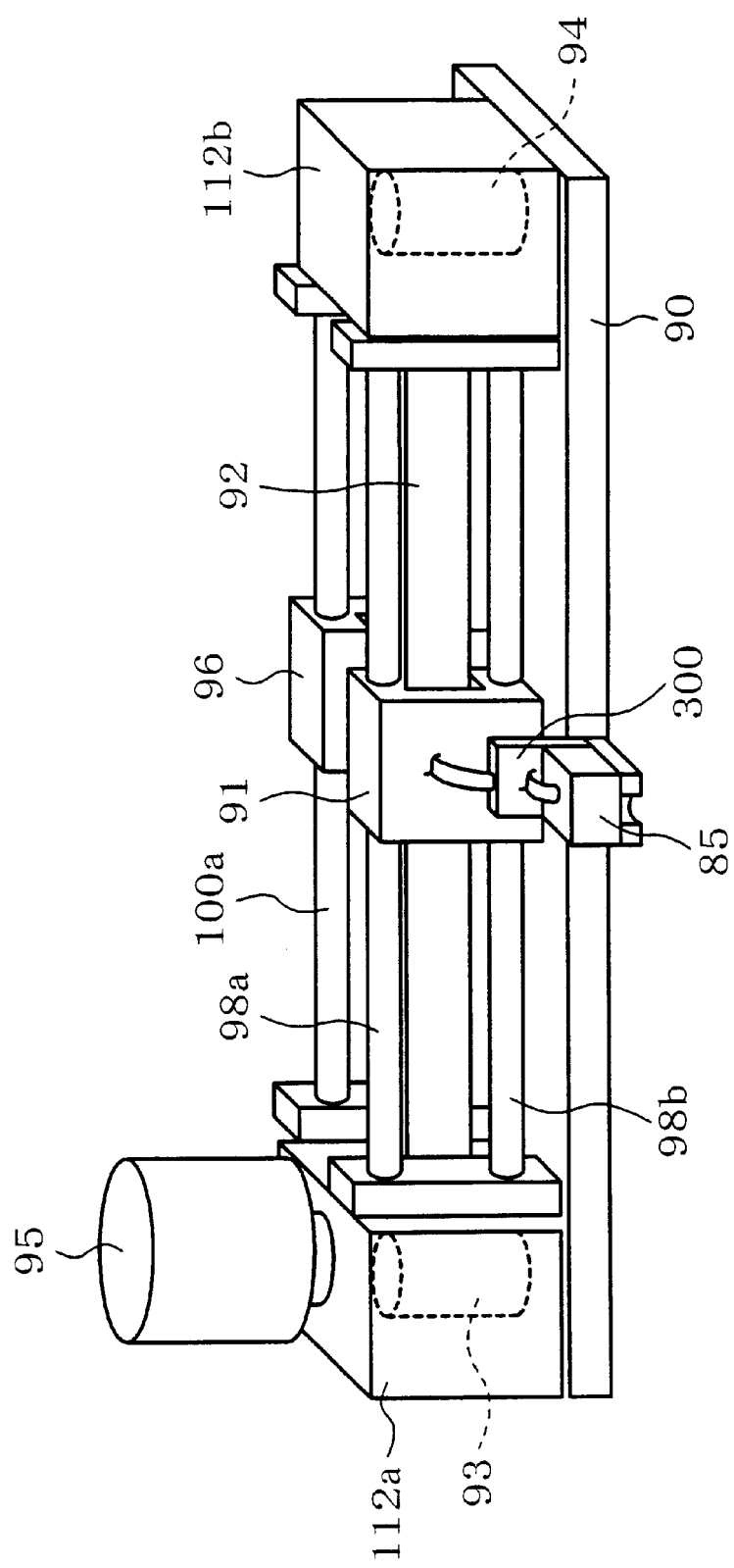
FIG. 33 is a perspective view showing a moving mechanism of the discharge nozzle.

Still another embodiment will be explained. As shown in FIGS. 31 and 32, in this embodiment, a nozzle carrier arm 330 is provided for replacing the discharge nozzle 85 from the outside in the normal direction of the direction X of the aforesaid inner container 62, and thus the length of the slit 80a is extended in the normal direction of the direction X so that the aforesaid discharge nozzle 85 can move to a replacement position S. As shown in FIG. 33, the discharge nozzle 85 is fixed to a nozzle holder 300 as a discharge nozzle holding member, and the nozzle holder 300 is attached to the slider 91. When the discharge nozzle 85 is replaced, the discharge nozzle 85 can be moved to the replacement position S outside the inner container 62 described above.

The discharge nozzle 85 in the embodiment shown in FIG. 33 has an approximately cylindrical inner body 326 and a nozzle plate 325 for blocking an underside face thereof, and a discharge port 324 is formed in a center of this nozzle plate 325. The nozzle plate 325 is closely fixed to the underside surface of the inner body 326 by an outer body 327 serving as a retaining member screwed into an outer side of the inner body 326.

Figure 35:
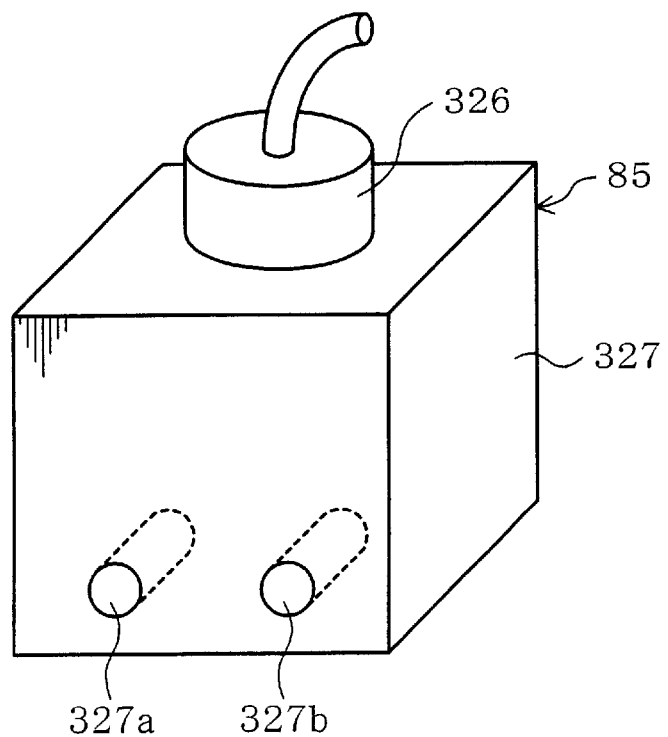
FIG. 35 is a perspective view showing an appearance of the discharge nozzle.

A side face of the outer body 327 is formed to be flat so that the discharge nozzle 85 is held in close contact with the nozzle holder 300. Further, two recessed portions 327a and 327b are formed in the side face of the outer body 327 as shown in FIG. 35, so that they are fit into projected portions 300g and 300h described below provided at the nozzle holder 300 when being sucked. A hole is provided in the center area of the lower end face of the outer body 327 so that the discharge of the resist solution is not hindered.

Figure 34:
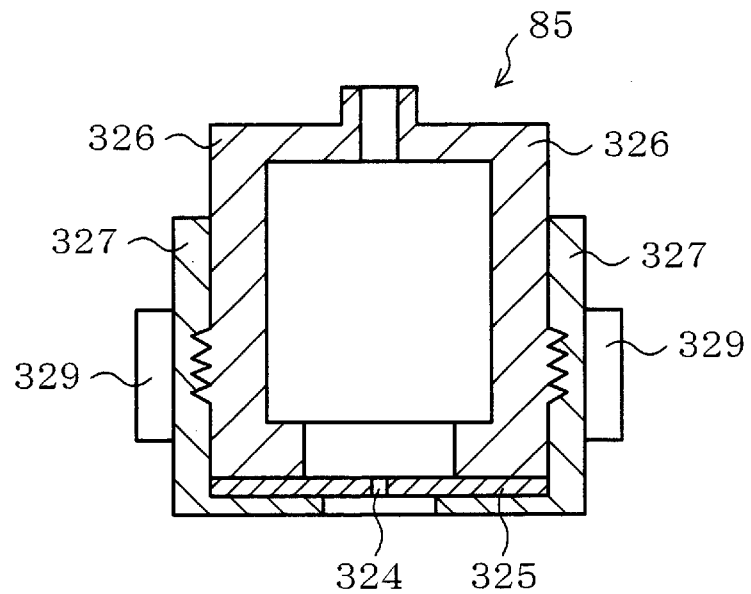
FIG. 34 is an explanatory view showing a vertical end section of the discharge nozzle used in the resist coating unit.

For example, a Peltier element 329, which makes it possible to set the temperature of the nozzle plate 325 and the resist solution to be discharged at a predetermined temperature, is attached in contact with the discharge nozzle 85 as shown in FIG. 34. Screw threads are cut on an outer side face of the inner body 326 and an inner side face of the outer body 327, and by removing the outer body 327 from the inner body 326, the nozzle plate 325 can be removed. Accordingly, when the nozzle plate 325 is contaminated, or when the nozzle plate 325 is replaced with the other ones of various materials and in various shapes, and with the discharge ports with the other diameters, it can be replaced easily and quickly.

Figure 36:
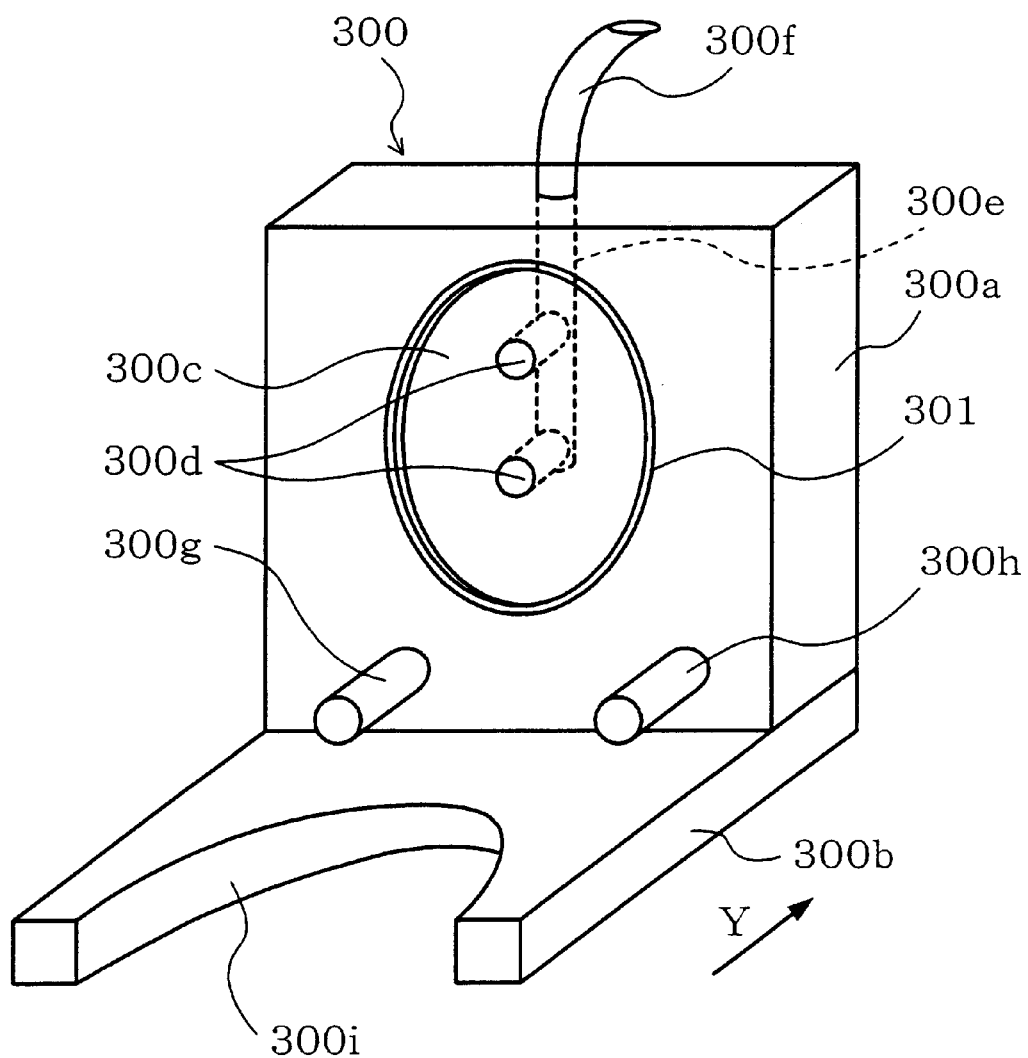
FIG. 36 is a perspective view showing a nozzle holder of the discharge nozzle.

The aforesaid nozzle holder 300 will be explained in detail with use of FIG. 36. The outer shape of the nozzle holder 300 is formed into approximately an L shape defined by a vertical part 300 and a horizontal part 300b. An outer face of the vertical part 300a is formed to be flat, and is attached to the aforesaid slider 91 in close contact therewith.

A shallow oval recessed suction portion 300c is formed in an inner face of the vertical part 300a, and a plurality of suction ports 300d are opened in a center area of the recessed suction portion 300c. A suction route 300e communicating with the suction ports 300d is vertically provided in the vertical part 300a, and a gas can be sucked by a suction device not shown through a suction pipe 300f attached on a top face of the vertical part 300a. Accordingly, part of the aforesaid nozzle 85 can be suction-held by the suction. When the discharge nozzle 85 is replaced, the discharge nozzle 85 can be easily removed by releasing the suction. An O-ring 301 is provided at a periphery portion of the recessed suction portion 300c so that gas does not enter it during the suction.

The projected portions 300g and 300h fitted in the recessed portions 327a and 327b of the outer body 327 of the aforesaid discharge nozzle 85 is formed in an inside face of the vertical part 300a to project in the horizontal direction (in the negative direction of the direction Y). By fitting the projected portions 300g and 300h into the recessed portions 327a and 327b, the discharge nozzle 85 is prevented from being displaced or falling off the nozzle holder 300 when the discharge nozzle 85 reciprocates.

Meanwhile, the horizontal part 300b of the nozzle holder 300 is formed to be flat so as to support the lower end face of the outer body 327 of the discharge nozzle 85 from below, and approximately a semicircular cutout portion 300i is opened so as not to interfere with the discharge of the resist solution from the discharge port 324 of the discharge nozzle 85.

The discharge nozzle 85 held by the nozzle holder 300 is replaced after the nozzle holder 300 moves to the replacement position S as described above. The nozzle carrier arm 330 as the carrier means for carrying the discharge nozzle 85 from the replacement position S to a nozzle box 335 serving as a nozzle waiting member described below is provided between the inner container 62 and the outer container 61 as shown in FIG. 31 and FIG. 32.

Figure 37:
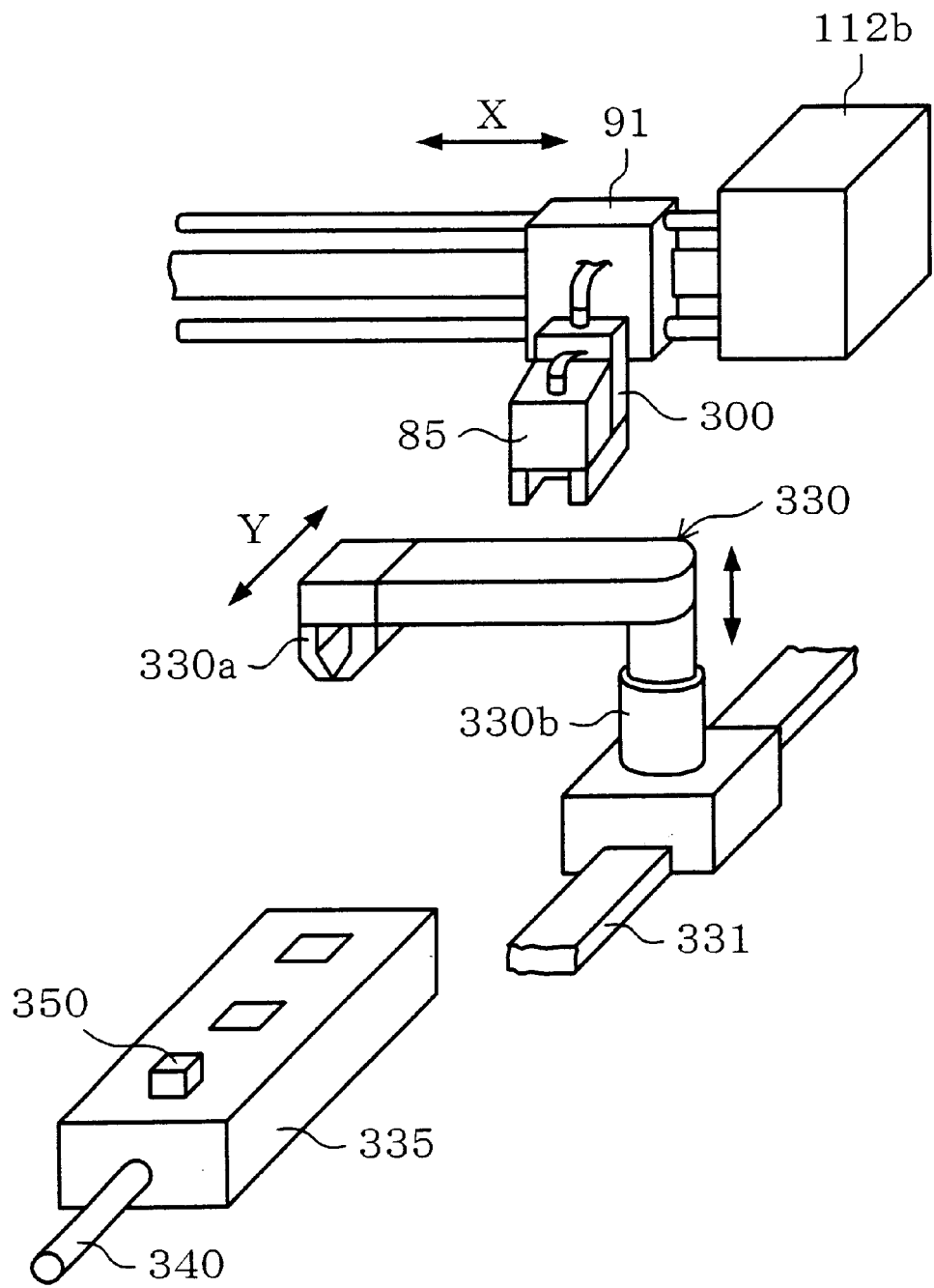
FIG. 37 is a perspective view showing the moving mechanism for the discharge nozzle, a nozzle carrier arm, and a nozzle box.

A gripping portion 330a for gripping the discharge nozzle 85 from above is provided at a tip end of the nozzle carrier arm 330 as shown in FIG. 37, which can grip the discharge nozzle 85 or release the grip of it. The nozzle carrier arm 330 has a cylinder portion 330b movable up and down. The nozzle carrier arm 330 is movable on a nozzle carrier rail 331 provided along the outer container 61 in the direction Y. Accordingly, the nozzle carrier arm 330 is movable up and down and in the direction Y, thus making it possible to receive the discharge nozzle 85 from the nozzle holder 300, carry and transfer it to the nozzle box 335. In this embodiment, since the nozzle carrier arm 330 does not have the function to move in the direction X, the replacement position S, the gripping portion 330a and a receiving portion 337 for supporting the discharge nozzle at the nozzle box 335 described later need to be disposed on the same axis Y.

However, the nozzle carrier arm 330 may have a moving mechanism which allows it to move in the direction X, and in this case, the above three do not need to be disposed on the same axis Y.

The nozzle box 335 for keeping the aforesaid discharge nozzle 85 for replacement waiting is supported on a supporting stand 336 fixed to the inner wall surface of the outer container 61 as shown in FIGS. 31 and 32, and it is provided between the outer container 61 and the inner container 62.

Figure 38:
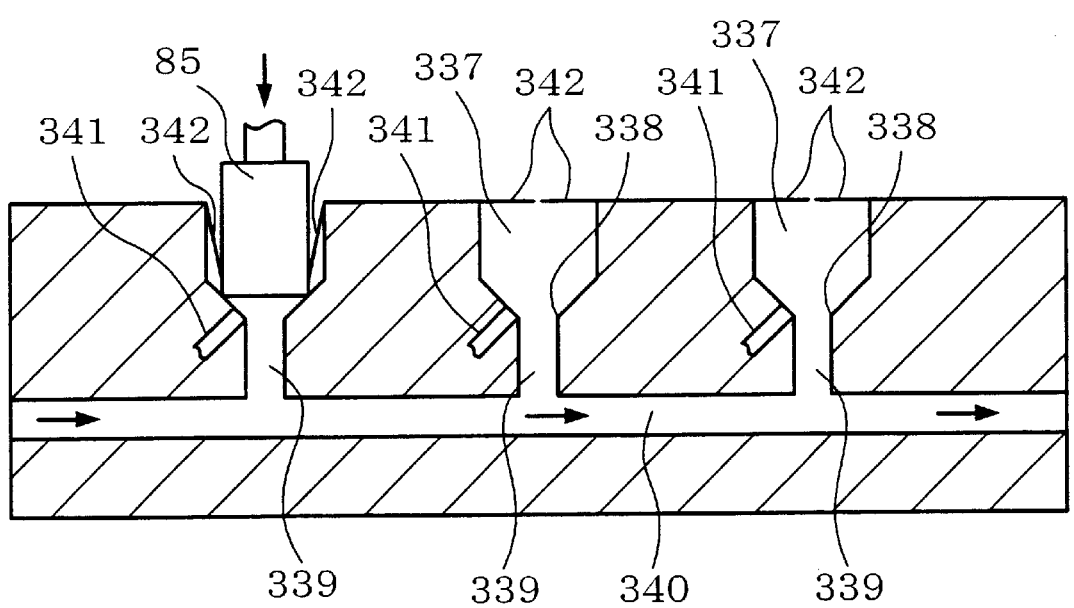
FIG. 38 is an explanatory view showing a vertical end section of the nozzle box.
Figure 39:
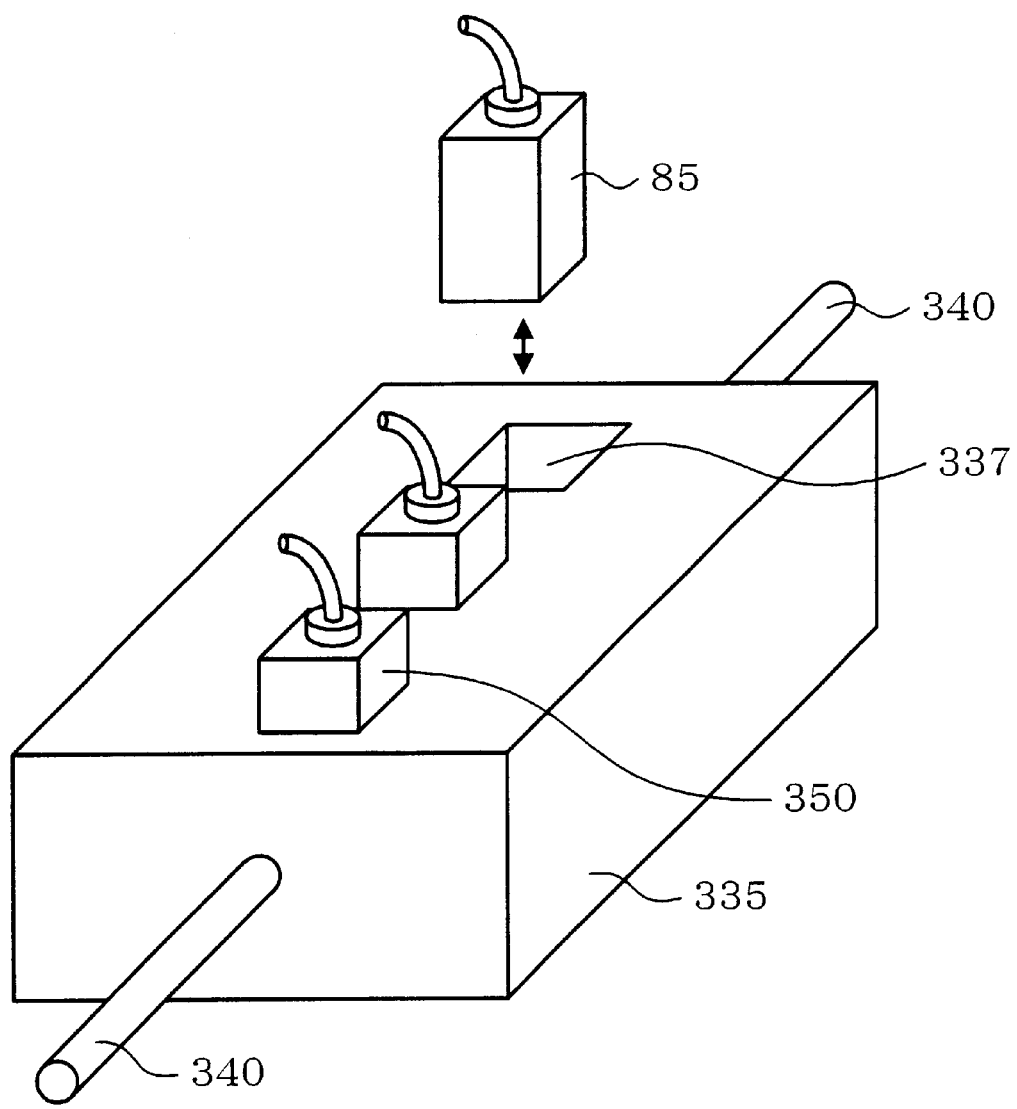
FIG. 39 is a perspective view showing an appearance of the nozzle box.

The nozzle box 335 has the receiving portions 337 for supporting the lower portions of a plurality of discharge nozzles 85 to receive them in its top face as shown in FIG. 38 and FIG. 39. The receiving portion 337 is formed into a concave shape corresponding to the outer shape of the outer body 327 so as to receive the lower portion of the discharge nozzle 85. A bottom portion of the receiving portion 337 is formed into a tapered form tapering toward the bottom. At the foremost bottom portion of the receiving portion 337, a solvent introduction port 338 for maintain the receiving portion 337 in solvent atmosphere is provided to be opened. The solvent atmosphere is supplied through a solvent atmosphere introduction passage 339 from a solvent channel 340 which is provided in a lower portion of the receiving portion 337 and in which a solvent flows. The solvent atmosphere introduction passage 339 is provided for each solvent introduction port 338 of each receiving portion 337. The discharge port 324 of the discharge nozzle 85 received in the receiving portion 337 is maintained in the solvent atmosphere, thus preventing the discharge port 324 from being dried.

Each of the receiving portions 337 is provided with a cleaning fluid supply port 341 being opened as a cleaning fluid supply portion for supplying cleaning fluid to the discharge port 334. The cleaning fluid supply port 341 can directly supply cleaning fluid to the discharge port 324 while the discharge nozzle 85 waiting and clean the discharge port 324. The cleaning fluid used for cleaning can be discharged form the aforesaid solvent channel 340.

The receiving portion 337 has a receiving portion lid body 342 or freely opening and closing the receiving portion 337, the thing which returns to the state in which the lid is closed when outer force is removed by an elastic solid such as a spring, for example. When the discharge nozzle 85 waits at the receiving portion 337, the receiving portion lid body 342 is opened, while when the discharge nozzle 85 is carried out, the receiving portion lid body 342 is closed. Accordingly, the situation in which the atmosphere of the solvent introduced into the receiving portion 337 is released into the resist coating unit 17 and has an effect on the coating processing is prevented.

The discharge nozzle 85 used in the aforesaid coating processing is replaced for a predetermined number of the wafers W processed, for each recipe, or for each predetermined time. The replacement process will be explained below.

Initially, as shown in FIG. 37, the discharge nozzle 85 which finishes the coating processing for the wafer W is moved to the replacement position S by the driving belt 92 in the state in which it is suction-held by the nozzle holder 300. At this time, the nozzle carrier arm 330 waiting at a predetermined position also moves along the nozzle carrier rail 331 to an area above the replacement position S and waits. In the nozzle holder 300, suction force from the suction pipe 300f is stopped and the suction of the discharge nozzle 85 is released. Thereafter, the nozzle carrier arm 330 is lowered by the cylinder portion 330b, and the gripping portion 330a grips the discharge nozzle 85 from above.

Subsequently, the nozzle carrier arm 330 horizontally moves in the negative direction of the direction Y. The nozzle carrier arm 330 moves along the nozzle carrier rail 331 and stops above the vacant receiving portion 337 which supports nothing in the nozzle box 335. the nozzle carrier arm 330 is lowered by the cylinder portion 330b, and puts the lower portion of the discharge nozzle 85 into the receiving portion 337 as shown in FIG. 39. At this time, the receiving portion lid body 342 provided at the receiving portion 337 shown in FIG. 38 is opened as it is pushed with the lower portion of the discharge nozzle 85. Thereafter, the gripping portion 330a quits its grip of the discharge nozzle 85 and the discharge nozzle 85 is supported by the receiving portion 337.

The nozzle carrier arm 330 grips another selected discharge nozzle 350 and ascends. Thereafter, it moves along the aforesaid route in the reverse direction, and moves in the normal direction of the direction Y to move to a point just before the replacement position S. Thereafter, it slowly fits the recessed portions 350a and 350b of the discharge nozzle 350 onto the projected portions 300g and 300h of the nozzle holder 300. At this time, just before a side face of the discharge nozzle 350 is in contact with the inside face of the vertical part 300a, for example, about 2mm to 3mm before the contact, the nozzle carrier arm 330 may be stopped once to let the gripping portion 330a of the nozzle carrier arm 330 release the grip of the discharge nozzle 350 at the same time when the suction means of the nozzle holder 300 sucks the discharge nozzle 350. This prevents the nozzle carrier arm 330 from exerting load on the moving mechanism of the slider 91, for example, the guide shafts 98a and 98b with its compressing force and causing breakage or the like when the nozzle carrier arm 330 fits the discharge nozzle 350 into the nozzle holder 300.

Thereafter, when the discharge nozzle 350 is completely suction-held by the nozzle holder 300, the nozzle carrier arm 330 moves to a predetermined position and waits for the next replacement.

Meanwhile, the discharge nozzle 85 supported in the receiving portion 337 of the nozzle box 335 is maintained in solvent atmosphere with the solvent vaporized from the solvent channel 340, so that the discharge port 324 of the discharge nozzle 85 is prevented from drying. Thereafter, cleaning fluid is supplied into the receiving portion 337 from the cleaning fluid supply port 341, and the discharge port 324 is cleaned. The cleaning fluid is discharged with the solvent from the solvent channel 340 through the solvent atmosphere introduction passage 339. The cleaned discharge nozzle 85 performs dummy dispense of the resist solution, so-called trial discharge, and waits for the next use.

According to the above embodiment, as the result that the discharge nozzle 85 is suction-held by the nozzle holder 300 having the suction means, it can be held strongly with a light mechanism, thus enabling the discharge nozzle 85 to preferably move at a high speed. Further, since attachment and detachment can be carried out easily, the nozzle can be replaced.

As the result that the projected portions 300g and 300h of the nozzle holder 300, which are projected perpendicularly to the moving direction (the direction X) of the discharge nozzle 85, are fitted into the recessed portions 327a and 327b of the discharge nozzle 85, the discharge nozzle 85 is prevented from being displaced relative to the nozzle holder 300 or falling off the nozzle holder 300 due to inertia force exerted thereon while it is moving. It goes without saying that the discharge nozzle 85 may be provided with recessed portions and the noise holder 300 may be provided with the projected portions.

Further, the aforesaid projected portions 300g and 300h are provided to be projected in the horizontal direction that is the same direction as the suction direction, and therefore the final attachment of the discharge nozzle 85 to the nozzle holder 300 can be performed by suction force of the suction means. Accordingly, when the discharge nozzle 85 is held by the nozzle holder 300, excessive mechanical load is prevented form being exerted. The aforesaid projected portion 300g and 300h are provided to project in the horizontal direction, but if they are projected perpendicularly relative to the moving direction of the discharge nozzle 85, they may be projected in the other directions such as the vertical direction and the like in accordance with the shape of the nozzle holder 300.

Meanwhile, on replacement of the discharge nozzle 85, the discharge nozzle 85 is carried to the nozzle box 335 from the nozzle holder 300, and the other discharge nozzle 350 is carried to the nozzle holder 300 from the nozzle box 335. And the nozzle carrier arm 330 is additionally provided as the delivery means. Accordingly, compared with the prior art in which the nozzle carrier means is attached to the portion corresponding to the nozzle holder 300, the nozzle holder 300 becomes lighter in weight, and high-speed movement of the discharge nozzle 85 is achieved.

The nozzle box 335 is provided with a plurality of receiving portions 337, and by the receiving portions 337 supporting a plurality of discharge nozzles, the discharge nozzle can be automatically replaced as necessary, and the coating processing of the resist solution can be performed continuously for a long period of time. The vapor of the solvent for the coating solution vaporized from the solvent channel 340 is supplied into the receiving portion 337, and the discharge nozzle inside the receiving portion 337 can be placed in the solvent atmosphere. Accordingly, the discharge port of the discharge nozzle is prevented from drying. It may be suitable to attach a temperature controlling device for making the temperature of the solvent inside the aforesaid solvent channel 340 controllable, for example, a heater to the aforesaid solvent channel 340 in the nozzle box 335. This changes the temperature of the solvent inside the solvent passage 340, which changes the vaporization amount of the aforesaid solvent as the result. Accordingly, the concentration of the solvent inside the receiving portion 137 is changed, whereby the solvent atmosphere corresponding to the kind of the coating solution can be prepared. Further, the solvent for the coating solution is supplied from the solvent channel 340 where the solvent is always flowing, but it may be suitable to provide a solvent storing portion for storing the solvent under the nozzle box 335 and supply the solvent therefrom. Further, a temperature controlling device may be provided as in the aforesaid solvent channel 340.

Further, the nozzle box 335 is provided with the cleaning fluid supply port 341 for supplying cleaning fluid to the discharge port 324 of the discharge nozzle 85, with which the discharge nozzle 85 supported in the receiving portion 337 is positively cleaned. As the result, contamination on the discharge nozzle 85 is removed completely, and preparation for the next use can be made.

The nozzle holder 300 in the above embodiment is provided with the suction means for attaching and detaching the discharge nozzle 85, but another attaching and detaching means may be suitable. Another attaching and detaching means will be explained below.

First, a so-called electromagnet may be used instead of the suction means for sucking part of the aforesaid discharge nozzle 85. By using an electromagnet, the discharge nozzle can be also attached and detached with suction force being changed by changing the voltage applied on the electromagnet.

Figure 40:
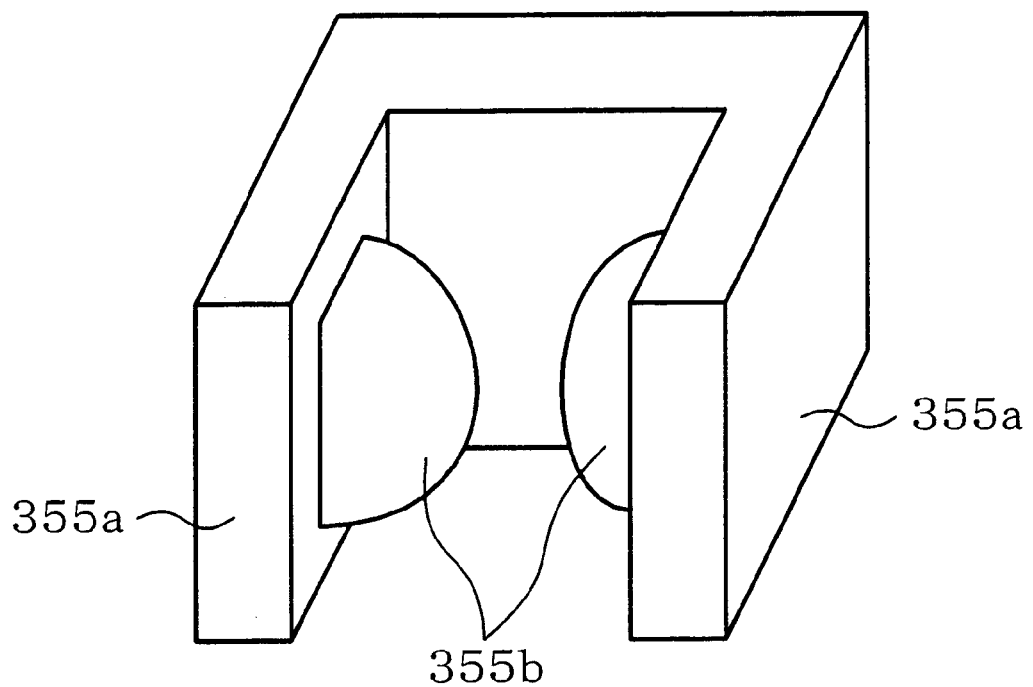
FIG. 40 is a perspective view showing another embodiment of a nozzle holder.

Next, as shown in FIG. 40, a nozzle holder 355 may be provided with gripping portions 355*a* for gripping the discharge nozzle 85 from outside, and air dampers 355*b* serving as a pressing member freely shrinking and swelling by inflow and outflow of air may be provided inside the gripping portion 355*a*. This allows air damper 355*b* to grip the discharge nozzle 85 when it is swelled and release the grip of the discharge nozzle 85 when it is shrunk. Accordingly, by changing the supply amount of air to the air damper 355*b*, the discharge nozzle 85 can be attached and detached.

Figure 41A:
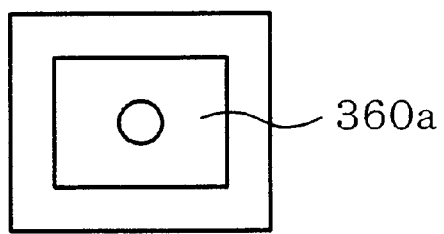
FIG. 41 is an explanatory view of the nozzle holder in another embodiment, FIG. 41 (a) is a plane view, FIG. 41 (b) a vertical sectional view, and FIG. 41 (c) a bottom view.
Figure 41B:
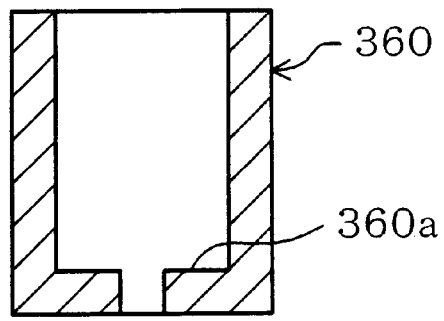
Figure 41C:
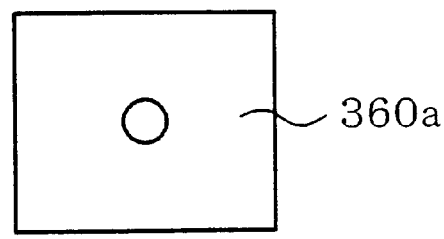

As shown in FIG. 41, a nozzle holder 360 may be formed into approximately a cylindrical shape with a top and bottom face being opened corresponding to the outer shape of the discharge nozzle 85, and the discharge nozzle 85 may be provided with a stopper 360*a* for supporting the discharge nozzle 85. By forming the nozzle holder 360 into a so-called pocket shape as described above, the four side faces of the discharge nozzle 85 are arrested by the nozzle holder 360, and thus the discharge nozzle 85 is prevented form being displaced relative to the nozzle holder 360 or falling off even if the discharge nozzle 85 moves at a high speed. When the discharge nozzle 85 is replaced, it is necessary to move the discharge nozzle 85 in an up-and-down direction to be detached and attached, thus making it necessary to provide a moving mechanism in the up-and-down direction at the aforesaid nozzle carrier arm 330.

The discharge nozzle 85 in which the discharge port 324 is formed in the nozzle plate 325 is used, but discharge nozzles in the other shapes, for example, the nozzle in which the front tip portion of the nozzle is formed into a tapered shape and the inner body 326 and the outer body 327 are integrally formed may be used.

Figure 42:
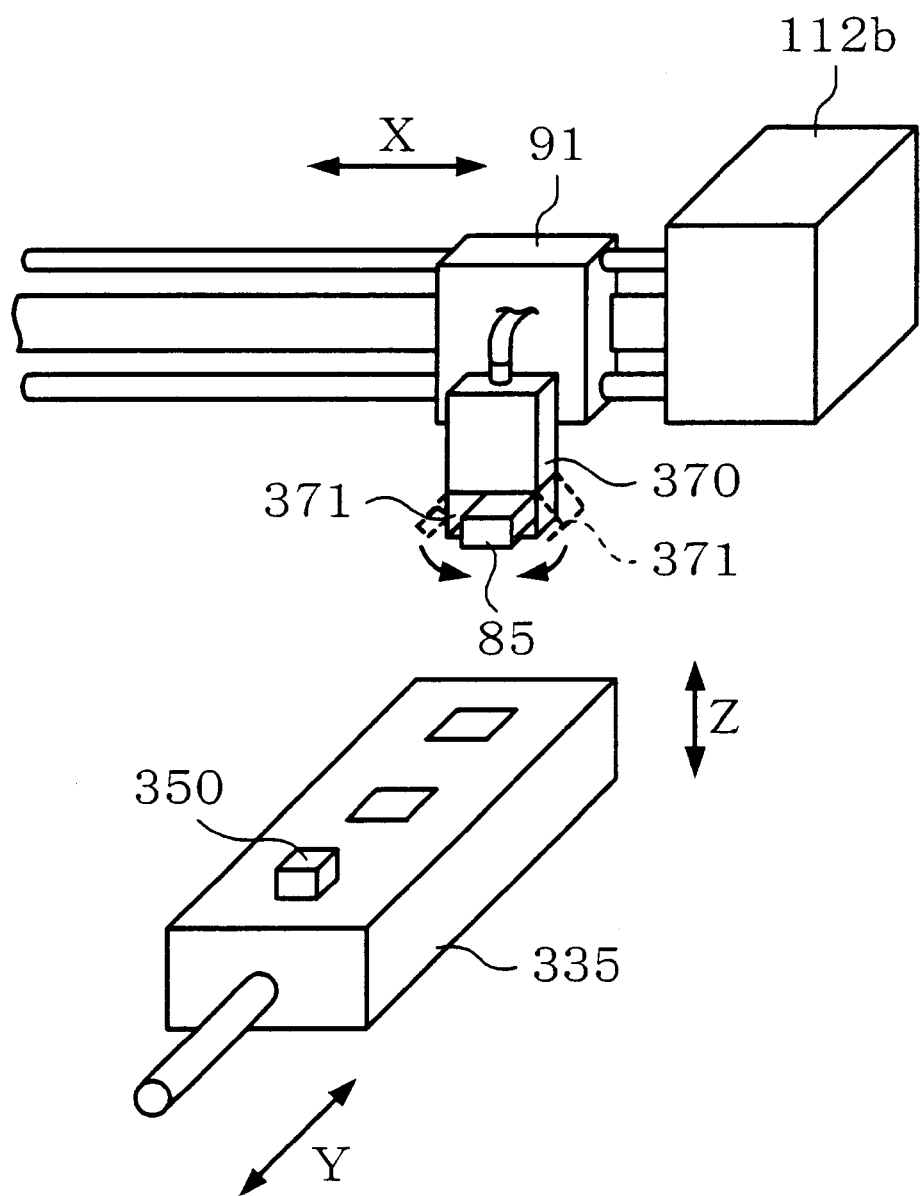
FIG. 42 is a perspective view showing the nozzle box movable to the position where the discharge nozzle can be transferred to the nozzle holder.

The example shown in FIG. 42 shows the configuration in which the nozzle box 335 is movable, for example, in the direction Y and the direction Z by a suitable drive mechanism (not shown), and the nozzle box 335 is moved relative to the nozzle holder 370 to the position at which the discharge nozzle can be transferred, thereby making the replacement of the discharge nozzle 85 possible.

In this case, it is suitable to provide a gripping member 371 capable of chucking by inflow and discharge of air at the nozzle holder 370. Thereby, the discharge nozzle 85 can be transferred more smoothly. FIG. 42 shows the situation in which the gripping member 371 grips the discharge nozzle 85. In FIG. 42, the broken lines show the state in which the gripping member is opened. Any holding mechanism of the nozzle holder shown in each of the aforesaid embodiments can be adopted without limiting to the aforesaid gripping member 371.

Further, another embodiment of the present invention will be explained.

Figure 43:
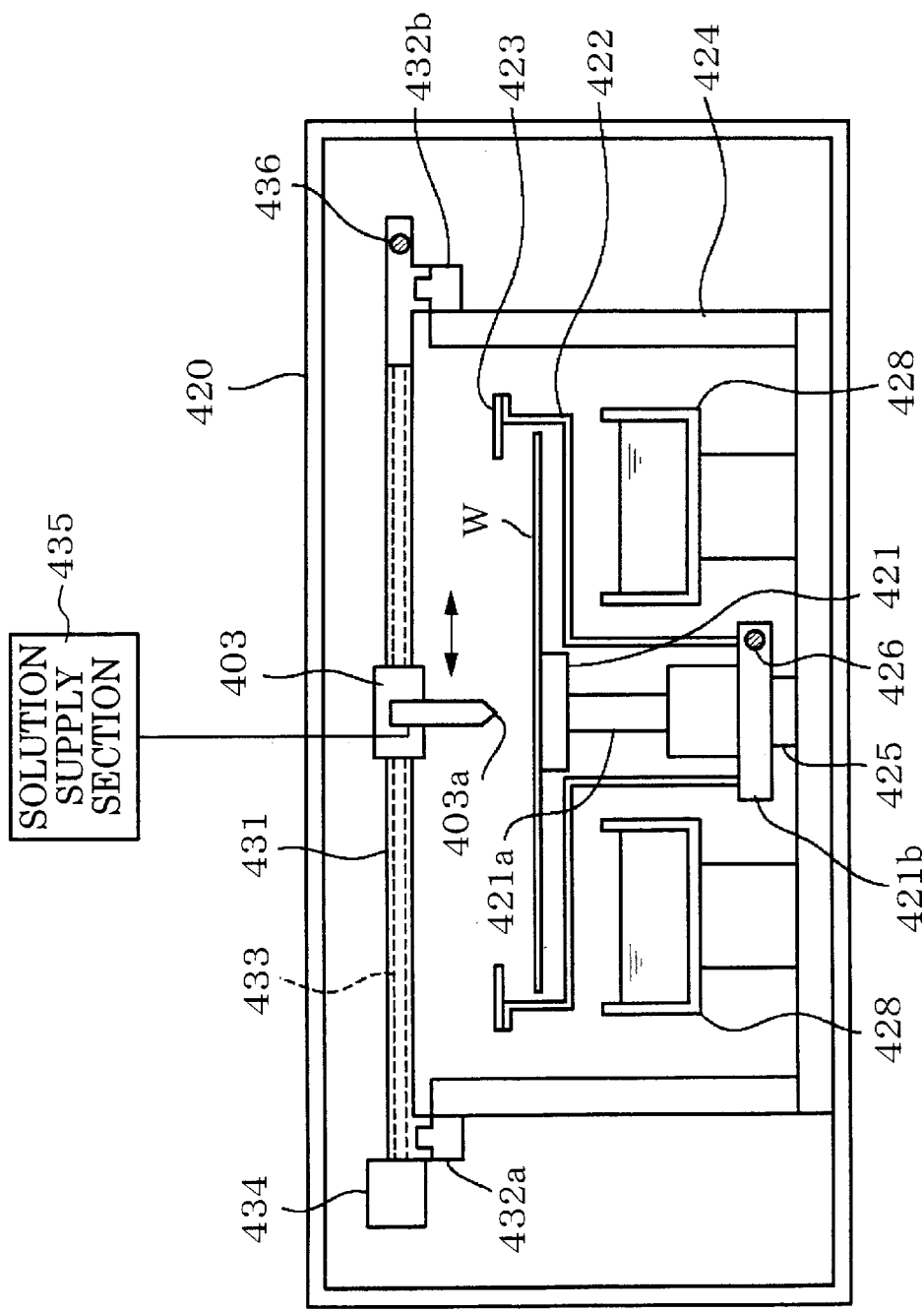
FIG. 43 is a diagrammatic block diagram showing a coating film forming unit in yet another embodiment.

The explanation will be made with reference to schematic explanatory views shown in FIG. 43 and FIG. 44. The wafer W as a substrate is horizontally held by a substrate holding portion 421 composed of, for example, a vacuum chuck vertically movable by a hoisting and lowering portion 421*a* which is provided on a mobile body 421*b* moving by being guided by a rail 425 defining a guide portion extending in the direction Y.

This mobile body 421*b* is provided with a pair of mask supporting members 422 extended to both sides of the substrate holding portion 421, for example, and erected up to a little higher lever than the surface of the wafer W. A mask member 423 is provided on the mask supporting members 422. The mask member 423 is in the form with only a portion corresponding to the coating film forming area of the wafer W being opened so as to prevent the resist solution supplied from above the mask member 423 from attaching to the area other than the coating film forming area of the wafer W. The mask member 423 is designed to be able to be removed from the cup 422 so as to be cleaned, for example, in a cleaning unit not shown provided outside this unit.

The aforesaid mobile body 421*b* is rotated by a motor 427 provided outside a box-shaped body 424, and screwed into a ball screw 426 extending in the direction Y to be movable in the direction Y by the rotational force of the ball screw 426. "A Y-direction driving section for a substrate holding portion for intermittently moving the substrate holding portion in the direction Y" in the claim corresponds to the rail 425, the ball screw 426, the motor 427 and the like.

A set of solution baths 428 are provided on the base face of the box-shaped body 424 so as to sandwich the moving area of, for example, the aforesaid substrate holding portion 421 and the like, and a solvent, for example, a thinner solution is stored. The solvent is to prevent volatilization of the coating solution to be supplied onto the wafer W top surface. The temperature, the concentration, and the like of the solvent inside the solution baths 428 are controlled so that the peripheral area of the wafer W has the atmosphere of suitable solvent vapor. In this example, the unit body such as the box-shaped body 424 is enclosed with a case body 420 so as to form the atmosphere of the solvent vapor and divide it from outside.

Figure 44:
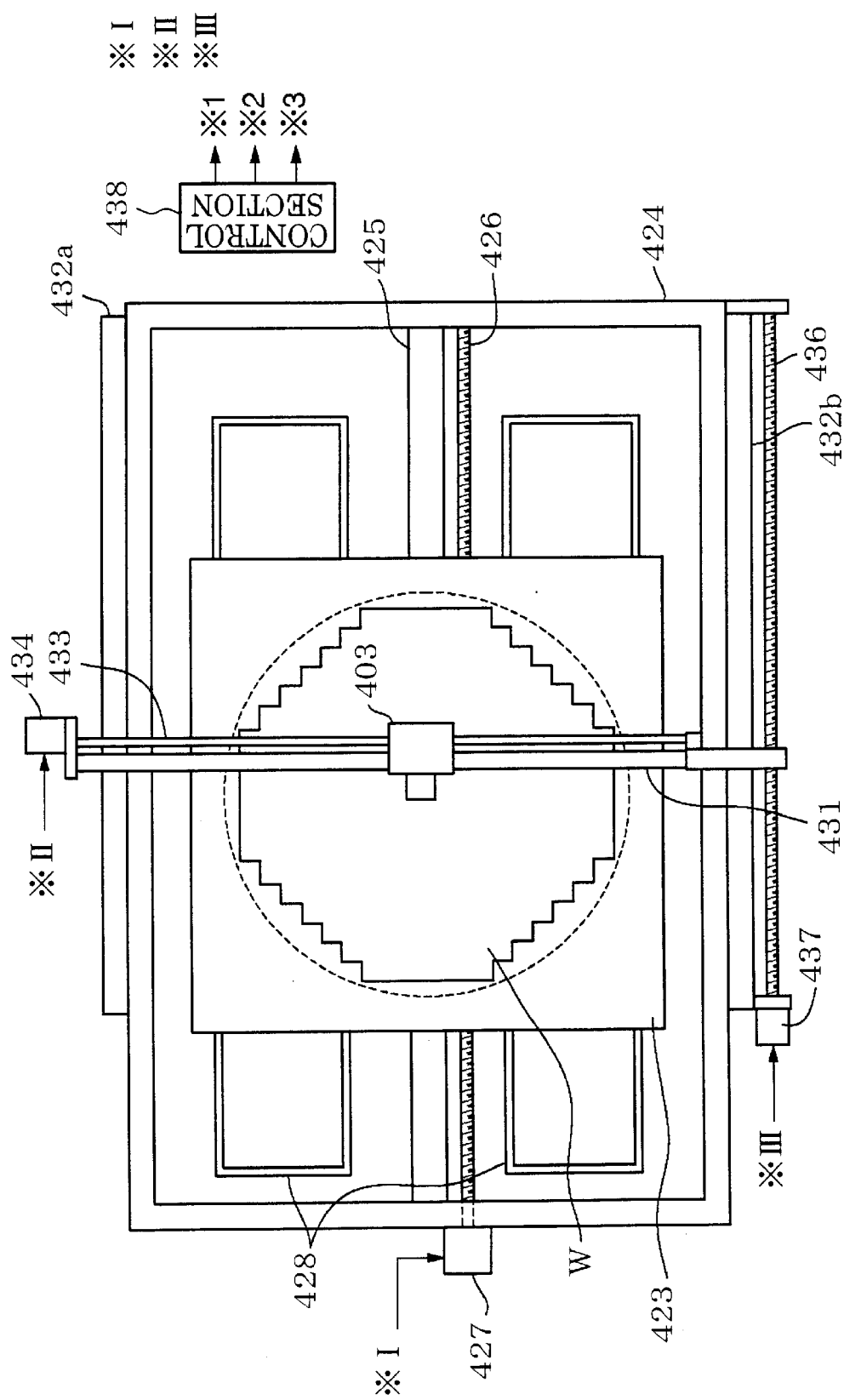
FIG. 44 is a plane view of the coating film forming unit shown in FIG. 43.

Openings not shown are formed in a side face, for example, at the left side in FIG. 44 in the aforesaid box-shaped body 424 and in a side face of the case body 420 adjacent to the side face of the box-shaped body 424 so that the wafer W can be carried in and out. For example, the wafer W is carried in and out by inserting a carrier arm not shown between the mask supporting member 422 and the underside face of the wafer W via the openings in the case body 420 and the box-shaped body 424, and by transferring the wafer W between the carrier arm and the substrate holding portion 421 by the vertical movement of the carrier arm and/or the substrate holding portion 421.

Next, the explanation of the peripheral area of a discharge nozzle 403 moving above the substrate holding portion 421 and supplying the coating solution onto the wafer W top face will be made. The discharge nozzle 403 is designed to be supported by a guide member 431 so that a discharge port 403*a* faces the wafer W and is movable in the direction X. The guide member 431 is provided near upper ends of side walls of the box-shaped body 424 facing to each other, and is structured to be movable in the direction Y with left and right ends thereof being guided by a rail 432*a* and a rail 432*b* extending in the direction Y.

The discharge nozzle 403 is screwed in a ball screw 433 provided in parallel with the guide member 431, and the ball screw 433 is rotated in the normal and reverse direction by a motor 434 provided at one end of the ball screw 433, whereby the discharge nozzle 403 is guided by the guide member 431 and reciprocates in the direction X.

Meanwhile, the discharge nozzle 403 is connected to a solution supply section 435, and a coating solution with the solution temperature, concentration and the like being adjusted, for example, the resist solution is supplied thereto from the solution supply section 435 via a flow adjusting valve not shown, whereby the resist solution is discharged from the discharge port 403*a* facing the wafer W.

Further, a ball screw 436 provided in parallel with, for example, the rail 432*b* and driven by a motor 437 is screwed in one end side of the guide member 431, and the guide member 431 is guided by the rails 432*a* and 432*b* and moved in the direction Y integrally with the discharge nozzle 403 and the ball screw 433 by rotating the ball screw 436. Besides this motor 437, the motor 434, the motor 427 and the aforesaid hoisting and lowering portion 421 *a* are connected to a control section 438, which controls, for example, each operation. The guide member 431, the ball screw 433, the motor 434 and the like correspond to "an X-direction drive section for reciprocate the discharge nozzle in the direction X", and the rails 432*a* and 432*b*, the ball screw 436, the motor 437 and the like correspond to "a Y-direction drive section for the discharge nozzle for intermittently moving the discharge nozzle in the direction Y".

Next, the operation in the aforesaid embodiment will be explained. First, the substrate holding portion 421 is located at the left end side of the box-shaped body 424 in FIG. 44, and the wafer W is delivered onto the substrate holding portion 421 by the carrier arm not shown via each opening (not shown) of the case body 420 and the box-shaped body 424. The delivery is performed by the vertical movement of at least one of the substrate holding portion 421 and the aforesaid carrier arm. The substrate holding portion 421 and/or the guide member 431 are/is moved in the direction Y so that the area in which the discharge nozzle 403 moves in the direction X is positioned at one end of the wafer W. At this time, the discharge nozzle 403 is kept waiting at one end side of the guide member 431.

While the wafer W is stopped, the discharge nozzle 403 is scan-moved from the one end side to the other end side (forward route), and until the discharge nozzle 403 turning at the other end side reaches a position above the coating film forming area on the return route, specifically while the discharge nozzle 403 moves above the mask member 423, the substrate holding portion 421 and the guide member 431 are moved a very small distance, for example, 0.5 mm respectively in the directions opposite to each other in the Y direction at the same time. Thus, the resist solution film is formed on the entire range of a coating film forming area W1 on the wafer W top surface. Thereafter, the substrate holding portion 421 is returned to the position at which the wafer was carried in, whereby the wafer W is carried out.

Figure 45:
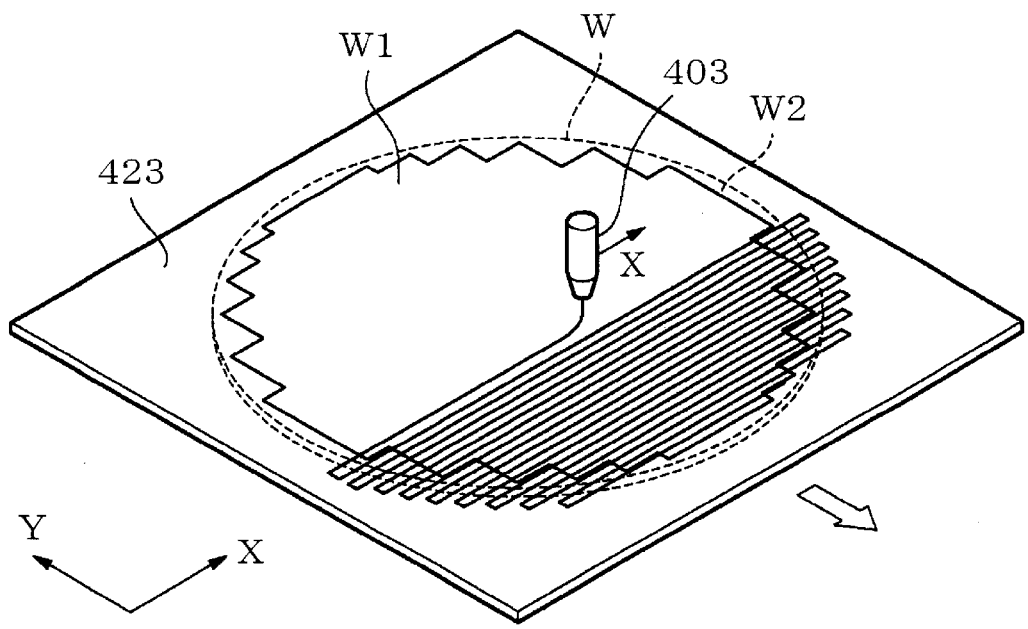
FIG. 45 is a perspective view showing a manner in which a coating solution is supplied when a mask member covering the peripheral portion of a wafer is used.

According to the present embodiment, since the resist solution is applied onto the wafer W with the discharge nozzle 403 in the manner of a so-called continuous stroke as shown in FIG. 45, yield of the resist solution can be dramatically enhanced compared with the spin coating method, and since turbulent flow of air due to the rotation of the wafer W does not occur, the effect such as higher uniformity in the film thickness is produced. Since the mask member 441 prevents the periphery portion of the wafer W from being coated with the resist solution, the resist film can be prevented from falling off the wafer W periphery portion, and since the back surface side of the wafer W is not contaminated, there is no fear of contamination of the carrier arm and the like.

Since the scan area is moved by the wafer W and the discharge nozzle 403 being moved in the directions opposite to each other in the direction Y at the same time, the movements take half the time compared with the situation in which only one of them is moved in the direction Y in theory. In coating in the manner of continuous stroke, a large number of scans are performed, and therefore this method is effective in increasing throughput.

Figure 46:
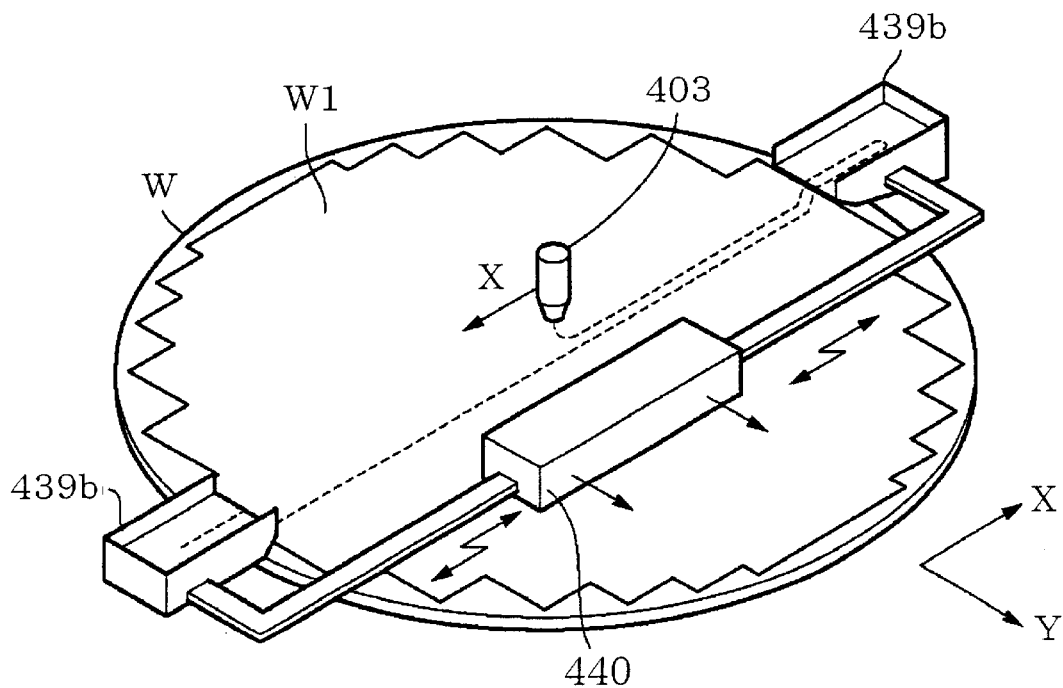
FIG. 46 is a perspective view showing another example of the mask member.

As shown in FIG. 46, instead of the mask members 423 for covering the entire periphery portion of the wafer W, a set of mask members 439*a* and 439*b* for covering only the periphery area of the wafer W corresponding to the scan area of the discharge nozzle 403, may be provided at both ends of the area in which the discharge nozzle moves in the direction X so that they are movable integrally with the discharge nozzle 403 in the direction Y, and the space between the mask members 439*a* and 439*b* are changed by a drive mechanism 440 according to the width of the coating film forming area W1 of the wafer W.

Figure 47:
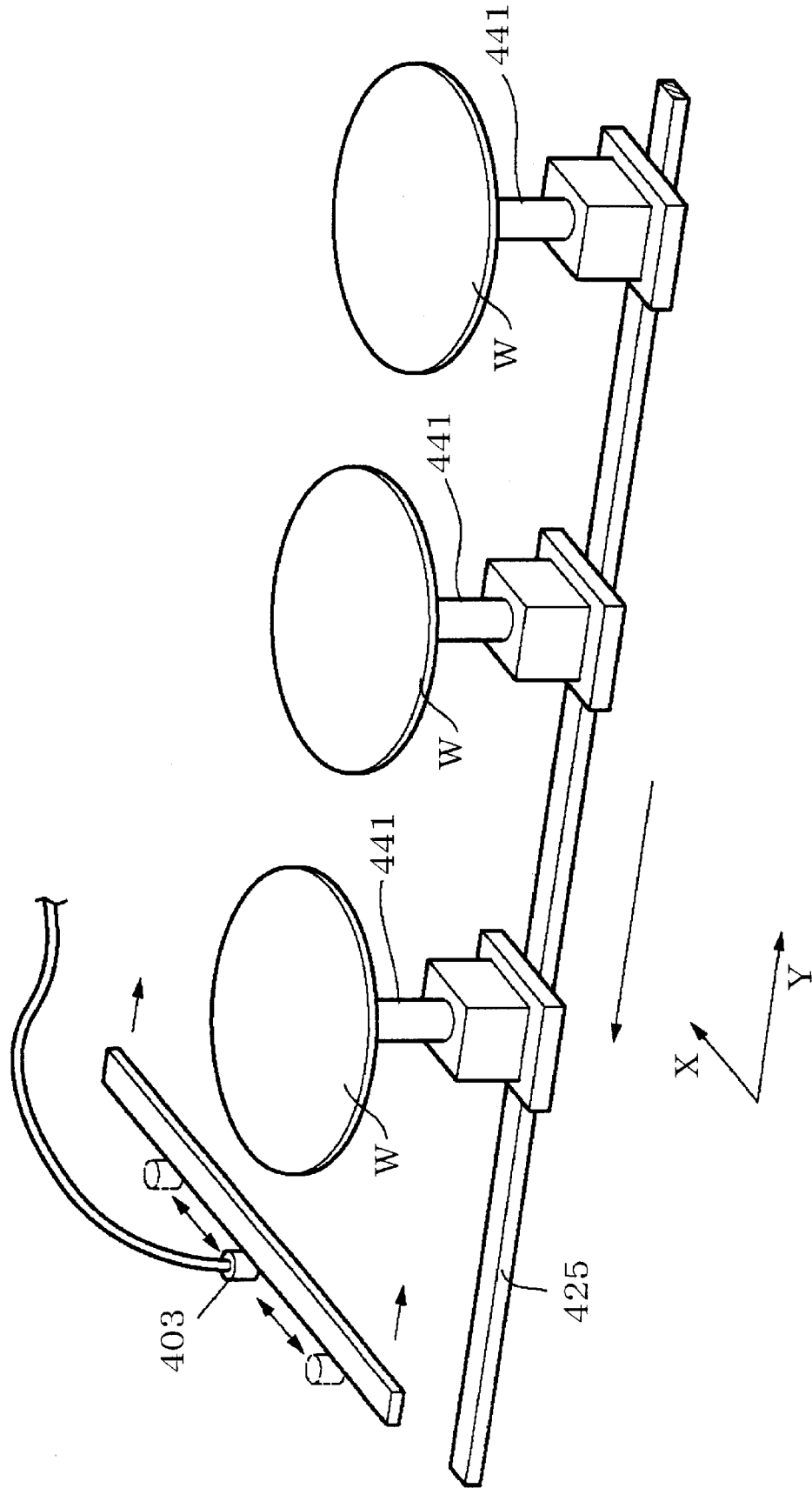
FIG. 47 is a diagrammatic perspective view showing a manner in which a coating solution is supplied in yet another embodiment.

FIG. 47 is another embodiment, and in this example, if the right side of the discharge nozzle 403 in FIG. 47 is called the front side, a plurality of the wafers W are placed on, for example, three substrate holding portion 441 in order by a carrier arm not shown in the area at the front side, and the substrate holding portion 441 is intermittently moved to the back side and the guide member 431 of the discharge nozzle 403 is intermittently moved to the front side, whereby the resist solution is applied onto the wafer W as in the aforesaid embodiment. The wafer W with the coating being finished is carried out in order in the back side area, and when the coating of the final wafer W is finished, each substrate holding portion 441 is returned to the original position, or in this time, the wafer W is placed on the substrate holding portion 441 in the area where the wafer is carried out, whereby the same processing is performed.

According to the above embodiment, a plurality of substrate holding portions are provided on the same rail 425, and each substrate holding portion and the discharge nozzle 403 are respectively moved in the opposite directions, whereby the coating of the resist solution is performed, thus making it possible to perform coating processing and carry-in-and-out of the wafer W in parallel, which increases throughput in addition to the same effects as in the aforesaid embodiment.

Still another embodiment will be explained. The present embodiment has the configuration in which two substrate holding portions 451*a* and 451*b* are provided so as to be guided along the rail 425 extending in the direction Y as shown in a schematic view in FIG. 48 and above them, provided are discharge nozzles 452*a* and 452*b* corresponding to the substrate holding portions 451*a* and 451*b*, a set of guide means 453*a* and 453*b* for guiding the aforesaid discharge nozzles 452*a* and 452*b* so that they can move in the direction X, and supporters 454 and 455 for supporting the guide means 453*a* and 453*b* at both ends.

In this example, the guide means 453*a* and 453*b* may be designed to be driven in the direction Y by being guided along the supporters 454 and 455, so that the discharge nozzles 452*a* and 452*b* and the substrate holding portions 451*a* and 451*b* may be moved in the opposite directions in the direction Y as in the embodiment explained earlier.

Figure 48:
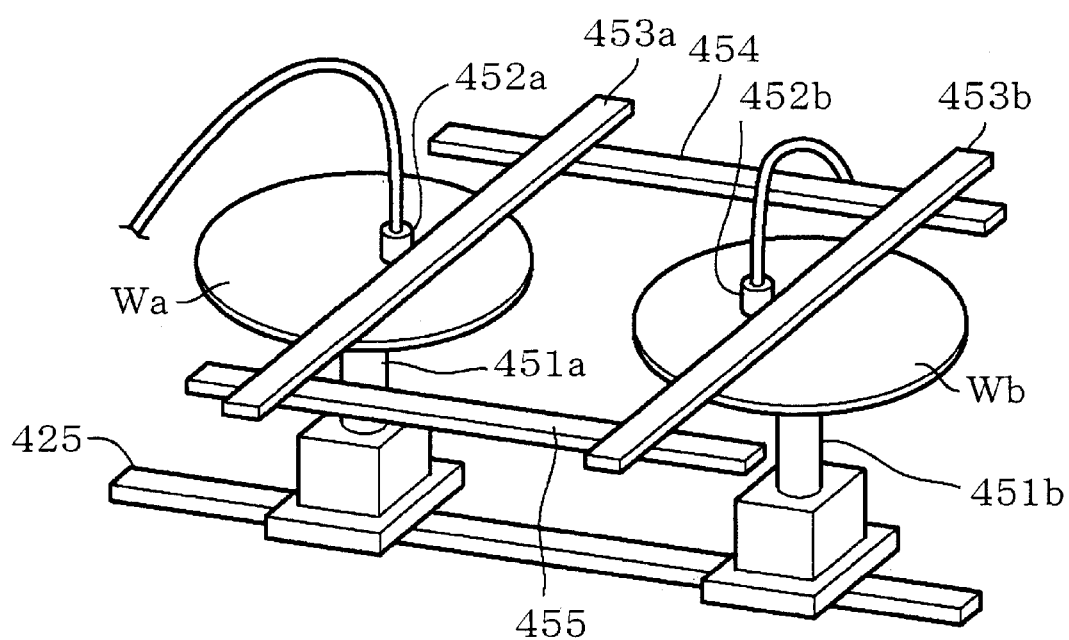
FIG. 48 is a diagrammatic perspective view showing a coating film forming unit according to yet another embodiment.
Figure 49:
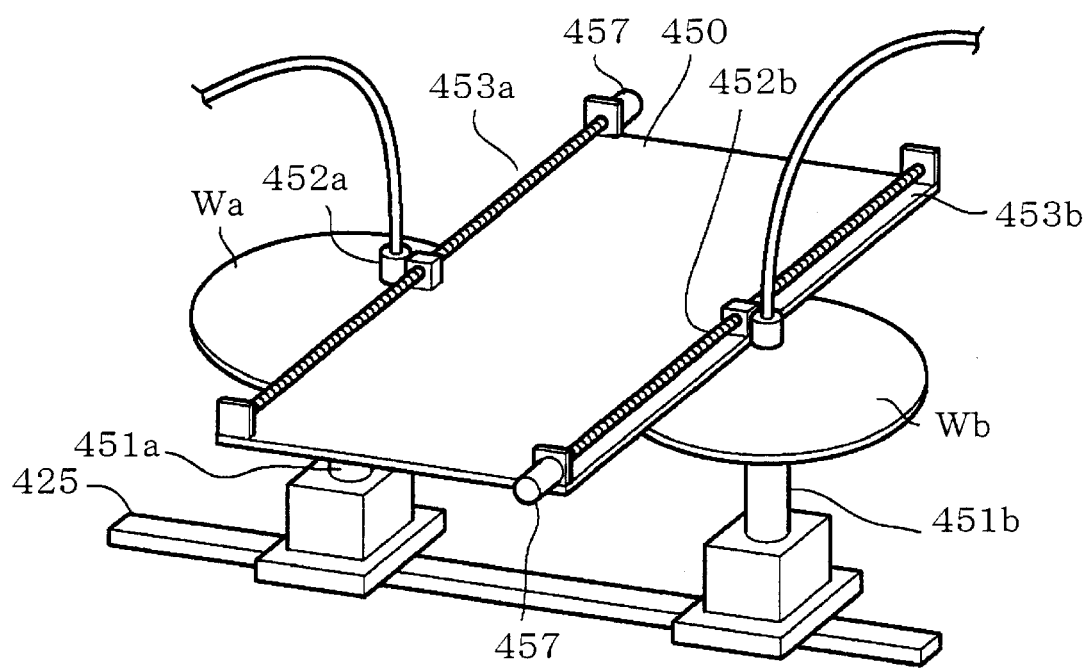
FIG. 49 is a diagrammatic perspective view showing another example of the coating film forming unit according to yet another embodiment.

The discharge nozzles 452*a* and 452*b* may be designed to be movable along a pair of sides, which oppose to the direction Y, of a base 450 formed into a rectangular shape as shown in FIG. 49. FIG. 49 shows a ball screw 456 and a motor 457 for driving the discharge nozzles 452*a* and 452*b* in the direction X. Here, the operations of the device shown in FIG. 48 and FIG. 49 are the same, the operation and the effects will be explained with FIG. 49 as a representative example.

First, as for the position of the base 450 at the time of start of coating process, assuming that the direction in which the base 450 moves is forward in the direction Y, the base 450 is positioned so that the area in which the discharge nozzles 452a and 452b reciprocate in the direction X (scan area) is located at the front ends of wafers Wa and Wb held by, for example, the substrate holding portions 451a and 451b.

Figure 50:
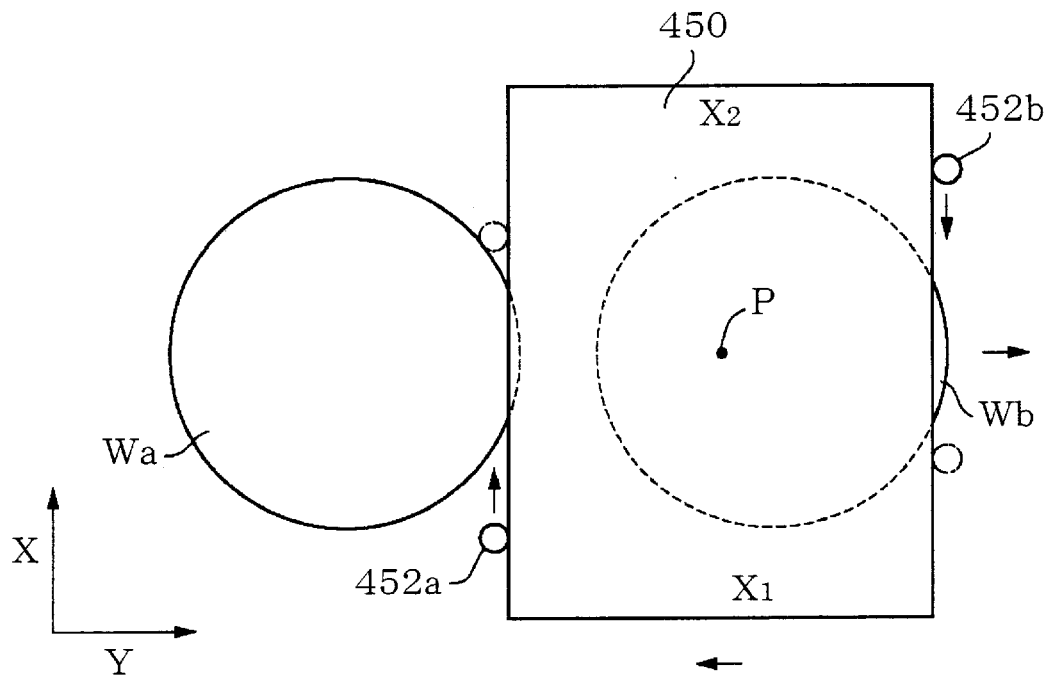
FIG. 50 is an explanatory view describing the operation in embodiments.

Subsequently, the discharge nozzles 452a and 452b start coating of the resist solution from the positions opposite to each other in the direction X as shown in FIG. 50. As for the movement in the direction X, in order that the respective discharge nozzles move symmetrically, the nozzles 452a and 452b are synchronized in all the periods of the acceleration period in which, for example the discharge nozzles 452a and 452b start moving from one ends of the respective moving area and their speeds reach a predetermined speed, the even speed period in which they maintain the predetermined speed, and the deceleration period in which they stop in the vicinity of the other end side and turn. Specifically, the discharge nozzles 452a and 452b are always located so as to be symmetric with respect to a center P of the base 450.

Accordingly, for example, when the discharge nozzle 452a starts moving from one end X1 side of the base 450 shown in FIG. 50 and reaches a the other end X2 side in its moving area, the discharge nozzle 452b reaches the end X1 side of the base 450 in its moving area at the same time.

When the discharge nozzles 452a and 452b turn at the respective moving area end portions, the wafer Wa and the wafer Wb intermittently move forward in the direction Y, whereby the coating is similarly performed by the discharge nozzles 452a and 452b, and the above operation is repeated, thereby making it possible to supply the resist solution over the entire top surfaces of the wafer Wa and the wafer Wb in the manner of so-called continuous stroke. In this case, the base 450 may be moved rearward in the direction Y simultaneously with the wafers Wa and Wb.

As described above, since two discharge nozzles 452a and 452b are provided at the common base 450 in the present embodiment, the resist solution can be applied to, for example, two wafers at the same time. Both the discharge nozzles 452a and 452b are reciprocated in the direction X so as to be symmetric with respect to the center point P of the base 450 shown in FIG. 50, whereby impact occurring at the time of acceleration and deceleration of the respective discharge nozzles are compensated through the base 450, and the discharge nozzles 452a and 452b work as counterbalance for each other to make it possible to reduce vibrations.

Figure 51:
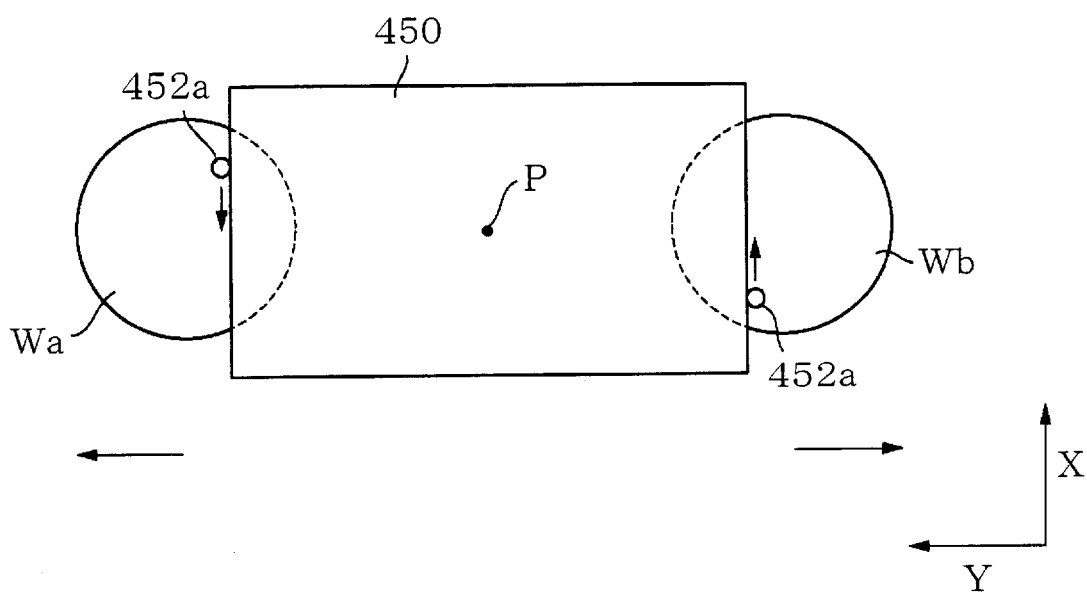
FIG. 51 is an explanatory view describing the operation in embodiments.

The resist solution in the aforesaid embodiment may be applied in the manner as described below. Specifically, as shown in FIG. 51, the base 450 with the length in the direction Y being longer than the total diameters of two wafers is prepared. The discharge nozzles 452a and 452b are moved in the direction X symmetrically with respect to the center point P of the base 450, and the wafer Wa and the wafer Wb are moved intermittently toward the center point P from the outside of the base 450. In this manner, the resist solution coating can be performed for two wafers in the manner of continuous stroke at the same time while the impact caused by the respective discharge nozzles is controlled as in the above example.

Figure 53:
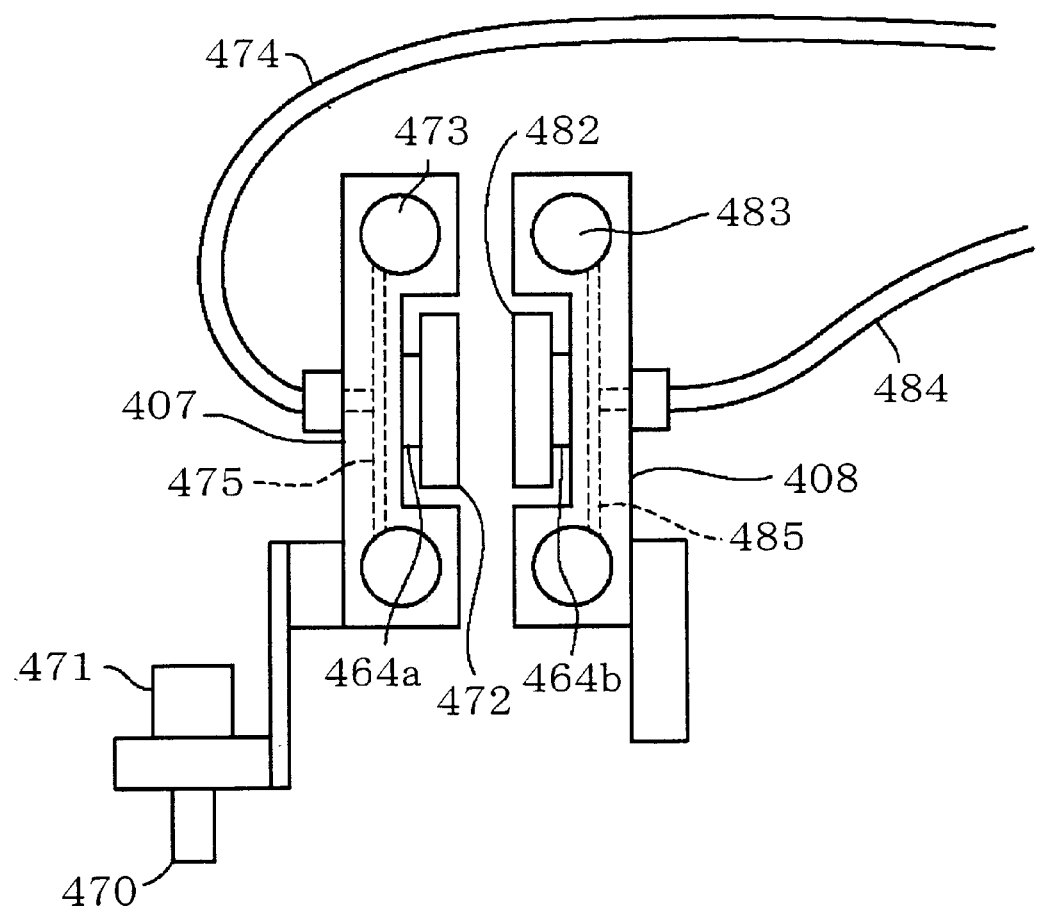
FIG. 53 is a vertical cross sectional view showing a nozzle supporting body and a balancer according to the embodiment shown in FIG. 52.
Figure 54:
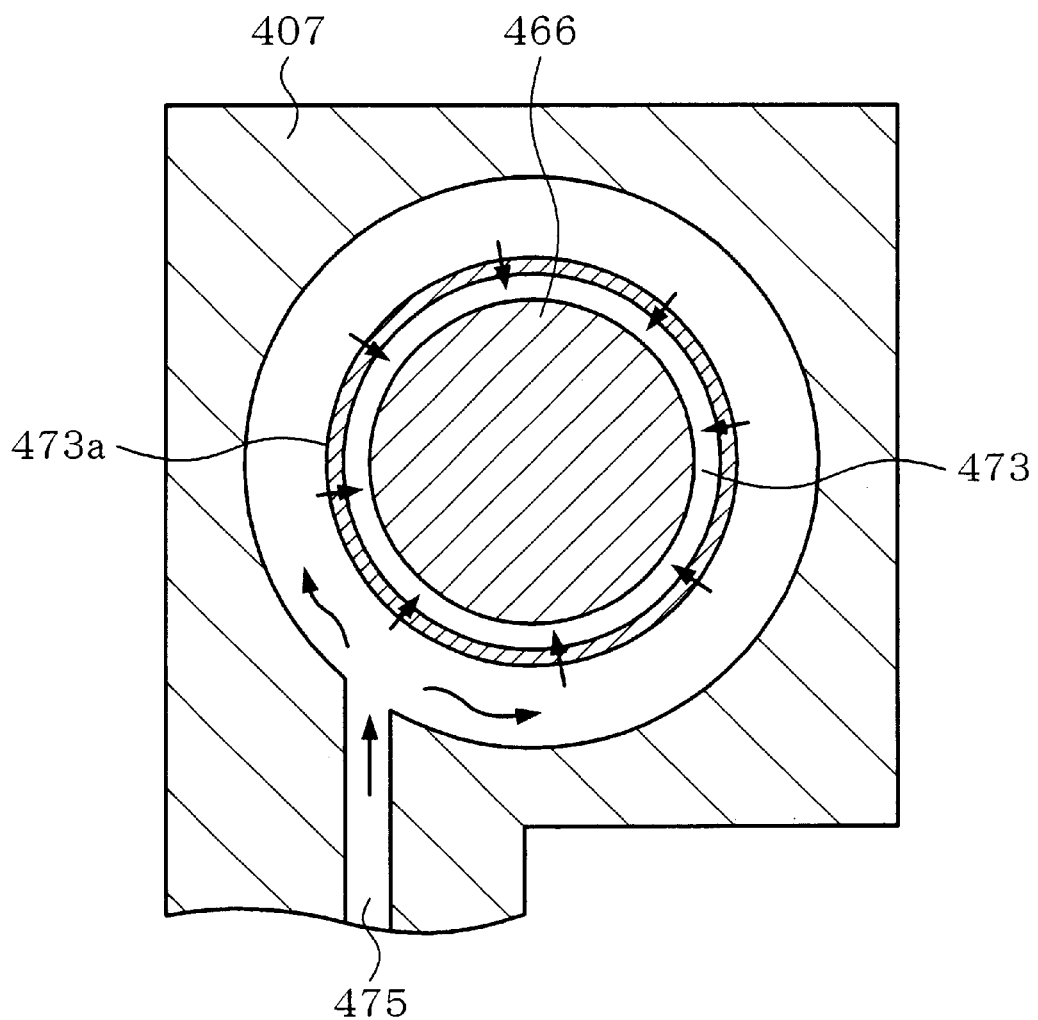
FIG. 54 is a fragmentary enlarged view for describing the nozzle supporting body shown in FIG. 53.

Next, another embodiment will be explained with reference to FIG. 52, FIG. 53 and FIG. 54. The present embodiment has the feature in an X-direction drive section for moving the discharge nozzle in the direction X, which is usable in place of the guide member 431, for example, in the embodiments explained earlier, and therefore only the corresponding part will be explained.

Figure 52:
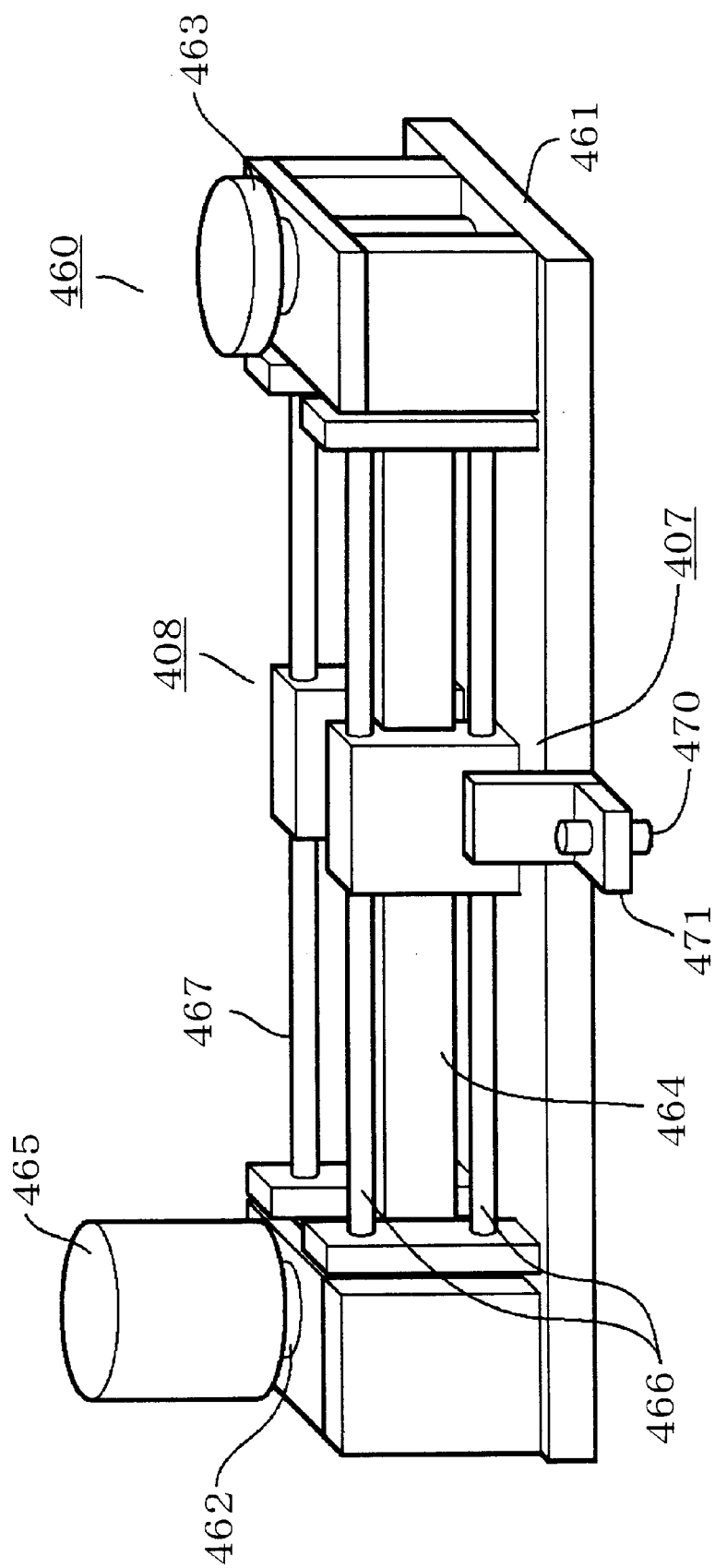
FIG. 52 is a diagrammatic perspective view showing an X-direction drive section according to yet other embodiment.

FIG. 52 is a schematic perspective view showing an X-direction driving section 460 in the present embodiment. At both ends on a rectangular base 461 extending in the direction X, a driving pulley 462 is provided on one end while an idler pulley 463 is provided on the other end, and an endless belt 464 is wound around each pulley 462 and 463. A motor 465 is provided on the top of the driving pulley 462, and when it rotates the driving pulley 462, the belt 464 is rotated following the normal and reverse rotation of the driving pulley 462.

Giving the reference numerals 463a and 464b to a pair of parallel belt portions of the endless belt 464 wound around both the pulleys 462 and 463 respectively, a nozzle supporter 407 is provided at the belt portion 464a at one side while a balancer 408 being a mobile body for absorbing shock is provided at the belt portion 464b at the other side, and they move symmetrically in the opposite directions to each other in the direction X following the rotation of the belt 464. A pair of vertically parallel guide shafts 466 and 467 extending in the direction X respectively are provided between the driving pulley 462 and the idler pulley 463 so as to guide the nozzle supporter 407 and the balancer 408 in the direction X. The nozzle supporter 407 is provided a discharge nozzle 471 having a discharge port 470. The weight of the aforesaid balancer 408 is set to be equal to the total weight of, for example the nozzle supporter 407 and the discharge nozzle 471.

The mechanism in which the guide shafts 466 and 467 guide the nozzle supporter 407 and the balancer 408 will be explained hereinafter. FIG. 53 is a sectional view of the nozzle supporter 407 and the balancer 408. As shown in FIG. 53, the nozzle supporter 407 and the balancer 408 are fixed to the belt 464 so as to sandwich the belt 464 by means of fixing members 472 and 482. Through-holes 473 and 483 through which the aforesaid guide shafts 466 and 467 penetrate are formed in the nozzle supporter 407 and the balancer 408. As shown in FIG. 54, the outer surfaces of the through-holes 473 and 483 are formed by a porous member, for example, a cylindrical body 473a having a number of pores being provided so that air can flow in and out. A ventilation chamber 473b is formed outside the cylindrical body 473a, and the ventilation chamber 473b is connected to an air supply pipe 476 via a channel 475 formed inside the nozzle supporter 407 (the balancer 408). The air supply pipe 476 is supplied with pressurized air from an air supply source not shown, and the pressurized air is blown into a gap between the guide shaft 466 (467) and the cylindrical body 473a via the channels 475 and 485 and the cylindrical body 473a. Incidentally, in FIG. 53, the portion including the guide shafts 466 and 467 and the through-holes 473 and 483 is simplified as a circle. Accordingly, the nozzle supporter 407 and the balancer 408 are guided by the guide shaft 466 with pressurized air between them, whereby mechanical friction does not occur even if they are moved at a high speed, thus producing the effect of reducing wear of components. Pressure exerted on the pressurized air used here is, for example, 2 Kg/cm$^2$ or more.

Figure 55:
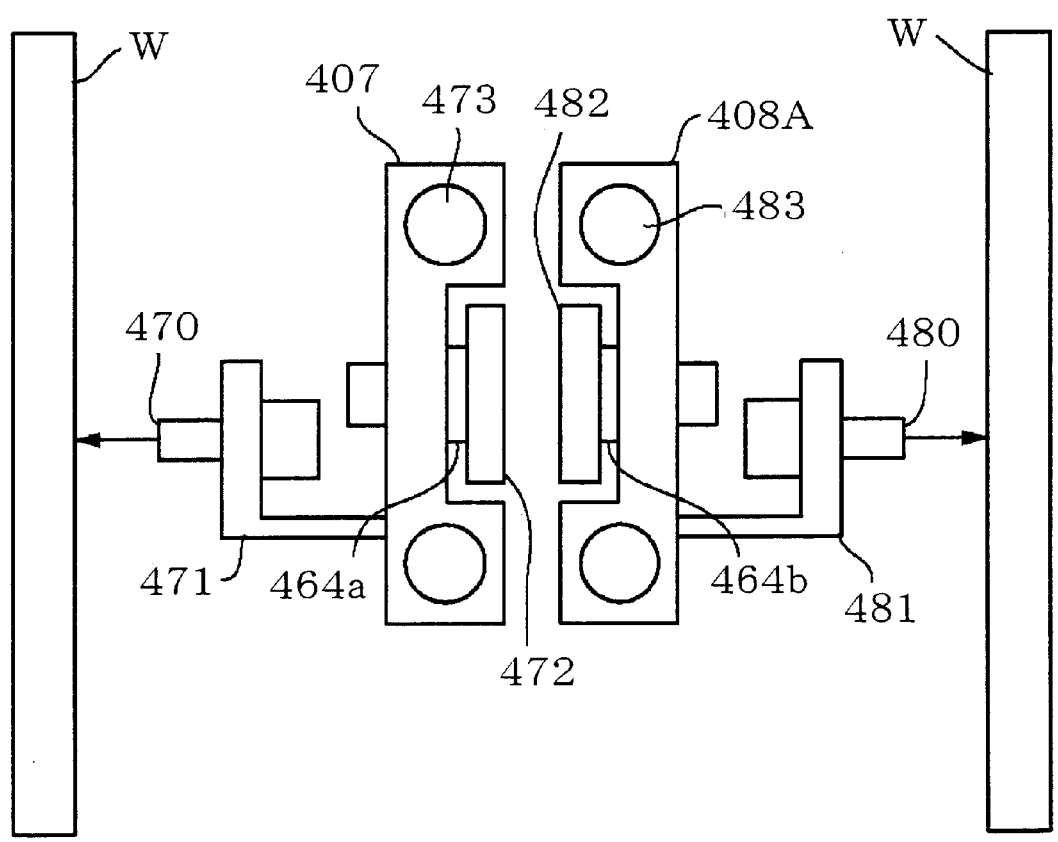
FIG. 55 is a diagrammatic vertical sectional view showing another example of the X-direction drive section according to the embodiment shown in FIG. 52.

In the present embodiment, instead of the balancer 408, a nozzle supporter 408A in the same shape as the nozzle supporter 407 may be provided, and the discharge nozzle 471 may be attached thereto. And the discharge nozzle 471 may be structured to face horizontally, and coating may be performed for the wafer W held vertically. In this case, for example, as shown in FIG. 55, the configuration in which the resist solution is applied to two wafers W facing each other with the X-direction drive section 460 between them by the discharge nozzles 471 and 481 provided at the nozzle supporters 407 and 408A can be cited.

Figure 56:
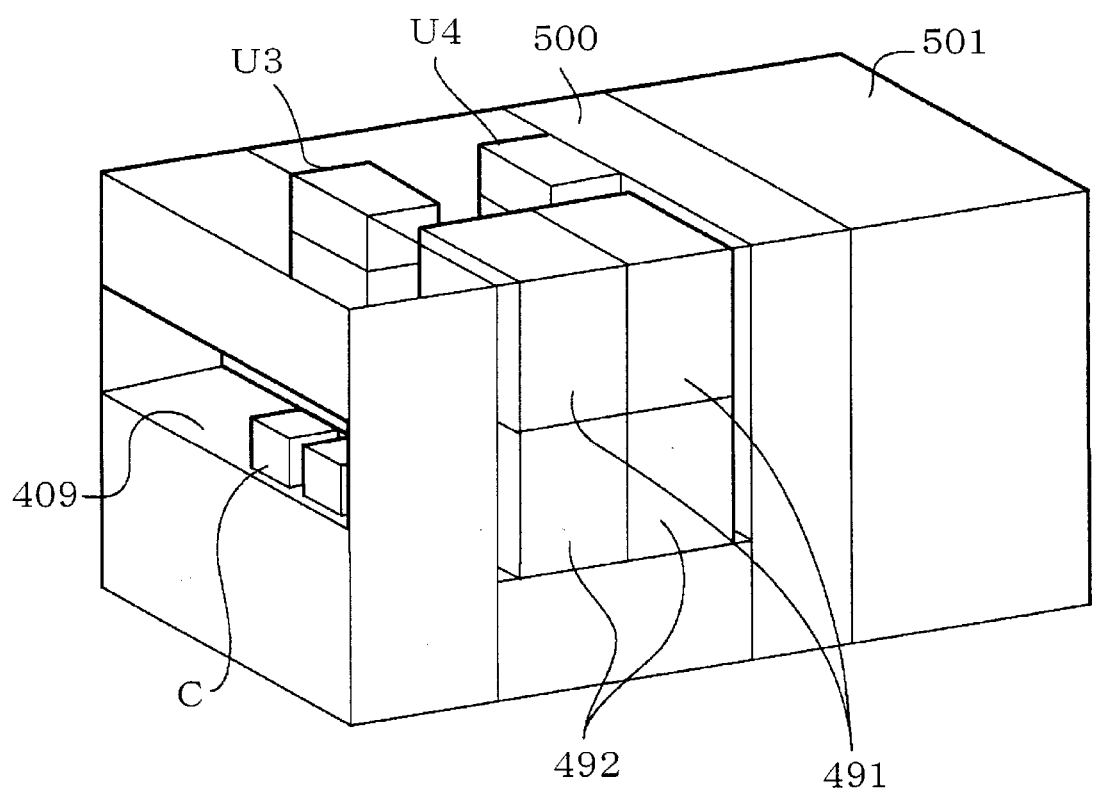
FIG. 56 is a perspective view showing an example of a coating and developing unit with a coating film forming unit of the present embodiment incorporated therein.
Figure 57:
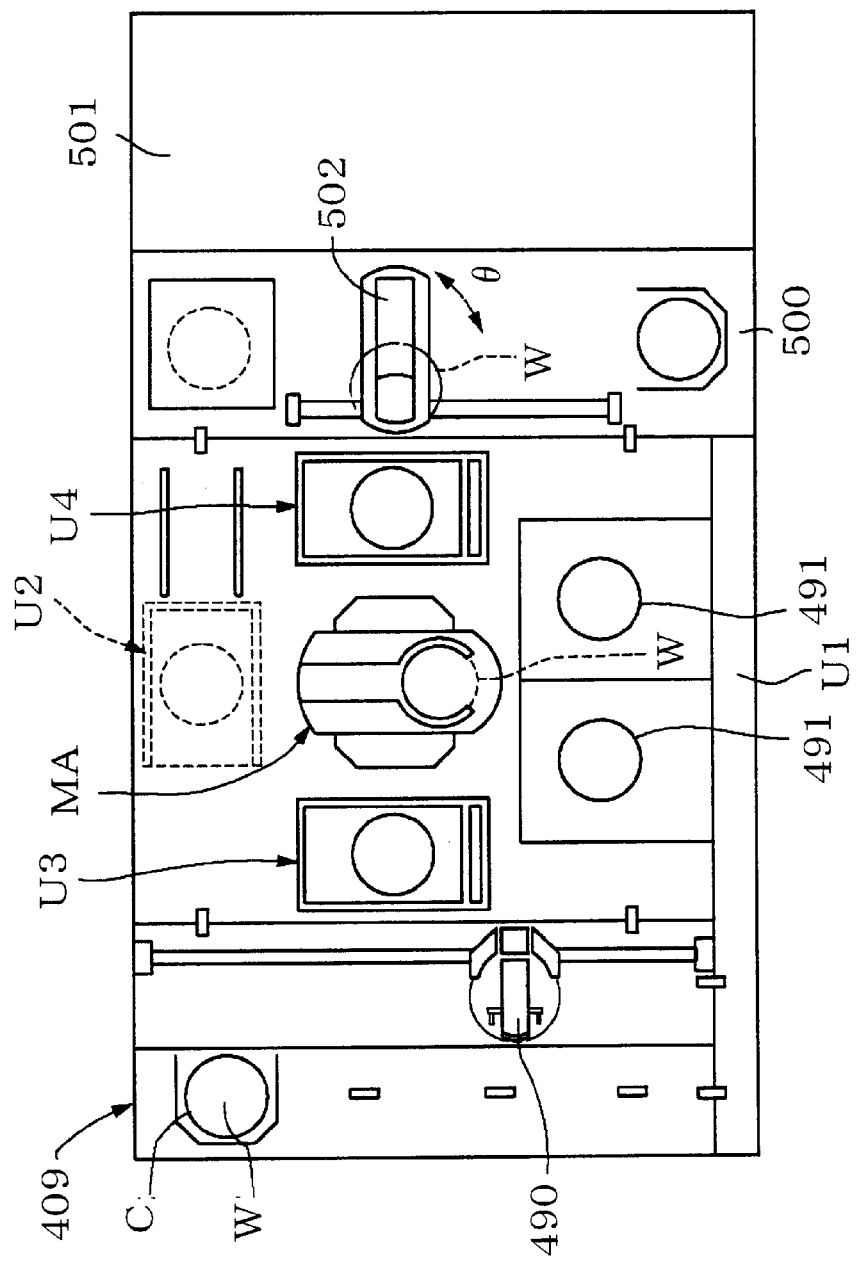
FIG. 57 is an explanatory view of the coating and development unit shown in FIG. 56 in the plan view.

Next, an outline of an example of a coating and developing system including the aforesaid coating film forming unit in a coating unit will be explained with reference to FIG. 56 and FIG. 57. In FIGS. 56 and 57, 409 denotes a transfer stage for carrying in and out the. wafer cassette, and for example, the cassette C housing 25 wafers is placed thereon by an automatic carrier robot. A transfer arm 490 for the wafer W is provided in an area facing the transfer stage 409 to be freely movable in the directions X, Z and Y and rotatable in 0 direction (rotation around a vertical axis). Further at the back of the transfer arm 490, disposed are a unit U1 of the coating and developing system (a coating unit 492 and a developing unit 491), for example, on the right side, and multi-tiered units U2, U3 and U4 of the heating and cooling system on the left, front, and rear side respectively. A wafer carrier arm MA which is structured to be ascendable and descendable, movable laterally and longitudinally, and rotatable around the vertical axis is provided for transferring the wafer W between the coating unit 492, the developing unit 491, and the heating and cooling system units. In FIG. 56, the unit U2 and the wafer carrier arm MA are not shown for convenience.

In the units in the coating and developing system, for example, the two developing units 491 including the aforesaid developing device are provided in the upper tier, and two coating units 492 are provided in the lower tier. For example, in the units of the heating and cooling system, the heating unit, cooling unit, hydrophobic processing unit and the like are housed in a seven-tier shelf form in the units U2, U3 and U4.

If the aforesaid part including the coating and developing system units and the heating and cooling system units is called a process station block, an aligner 501 is connected to the back side of the process station block via an interface block 500. The interface block 500 is for transferring the wafer W to and from the aligner 501 by means of a wafer carrier arm 502 structured to be, for example, ascendable and descendable, movable laterally and longitudinally, and rotatable around the vertical axis.

Explaining the flow of the wafer in this apparatus, the wafer cassette C housing the wafers W is initially carried into the aforesaid transfer stage 409 from outside, the wafer W is taken out of the cassette C by the wafer carrier arm 490, and transferred to the wafer carrier arm MA via a transfer stand being one of the shelves of the aforesaid heating and cooling unit 3. Subsequently, after hydrophobic processing is performed for the wafer W inside the processing section in one of the shelves of the unit U3, the resist solution is applied thereto in the coating unit 492, whereby a resist film is formed. After the wafer W coated with the resist film is heated in the heating unit, it is carried to the cooling unit transferable to the wafer carrier arm 502 of the interface block 500, and after processing, it is carried to the interface block 500, and to the aligner 501 via the wafer carrier arm 502, whereby exposure is performed via a mask corresponding to a pattern. The wafer after the exposure processing is received by the wafer carrier arm 502, and is transferred to the wafer carrier arm MA of the process station block via a transfer unit in the unit U4.

Thereafter, the wafer W is heated to a predetermined temperature in the heating unit, and is cooled to a predetermined temperature in the cooling unit thereafter. The wafer W is subsequently sent to the developing unit 491, where the developing treatment is performed and the resist mask is formed. Thereafter, the wafer W is returned into the cassette C on the transfer stage 409.

In each of the above embodiments, the film forming unit for coating the wafer W with the resist solution to form the resist film is explained, but the present invention is also applicable to the other film forming units for an insulation film and the like, for example, SOD and SOG film forming units. Further, it is applicable to a film forming unit for substrates other than the wafer W, for example, LCD substrates. The coating solution is not limited to the resist solution, and an interlaminar insulating material, a low dielectric material, a high dielectric material, a wiring material, an organometallic material, metal past and the like may be used.

What is claimed is:

1. A film forming unit for supplying a coating solution onto a substrate from a discharge nozzle to form a film on the substrate, comprising:

moving means for moving the discharge nozzle, a cover for covering said moving means, and exhaust ports formed in said cover for exhausting atmosphere inside said cover;

wherein said moving means comprises a support member for supporting the discharge nozzle, a moving member for moving said support member, a guide shaft passing through bearing portion formed in said supporting member, and a gas supplying part for supplying gas into a space between said bearing portion and said guide shaft.

2. A film forming unit according to claim 1, wherein the discharge nozzle reciprocates along the guide shaft and the substrate moves in a direction perpendicular to a reciprocating direction of the discharge nozzle.

3. A film forming unit according to claim 1, wherein said guide shaft comprises a plurality of said guide shafts.

4. A film forming unit according to claim 1, wherein said moving member comprises an endless driving belt attached to a position of approximately the center of gravity of said support member.

5. A film forming unit according to claim 4, wherein said moving means has a driving pulley and an idler pulley around which said driving belt is wound, and a rotationally driving mechanism for rotationally driving said driving pulley.

6. A film forming unit according to claim 5, wherein a balance weight is attached to a position opposite to said supporting member in said driving belt.

7. A film forming unit according to claim 5, wherein another supporting member for supporting another discharge nozzle is attached to a position opposing said supporting member in said driving belt.

8. A film forming unit according to claim 1, wherein an inner wall of said bearing portion is covered with a porous film.

9. A film forming unit according to claim 1, wherein said supporting member is placed inside said cover.

10. A film forming unit according to claim 1, wherein said moving means comprises a driving belt with said supporting member being attached thereto, a driving pulley and an idler pulley around which said driving belt is wound; and said driving belt, said driving pulley and said idler pulley are placed inside said cover.

11. A film forming unit according to claim 10, wherein said exhaust ports are formed at least near said driving pulley and near said idler pulley.

12. A film forming unit according to claim 10,
wherein a partition member is provided inside said driving belt.

13. A film forming unit according to claim 1,
wherein a partition member is provided between said supporting member and an inner surface of said cover.

14. A film forming unit according to claim 1,
wherein said cover is further housed in another cover.

15. A film forming unit according to claim 14,
wherein other exhaust ports for exhausting atmosphere inside said another cover are formed in said another cover.

16. A film forming unit according to claim 14,
wherein a channel for supplying the coating solution to the coating solution discharge means has a first tube for connecting the coating solution discharge means and a connecting portion provided at said another cover, and a second tube for connecting a coating solution supply source and said connecting portion.

17. A film forming unit for supplying a coating solution onto a substrate from a discharge nozzle to form a film on the substrate, comprising:
moving means for moving the discharge nozzle,
wherein said moving means comprises a support member for supporting the discharge nozzle, a moving member for moving said support member, a guide shaft passing through bearing portion formed in said supporting member, and a gas supplying part for supplying gas into a space between said bearing portion and said guide shaft, and
wherein said support member has a discharge nozzle holding member for holding the discharge nozzle, the discharge nozzle is attachable and detachable to said discharge nozzle holding member, and said discharge nozzle holding member has a suction mechanism for sucking a part of the discharge nozzle.

18. A film forming unit according to claim 1,
wherein said supporting member has a discharge nozzle holding member for holding the discharge nozzle, the discharge nozzle is attachable and detachable to said discharge nozzle holding member, and said discharge nozzle holding member has an electromagnet for sucking a part of the discharge nozzle.

19. A film forming unit according to claim 1,
wherein said supporting member has a nozzle holding member for holding the discharge nozzle, the discharge nozzle is attachable and detachable to said discharge nozzle holding member, and said discharge nozzle holding member has a gripping member for gripping the discharge nozzle from outside, and the gripping member has a pressing member freely swelled and shrunk relative to the discharge nozzle by inflow and outflow of air.

20. A film forming unit according to claim 1,
wherein said supporting member has a nozzle holding member for holding the discharge nozzle, the discharge nozzle is attachable and detachable to said discharge nozzle holding member, said discharge nozzle holding member is in approximately a cylindrical shape with top and bottom face thereof being opened correspondingly to an outer shape of the discharge nozzle, and said discharge nozzle holding member has a support portion for supporting the discharge nozzle.

21. A film forming unit according to claim 17,
wherein said discharge nozzle holding member has a projected portion projected in a direction perpendicular to the moving direction of the discharge nozzle, and the discharge nozzle has a recessed portion fitted onto said projected portion.

22. A film forming unit according to claim 17,
wherein the discharge nozzle has a projected portion projected in a direction perpendicular to the moving direction of the discharge nozzle, and said discharge nozzle holding member has a recessed portion fitted onto said projected portion.

23. A film forming unit according to claim 21,
wherein said projected portion is projected in the horizontal direction.

24. A film forming unit according to claim 22,
wherein said projected portion is projected in the horizontal direction.

25. A film forming unit according to claim 17, further comprising:
carrier means for carrying the discharge nozzle, which is movable at least in a moving range of the discharge nozzle,
wherein said carrier means is capable of transferring the discharge nozzle to said discharge nozzle holding member.

26. A film forming unit according to claim 25, further comprising:
a nozzle waiting member capable of supporting a plurality of the discharge nozzles,
wherein the nozzle waiting member is placed within a moving range of said carrier means, and said carrier means is capable of transferring the discharge nozzle to the nozzle waiting member.

27. A film forming unit according to claim 17, further comprising:
a nozzle waiting member capable of supporting a plurality of the discharge nozzles,
wherein the nozzle waiting member is movable to a position in which the nozzle waiting member freely transfers the discharge nozzle to said discharge nozzle holding member.

28. A film forming unit according to claim 26,
wherein said nozzle waiting member has receiving portions for receiving discharge ports of the discharge nozzles and supporting the discharge nozzles, and insides of the receiving portions are maintained in solvent atmosphere of the coating solution.

29. A film forming unit according to claim 28, further comprising:
a solvent channel in which the solvent of the coating solution flows in a lower portion of said nozzle waiting member; and
atmosphere introduction passages for introducing atmosphere of the solvent channel into said receiving portions.

30. A film forming unit according to claim 29, further comprising:
a temperature controller capable of controlling temperature of the solvent in said solvent channel.

31. A film forming unit according to claim 28, further comprising:
lid bodies for freely opening and closing said receiving portions.

32. A film forming unit according to claim 28, further comprising:
cleaning fluid supply portions for supplying cleaning fluid to the discharge ports of the discharge nozzles supported by said receiving portions.

33. A film forming unit for supplying a coating solution onto a substrate from a discharge nozzle to form a film on the substrate, comprising:
- a substrate holding portion for holding the substrate;
- a discharge nozzle provided to oppose the substrate held by said substrate holding portion, for discharging the coating solution onto the substrate held by the substrate holding portion;
- an X-direction drive section for moving the discharge nozzle in a direction X;
- a Y-direction drive section for the discharge nozzle for intermittently moving the discharge nozzle in a direction Y; and
- a Y-direction drive section for the substrate holding section for intermittently moving said substrate holding section in the direction Y,
- wherein after the discharge nozzle is moved in the direction X and thereby the coating solution is applied onto a substrate top surface linearly, the discharge nozzle and the substrate holding portion are simultaneously moved intermittently in the opposite directions to each other in the direction Y to face the discharge nozzle to an area next to an area already coated, thus performing control to arrange the areas, which are coated in the direction X, in the direction Y in order.

34. A film forming unit for supplying a coating solution onto a substrate from a discharge nozzle to form a film on the substrate, comprising:
- a substrate holding portion for holding the substrate;
- a discharge nozzle provided to oppose the substrate held by said substrate holding portion, for discharging the coating solution onto the substrate held by the substrate holding portion;
- a first discharge nozzle and a second discharge nozzle provided to be separated from each other to oppose the substrate held by the substrate holding portion, and provided to oppose the substrate;
- an X-direction drive section for moving the first discharge nozzle and the second discharge nozzle in a direction X; and
- a Y-direction drive section for intermittently moving the first discharge nozzle and the second discharge nozzle, and the substrate holding portions relatively in a direction Y,
- wherein after the first discharge nozzle and the second discharge nozzle are moved in the direction X and thereby the coating solution is applied onto a substrate top surface linearly, the first discharge nozzle and the second discharge nozzle are moved relatively in the direction Y to face the discharge nozzles to an area next to an area already coated, thus performing control to arrange the areas, which are coated in the direction X, in the direction Y in order.

35. A film forming unit according to claim 34,
wherein the Y-direction drive section comprises a Y-direction drive section for the discharge nozzle for intermittently moving the first discharge nozzle and the second discharge nozzle in the direction Y, and a Y-direction drive section for the substrate holding portions for intermittently moving the substrate holding portion in the direction Y.

36. A film forming unit according to claim 34,
wherein the first discharge nozzle and the second discharge nozzle are provided at a common base.

37. A film forming unit according to claim 34,
wherein the first discharge nozzle and the second discharge nozzle move symmetrically in opposite directions to each other.

38. A film forming unit according to claim 34,
wherein the substrate holding portion comprises a first substrate holding portion and a second substrate holding portion, so that the first discharge nozzle discharges the coating solution to the substrate held by the first substrate holding portion and the second discharge nozzle discharges the coating solution to the substrate held by the second substrate holding portion.

39. A film forming unit according to claim 33,
wherein the X-direction drive section comprises guide shaft members extending in the direction X for guiding the discharge nozzle, a nozzle holding body provided to enclose the guide shaft members via a space, and gas supply means for supplying pressurized gas into a portion between the nozzle holding body and the shaft members.

* * * * *